United States Patent
Toda

(10) Patent No.: US 8,661,319 B2
(45) Date of Patent: Feb. 25, 2014

(54) MEMORY SYSTEM

(75) Inventor: Haruki Toda, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 217 days.

(21) Appl. No.: 13/232,312

(22) Filed: Sep. 14, 2011

(65) Prior Publication Data

US 2012/0079331 A1  Mar. 29, 2012

(30) Foreign Application Priority Data

Sep. 24, 2010 (JP) ................................. 2010-213215

(51) Int. Cl.
    *G11C 29/00*    (2006.01)
(52) U.S. Cl.
    USPC ............................. 714/767; 714/773; 714/763
(58) Field of Classification Search
    USPC .......................................... 714/767, 773, 763
    See application file for complete search history.

(56) References Cited

U.S. PATENT DOCUMENTS

| 5,500,811 A * | 3/1996 | Corry .............................. 708/319 |
| 5,790,545 A * | 8/1998 | Holt et al. ...................... 370/398 |
| 2009/0198881 A1 | 8/2009 | Toda |
| 2010/0107039 A1 | 4/2010 | Toda |

OTHER PUBLICATIONS

U.S. Appl. No. 13/237,418, filed Sep. 20, 2011, Toda.
U.S. Appl. No. 13/011,318, filed Jan. 21, 2011, Haruki Toda.
Ron M. Roth, et al., "Lee-Metric BCH Codes and their Application to Constrained and Partial-Response Channels", IEEE Transactions on Information Theory, vol. 40, No. 4, Jul. 1994, 14 Pages.

* cited by examiner

*Primary Examiner* — Fritz Alphonse
(74) *Attorney, Agent, or Firm* — Oblon, Spivak, McClelland, Maier & Neustadt, L.L.P.

(57) ABSTRACT

A memory system according to the embodiment comprises a cell array including cell units having p or more physical quantity levels (p is a prime of 3 or more); a code generator unit operative to convert binary-represented input data to a write code represented by elements in Zp that is a residue field modulo p; and a code write unit operative to write the write code in the cell unit in accordance with the association of the elements in Zp to different physical quantity levels, wherein the input data is recorded in (p−1) cell units, the (p−1) cell units including no cell unit that applies the same physical quantity level for write in the case where the input data is 0 and for write in the case where only 1 bit is 1.

20 Claims, 58 Drawing Sheets

| n | n² | n²-2 | n²-3 | n²-5 |
|---|---|---|---|---|
| 3 | 9 | <u>7</u> | 6 | 4 |
| 4 | 16 | 14 | <u>13</u> | 11 |
| 5 | 25 | <u>23</u> | 22 | 20 |
| 6 | 36 | 34 | 33 | <u>31</u> |
| 7 | 49 | <u>47</u> | 46 | 44 |
| 8 | 64 | 62 | <u>61</u> | 59 |
| 9 | 81 | <u>79</u> | 78 | 76 |
| 10 | 100 | 98 | <u>97</u> | 95 |
| 11 | 121 | 119 | 118 | 116 |

FIG. 40 p=7

| 0 | 1 | 3 |
|---|---|---|
| -2 | 0 | 2 |
| -3 | -1 | 0 |

$\varepsilon = 3$
$\varepsilon' = 3$

FIG. 41 p=13

| 0 | 1 | 5 | 6 |
|---|---|---|---|
| -3 | 0 | 2 | 4 |
| -4 | -2 | 0 | 3 |
| -6 | -5 | -1 | 0 |

$\varepsilon = 5$
$\varepsilon' = 6$

FIG. 42 p=23

| 1 | 2 | 8 | 9 | 11 |
|---|---|---|---|---|
| -5 | 0 | 3 | 7 | 10 |
| -6 | -4 | 0 | 4 | 6 |
| -10 | -7 | -3 | 0 | 5 |
| -11 | -9 | -8 | -2 | -1 |

$\varepsilon = 8$
$\varepsilon' = 11$

FIG. 43 p=31

| 0 | 1 | 9 | 10 | 14 | 15 |
|---|---|---|---|---|---|
| -5 | 0 | 2 | 8 | 11 | 13 |
| -6 | -4 | 0 | 3 | 7 | 12 |
| -12 | -7 | -3 | 0 | 4 | 6 |
| -13 | -11 | -8 | -2 | 0 | 5 |
| -15 | -14 | -10 | -9 | -1 | 0 |

$\varepsilon = 9$
$\varepsilon' = 15$

FIG. 44 p=47

| 0 | 3 | 13 | 14 | 20 | 21 | 23 |
|---|---|---|---|---|---|---|
| -8 | 2 | 4 | 12 | 15 | 19 | 22 |
| -9 | -7 | 1 | 5 | 11 | 16 | 18 |
| -17 | -10 | -6 | 0 | 6 | 10 | 17 |
| -18 | -16 | -11 | -5 | -1 | 7 | 9 |
| -22 | -19 | -15 | -12 | -4 | -2 | 8 |
| -23 | -21 | -20 | -14 | -13 | -3 | 0 |

$\varepsilon = 12$
$\varepsilon' = 22$

FIG. 45 p=61

| 0 | 3 | 15 | 16 | 24 | 25 | 29 | 30 |
|---|---|---|---|---|---|---|---|
| -9 | 2 | 4 | 14 | 17 | 23 | 26 | 28 |
| -10 | -8 | 1 | 5 | 13 | 18 | 22 | 27 |
| -20 | -11 | -7 | 0 | 6 | 12 | 19 | 21 |
| -21 | -19 | -12 | -6 | 0 | 7 | 11 | 20 |
| -27 | -22 | -18 | -13 | -5 | -1 | 8 | 10 |
| -28 | -26 | -23 | -17 | -14 | -4 | -2 | 9 |
| -30 | -29 | -25 | -24 | -16 | -15 | -3 | 0 |

$\varepsilon = 14$
$\varepsilon' = 25$

FIG. 46 p=79

| 0 | 4 | 18 | 19 | 29 | 30 | 36 | 37 | 39 |
|---|---|---|---|---|---|---|---|---|
| -11 | 3 | 5 | 17 | 20 | 28 | 31 | 35 | 38 |
| -12 | -10 | 2 | 6 | 16 | 21 | 27 | 32 | 34 |
| -24 | -13 | -9 | 1 | 7 | 15 | 22 | 26 | 33 |
| -25 | -23 | -14 | -8 | 0 | 8 | 14 | 23 | 25 |
| -33 | -26 | -22 | -15 | -7 | -1 | 9 | 13 | 24 |
| -34 | -32 | -27 | -21 | -16 | -6 | -2 | 10 | 12 |
| -38 | -35 | -31 | -28 | -20 | -17 | -5 | -3 | 11 |
| -39 | -37 | -36 | -30 | -29 | -19 | -18 | -4 | 0 |

$\varepsilon = 16$
$\varepsilon' = 30$ p=97

| 3 | 4 | 20 | 21 | 33 | 34 | 42 | 43 | 47 | 48 |
|---|---|---|---|---|---|---|---|---|---|
| -12 | 2 | 5 | 19 | 22 | 32 | 35 | 41 | 44 | 46 |
| -13 | -11 | 1 | 6 | 18 | 23 | 31 | 36 | 40 | 45 |
| -27 | -14 | -10 | 0 | 7 | 17 | 24 | 30 | 37 | 39 |
| -28 | -26 | -15 | -9 | 0 | 8 | 16 | 25 | 29 | 38 |
| -38 | -29 | -25 | -16 | -8 | 0 | 9 | 15 | 26 | 28 |
| -39 | -37 | -30 | -24 | -17 | -7 | 0 | 10 | 14 | 27 |
| -45 | -40 | -36 | -31 | -23 | -18 | -6 | -1 | 11 | 13 |
| -46 | -44 | -41 | -35 | -32 | -22 | -19 | -5 | -2 | 12 |
| -48 | -47 | -43 | -42 | -34 | -33 | -21 | -20 | -4 | -3 |

$\varepsilon = 19$
$\varepsilon' = 33$

FIG. 50

| | | | | | | |
|---|---|---|---|---|---|---|
| L | 7 | 11 | 13 | 17 | 19 | 23 |
| p | 7 | 11 | 13 | 17 | 19 | 23 |
| h | 3 | 4 | 4 | 5 | 5 | 5 |
| $\varepsilon$ | 2 | 3 | 3 | 4 | 5 | 6 |
| $\varepsilon'$ | 3 | 4 | 4 | 6 | 6 | 8 |
| M | 6 | 20 | 28 | 50 | 55 | 70 |
| M' | 3 | 16 | 24 | 40 | 50 | 60 |
| $\delta$ | 2 | 5 | 7 | 10 | 11 | 14 |
| $\delta'$ | 1 | 4 | 6 | 8 | 10 | 12 |
| (p−1) | 6 | 10 | 12 | 16 | 18 | 22 |
| | | | | | | |
| $\log_2 L$ | 2.8 | 3.4 | 3.7 | 4 | 4.2 | 4.5 |
| M/$\log_2 L$ | 3 | 6 | 8 | 13 | 14 | 16 |
| M'/$\log_2 L$ | 2 | 5 | 7 | 10 | 12 | 14 |
| | | | | | | |
| Redundancy | 2 | 1.67 | 1.5 | 1.23 | 1.29 | 1.38 |
| Redundancy' | 3 | 2 | 1.71 | 1.6 | 1.5 | 1.57 |
| $\varepsilon$/(p−1) | 0.33 | 0.3 | 0.25 | 0.25 | 0.28 | 0.27 |
| $\varepsilon'$/(p−1) | 0.5 | 0.4 | 0.33 | 0.37 | 0.33 | 0.36 |

FIG. 51

| | | | | | | | | |
|---|---|---|---|---|---|---|---|---|
| L | 3 | 4 | 5 | 6 | 7 | 8 | 9 | 10 |
| $L^2-p$ | 2 | 3 | 2 | 5 | 2 | 3 | 2 | 3 |
| p | 7 | 13 | 23 | 31 | 47 | 61 | 79 | 97 |
| h | 3 | 4 | 5 | 5 | 6 | 6 | 7 | 7 |
| $\varepsilon$ | 3 | 5 | 8 | 9 | 12 | 14 | 16 | 19 |
| $\varepsilon'$ | 3 | 6 | 11 | 15 | 22 | 25 | 30 | 33 |
| M | 3 | 20 | 60 | 95 | 192 | 264 | 420 | 525 |
| M' | 3 | 16 | 45 | 65 | 132 | 198 | 322 | 427 |
| $\delta$ | 1 | 5 | 12 | 19 | 32 | 44 | 60 | 75 |
| $\delta'$ | 1 | 4 | 9 | 13 | 22 | 33 | 46 | 61 |
| 2(p-1) | 12 | 24 | 44 | 60 | 92 | 120 | 156 | 192 |
| | | | | | | | | |
| $\log_2 L$ | 1.5 | 2 | 2.3 | 2.5 | 2.8 | 3 | 3.1 | 3.3 |
| $M/\log_2 L$ | 2 | 10 | 27 | 38 | 69 | 88 | 136 | 160 |
| $M'/\log_2 L$ | 2 | 8 | 20 | 26 | 48 | 66 | 104 | 130 |
| | | | | | | | | |
| Redundancy | 6 | 2.4 | 1.63 | 1.58 | 1.33 | 1.36 | 1.15 | 1.2 |
| Redundancy' | 6 | 3 | 2.2 | 2.31 | 1.92 | 1.82 | 1.5 | 1.48 |
| $\varepsilon/2(p-1)$ | 0.25 | 0.21 | 0.18 | 0.15 | 0.13 | 0.12 | 0.10 | 0.10 |
| $\varepsilon'/2(p-1)$ | 0.25 | 0.25 | 0.25 | 0.25 | 0.24 | 0.21 | 0.19 | 0.17 |

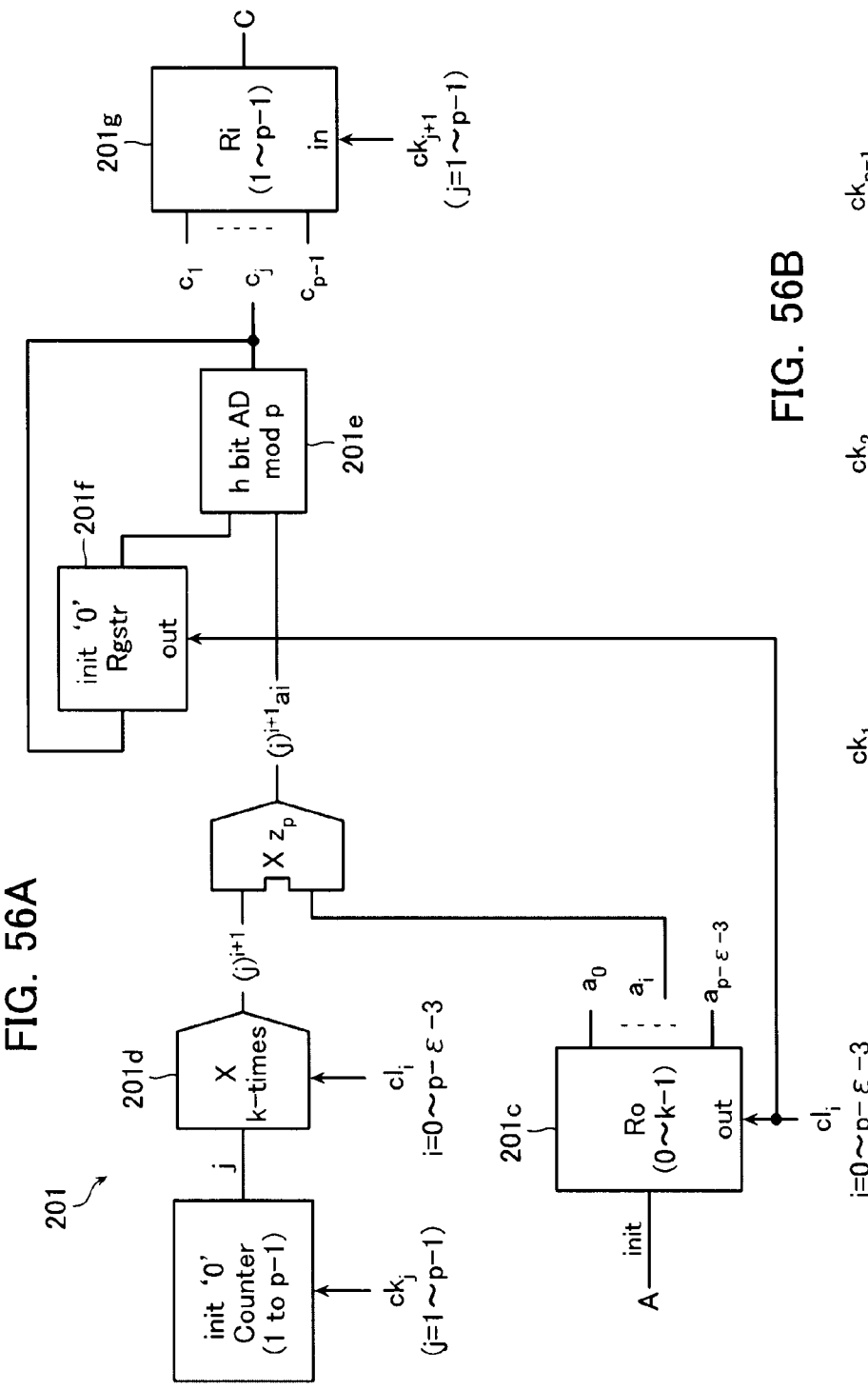
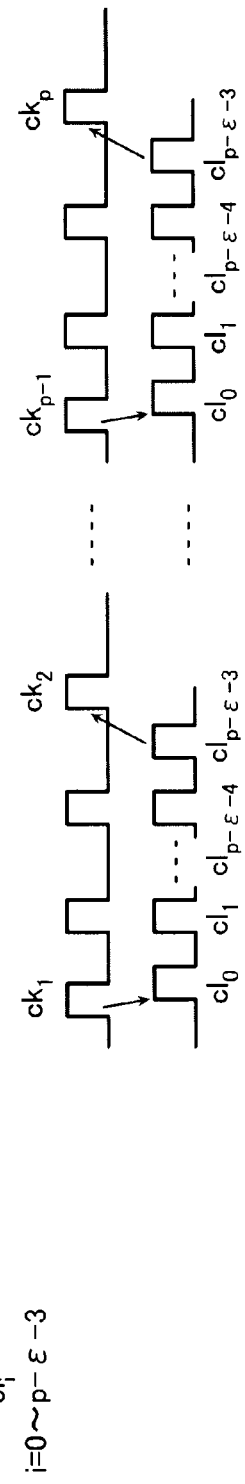
FIG. 56A
FIG. 56B

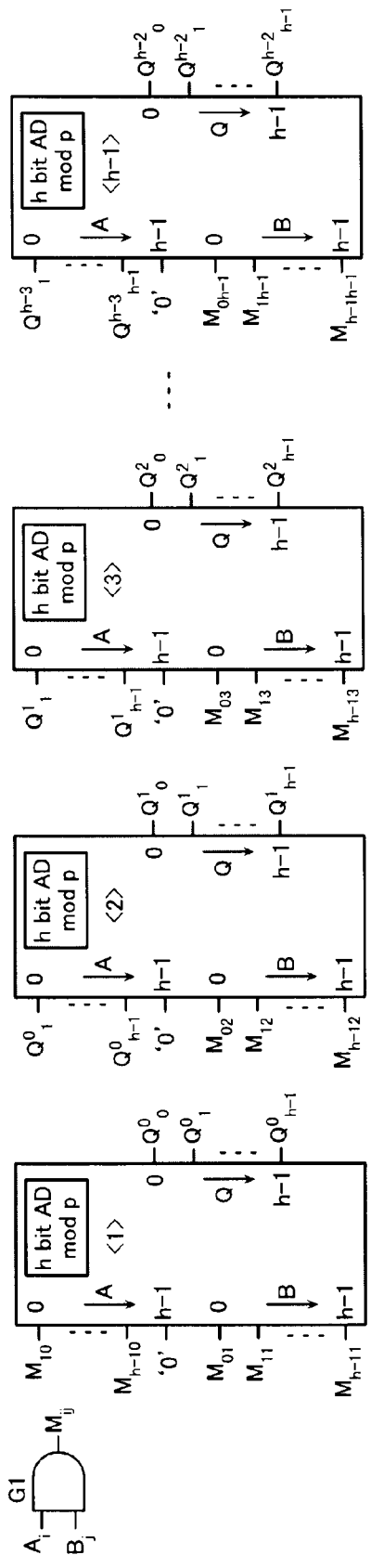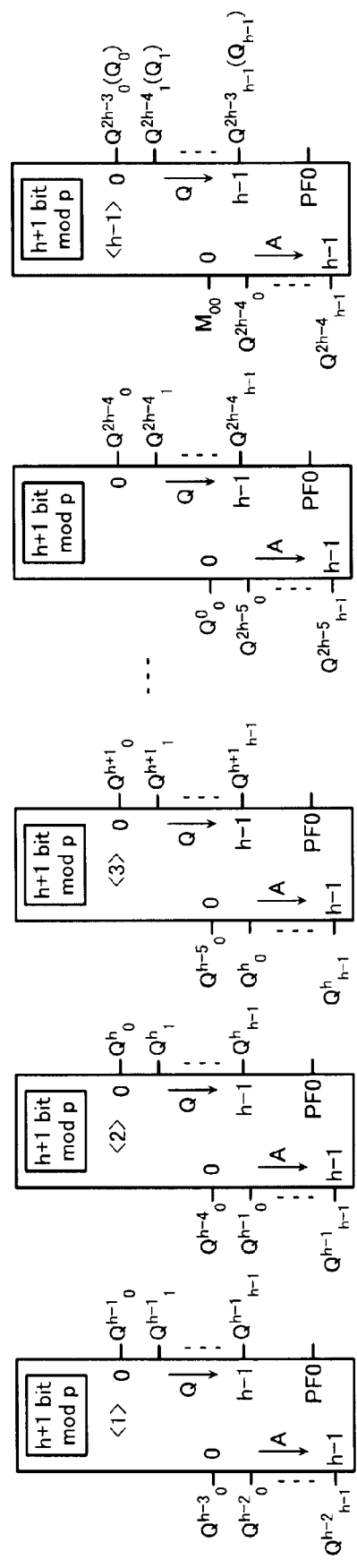
FIG. 59

FIG. 71

| j | $j^{-1}(23)$ | $j!(23)$ |
|---|---|---|
| 1 | 1 | 1 |
| 2 | 12 | 2 |
| 3 | 8 | 6 |
| 4 | 6 | 1 |
| 5 | 14 | 5 |
| 6 | 4 | 7 |
| 7 | 10 | 3 |
| 8 | 3 | 1 |
| 9 | 18 | 9 |
| 10 | 7 | 21 |
| 11 | 21 | 1 |
| 12 | 2 | 12 |
| 13 | 16 | 18 |
| 14 | 5 | 22 |
| 15 | 20 | 8 |
| 16 | 13 | 13 |
| 17 | 19 | 14 |
| 18 | 9 | 22 |
| 19 | 17 | 4 |
| 20 | 15 | 11 |
| 21 | 11 | 1 |
| 22 | 22 | 22 |

MEMORY SYSTEM

CROSS-REFERENCE TO RELATED APPLICATION

This application is based upon and claims the benefit of priority from the prior Japanese Patent Application No. 2010-231215, filed on Sep. 24, 2010, the entire contents of which are incorporated herein by reference.

FIELD

The embodiment relates to a memory system.

BACKGROUND

As the memory capable of storing mass data for use, a variable resistance memory (ReRAM) and so forth, which can be easily formed in three dimensions, has received attention. Even though any types of cells are used, however, fragmentation of the cell state in several levels to put plural bits in a single cell is effective on achievement of mass storage. With this regard, examples can be found in a NADN-type flash memory.

If such the multi-level cells are used, however, the instability of setting the cell state makes failed write easily occur. Thus, it has a tradeoff with the increase in the number of levels. Therefore, the NADN-type flash memory cannot provide more than 8 or 16 levels and causes a complicated association between data and levels additionally.

BRIEF DESCRIPTION OF THE DRAWINGS

FIG. 40 is a diagram showing an example of assignment of Zp to pair p-adic cells in the memory system according to the embodiment.

FIG. 41 is a diagram showing an example of assignment of Zp to pair p-adic cells in the memory system according to the embodiment.

FIG. 42 is a diagram showing an example of assignment of Zp to pair p-adic cells in the memory system according to the embodiment.

FIG. 43 is a diagram showing an example of assignment of Zp to pair p-adic cells in the memory system according to the embodiment.

FIG. 44 is a diagram showing an example of assignment of Zp to pair p-adic cells in the memory system according to the embodiment.

FIG. 45 is a diagram showing an example of assignment of Zp to pair p-adic cells in the memory system according to the embodiment.

FIG. 46 is a diagram showing an example of assignment of Zp to pair p-adic cells in the memory system according to the embodiment.

FIG. 50 is a table showing the performance at every number of levels of p-adic cells in the memory system according to the embodiment.

FIG. 51 is a table showing the performance at every number of levels of pair p-adic cells in the memory system according to the embodiment.

FIG. 56A is a diagram showing an example of circuitry of an encoder unit in the memory system according to the embodiment.

FIG. 56B is a timing chart of clocks for use in control of the encoder unit in the memory system according to the embodiment.

FIG. 59 is a block diagram of the "X Zp" circuit block in the memory system according to the embodiment.

FIG. 71 is a table showing the associated relations among primes, and the corresponding inverse elements and factorials in the memory system according to the embodiment.

DETAILED DESCRIPTION

Figure 1:
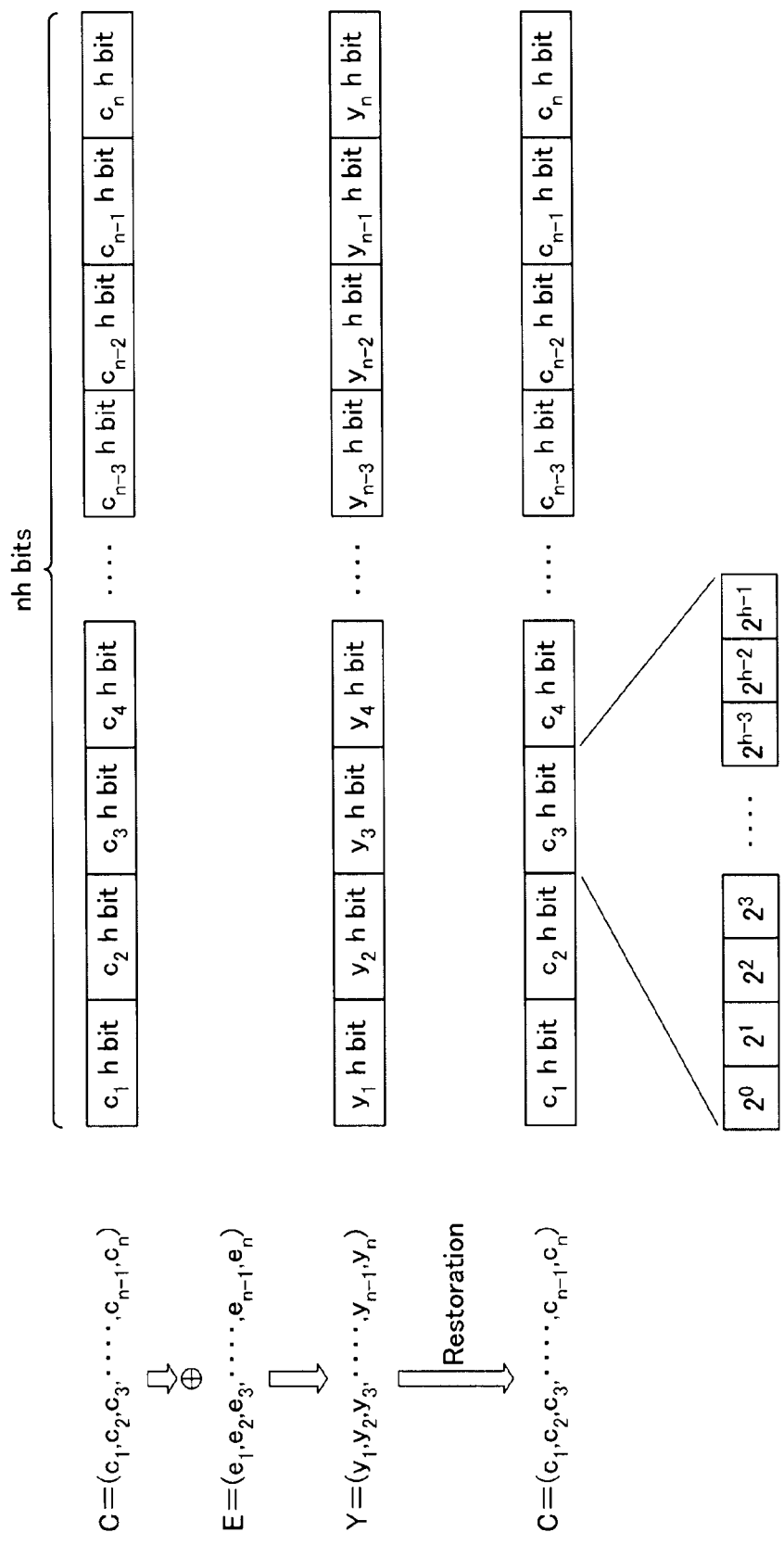
FIG. 1 is a diagram showing a relation between bit errors and code errors in a memory system according to the embodiment.

A memory system according to the embodiment comprises a cell array including cell units having p or more physical quantity levels (p is a prime of 3 or more); a code generator unit operative to convert binary-represented input data to a write code represented by elements in Zp that is a residue field modulo p; and a code write unit operative to write the write code in the cell unit in accordance with the association of the elements in Zp to different physical quantity levels, wherein the input data is recorded in (p−1) cell units, the (p−1) cell units including no cell unit that applies the same physical quantity level for write in the case where the input data is 0 and for write in the case where only 1 bit is 1.

With reference to the drawings, memory systems according to the embodiments will now be described below.

[Overview of Embodiment]

A memory system attains an increased storage capacity density by achieving fine fabrications, and thinking physical phenomena for use in memory cells and formation of a cell array part in 3-dimensional structures. In addition, for the purpose of improving the storage capacity density after attainment of stable processing steps, the physical quantity of a memory cell is divided into plural levels to provide the memory cell with an ability of multi-level storage as effective means.

In the case of the fine-fabricated multi-level cell, as for data write, failed write may arise easily when data is written with fail in an adjacent level to the originally write-targeted level. As for data read, failed read may arise easily when data is read out with fail, from an adjacent level to the level used to store data in the memory cell, as the corresponding data. As for data hold, a state transition may arise easily between adjacent levels.

Thus, multi-leveling of memory cells impairs the stability of the state and suffers considerable restrictions. If the problem on multi-leveling of memory cells can be overcome for effective use, stable process steps for memory systems can be utilized for longer terms to achieve a higher-density storage capacity.

Therefore, the memory system according to the present embodiment is equipped with an ECC (Error Correcting Code) system using a Lee metric code.

The ECC system using the Lee metric code applies the total number of errors to correct data and accordingly it can correct a large number of cells if errors arise with small level variations. With this regard, it is effective on the error between adjacent levels as described above. On the other hand, as for errors with large level variations, it is possible to correct errors if they fall within the total number of errors. Accordingly, this system can treat wider error distributions.

When 1 cell is used to store multi-levels, each level can be grasped as a height from the base level. Accordingly, it is originally desired to digitize information by a finite integer, particularly, a prime, rather than digitize information in binary. Therefore, the present embodiment uses a Lee metric code in a residue field Zp modulo a prime p used as the element (hereinafter simply referred to as "Zp").

In this case, data is generally treated in binary outside the memory system and accordingly the conversion from binary to Zp is required. Therefore, for the purpose of realizing a memory system equipped with an efficient on-chip ECC system, the following description is given to the representation conversion from binary to Zp and a specific circuit for ECC using the Lee metric code. Note that the transistors contained in these converter circuits serve as switches and accordingly the representations and operations of data work on the basis of binary operations.

The input binary data and the p-adic code stored in the memory cell have no linear relation between them. Accordingly, the converter circuit can freely set the associated relation between the binary data and the p-adic code. Therefore, if the converter circuit is locked, it is difficult to conversely read the binary data from the p-adic code stored in the memory cell. With this regard, it is possible to enhance the security of the memory system.

The conventionally used memory cell stores data in binary as '1' and '0'. Therefore, when a numeral in Zp, such as the Lee metric code, is treated directly, it is required to convert the numeral to a binary previously and then store each digit in the memory cell.

Therefore, with respect to the relation between the error-caused code word and the error quantity, the following description is given with reference to FIG. 1 to the relation between the error quantity as the code and the bit error in the memory cell when the memory cell in the memory system stores information on a bit basis.

As shown in FIG. 1, a code composed of numerals in Zp, n pieces, is represented by $C=(c_1, c_2, c_3, \ldots, c_{n-1}, c_n)$; a code error caused, for example, when this C is stored in the memory system is represented by $E=(e_1, e_2, e_3, \ldots, e_{n-1}, e_n)$; and a word, after each component c of C varies in accordance with E, is represented by $Y=(y_1, y_2, y_3, \ldots, y_{n-1}, y_n)$.

As C is stored as binary inside the memory system, the bit error caused in the memory cell changes the quantity as E depending on the error-caused position.

It is considered here that each numeral in Zp is represented in h-bit binary. The bit error similarly caused in any memory cell corresponds to the code error in the Lee metric code and has the quantity equal to E.

As the code word is represented in h-bit binary, the error quantity of 1-bit error at the position of $2^0$ is equal to ±1 in the code word (1 or p−1 variations in Zp), and the error quantity of 1-bit error at the position of $2^{h-1}$ is equal to $\pm 2^{h-1}$ (mod p). Thus, the weight on the code error differs from one another depending on the position of the memory cell. Therefore, in order to treat the patterns of bit errors on all memory cells, it is required to respond to all error quantities on the code word.

If the code word is converted into binary and stored in the memory system as above, any types of the configuration of the memory cell in the memory system are allowed. As described above, however, the ECC using the Lee metric code cannot correct errors unless the total error quantity, $\Sigma e_j$ (j=1−n), is lower than a certain value. In a word, depending on the position of the error-caused memory cell, error correction may not be achieved. With this regard, in the case of the storage in the memory cell in binary, all memory cells cannot be dealt equally.

Thus, it is not appropriate to store binary data in the memory cell as in the conventional case if the Lee metric code is used. Therefore, in the present embodiment, the so-called multi-level memory cell, in which the state of the memory cell, that is, the threshold of a transistor, or the resistance of a resistance element, is divided into plural levels, is used for storage in accordance with direct association of a numeral in Zp to each level. Thus, the above-described problem can be eliminated. Hereinafter, the multi-level memory cell capable of directly storing the numerals in Zp, such as the Lee metric code, may also be referred to as the "p-adic cell". In addition, the memory system using the p-adic cells may also be referred to as the "p-adic" memory system.

Figure 2:
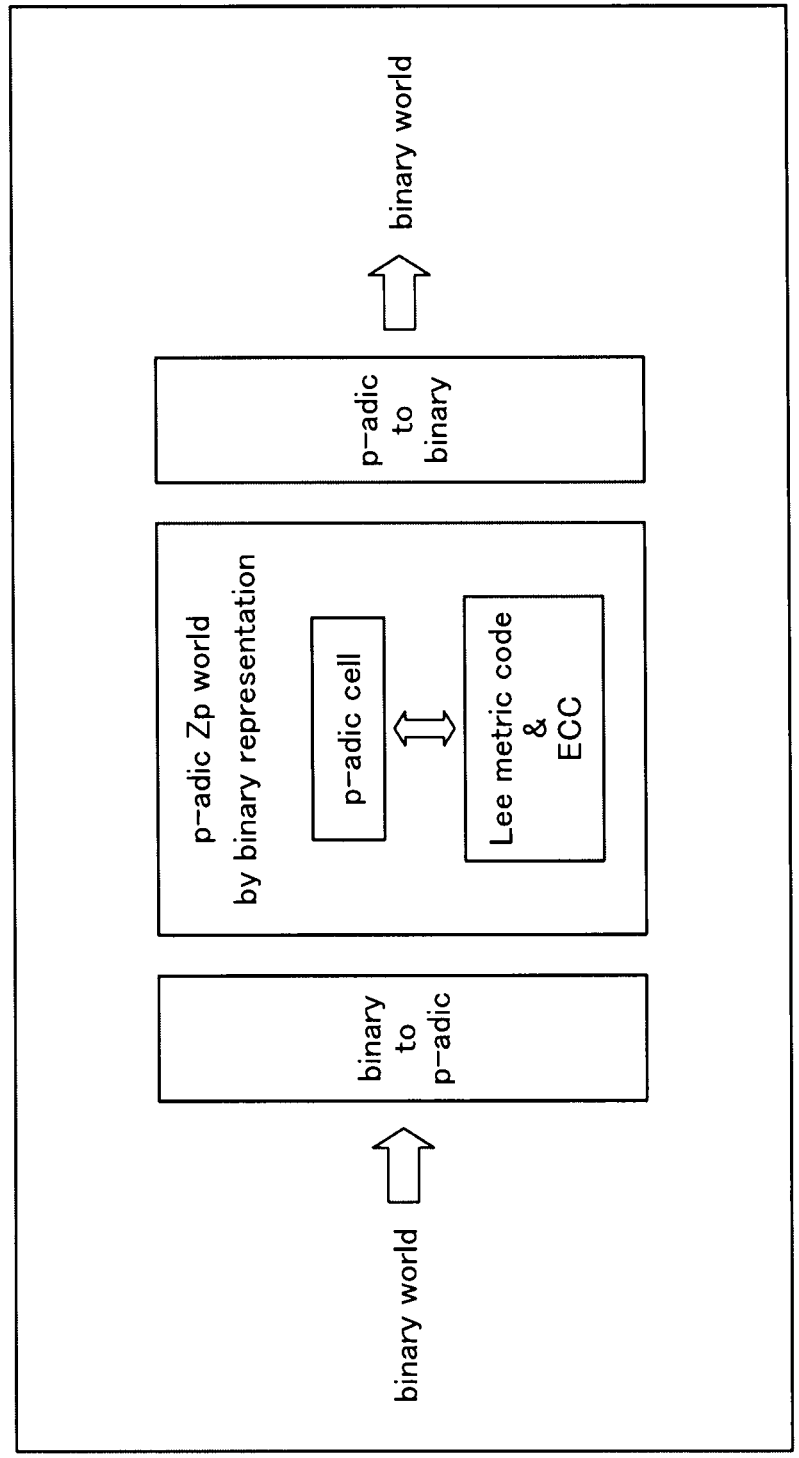
FIG. 2 is a brief diagram of the memory system according to the embodiment.

The following description is given with reference to FIG. 2 to the p-adic memory system that deals the numerals in Zp as data.

Hereinafter, an environment outside the p-adic memory system, for example, an IT instrument that handles data in binary is referred to as a "binary world". In contrast, containing a part that handles data in binary such as operational processing, an environment inside the p-adic memory system that handles data in Zp is referred to as a "p-adic Zp world". In this case, the "binary world" can be referred to as a "p-adic $Z_2$ world".

The memory system according to the present embodiment comprises, as interfaces between the "binary world" and the "p-adic Zp world", a "binary to p-adic" conversion operating circuit operative to convert binary data to Zp data, and a "p-adic to binary" conversion operating circuit operative to convert Zp data to binary data.

The data in the "binary world" (outside) is fed to the "p-adic Zp world" (memory system) via the "binary to p-adic" conversion operating circuit. Inside the memory system, the data is stored in the p-adic cell as it is in the form of the numeral in Zp. When data is recorded as the numeral in Zp in this way, the ECC processing using the Lee metric code can be made easier. The Zp data error-processed by ECC is provided to the "binary world" via the "p-adic to binary" conversion operating circuit.

Thus, the memory system comprises the "binary to p-adic" conversion operating circuit and the "p-adic to binary" conversion operating circuit, and accordingly the p-adic memory system can be handled in the "binary world" without having consciousness about the "p-adic Zp world".

[Conversion from Binary Data to Zp Data]

Next, as the premise prior to the description of specific circuitry of the "binary to p-adic" conversion operating circuit, the principle of conversion from binary data to Zp data is described.

If Zp=GF(p) is used ("GF" means a Galois field, and "GF(p)" indicates a collection of residues resulted from integers divided by a prime p), p cannot be represented by a power of 2 as a matter of fact. Accordingly, different from the case where $GF(2^n)$ is used, it is not possible to use all bit patterns of data directly as the code. Therefore, conversions are required to represent all bit patterns of data, one to one, with elements in Zp.

The elements in Zp can be represented by integers of 0 to p−1 and all these integers can be represented by an h-bit binary each. The bit patterns of h bits are not used all in this case, and accordingly the binary h-bit data cannot be dealt directly as the element in Zp.

Figure 3A:
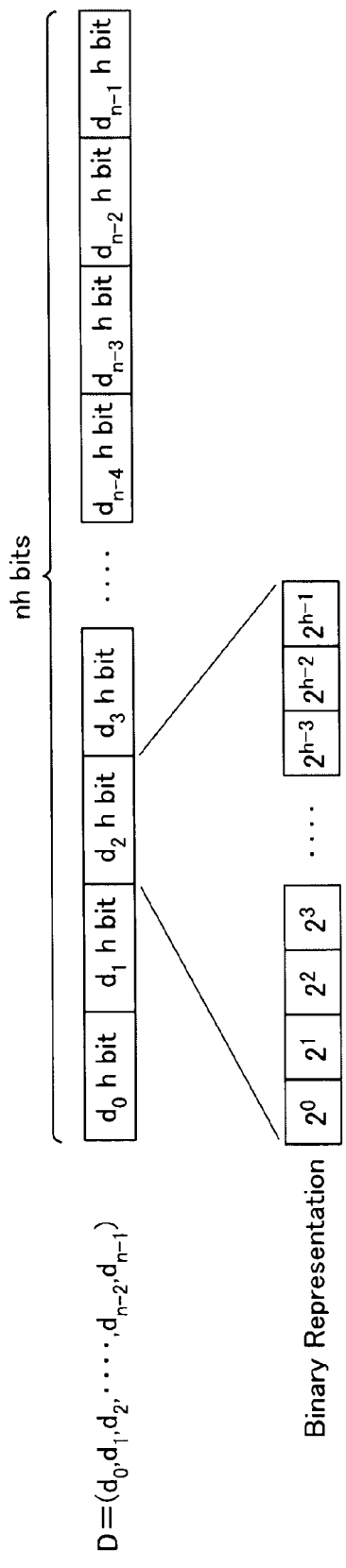
FIG. 3A is a diagram showing the configuration of binary data in the memory system according to the embodiment.

In a word, as shown in FIG. 3A, a collection of data D fed from the "binary world" to the memory system is divided h-bit by h-bit to regard them as n groups, that is, $2^h$-adic, n-digit data $D=(d_0, d_2, \ldots, d_{n-1})$. In this case, all bit patterns of h bits appear on the digits by the number equal to or below $2^h-1$.

Figure 3B:
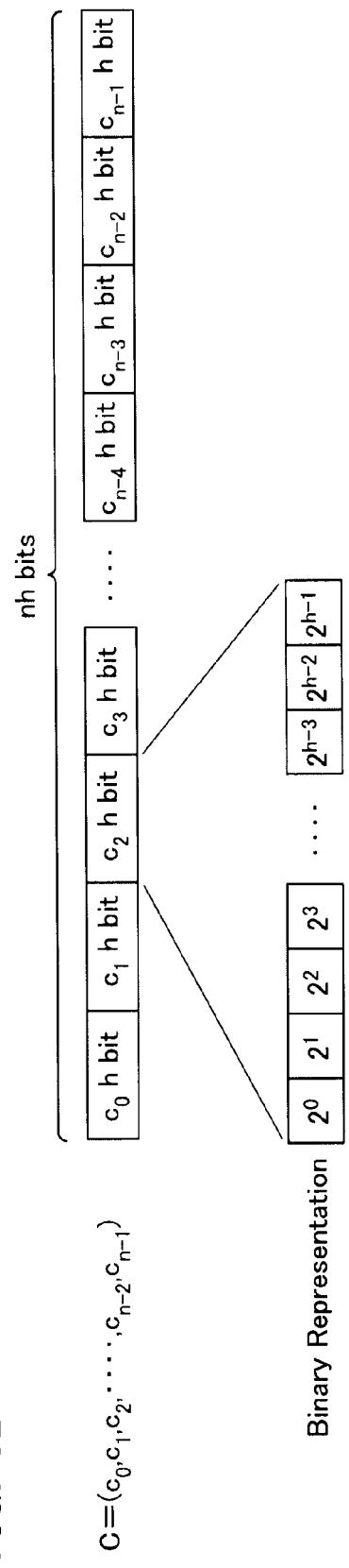
FIG. 3B is a diagram showing the configuration of code data in the memory system according to the embodiment.

On the other hand, as shown in FIG. 3B, the Zp-represented code $C=(c_0, c_2, \ldots, c_{n-1})$ having a word length of n does not use the bit patterns of h bits all if a relation, $c_j < p < 2^h$, establishes between h and p.

The following consideration is given to the conversion in which the data D corresponds, one to one, to the code C. This corresponds to the conversion from a $2^h$-adic number to a p-adic number. The conversion condition is studied to limit several ones of the conditions on selecting the prime p.

As the 1st condition, the condition on treating the binary data D as a δ-digit, $2^h$-adic number is described.

The number of bits in the batch-processed binary data D is given M=δh. In this case, D includes δ sets of h bits. When these sets are each considered to represent each digit of the $2^h$-adic number, D can be regarded as the δ-digit, $2^h$-adic number.

In a word, all bit patterns of M-bit data D can be considered as a representation of such the δ-digit number. This representation is converted to the elements in Zp to form a Lee metric code. Namely, the δ-digit, $2^h$-adic number is converted to a p-adic number such that the numeral on each digit of the p-adic number is contained in the data of Zp.

Therefore, an optimal p for this conversion is studied.

As the invariable in the conversion from the $2^h$-adic number to the p-adic number, a δ-digit, $2^h$-adic integer D(h) composed of M bits and represented by h bits per digit is used. In a word, D(h) can be represented as in Expression 1.

$$D(h)=d_0(2^h)^0+d_1(2^h)^1+\ldots+d_{\delta-3}(2^h)^{\delta-3}+d_{\delta-2}(2^h)^{\delta-2}+d_{\delta-1}(2^h)^{\delta-1} \quad 0<d_{\delta-1}<2^h,\ 0\le d_j<2^h$$
[Expression 1]

In Expression 1, $d_0, d_1, \ldots, d_{\delta-3}, d_{\delta-2}, d_{\delta-1}$ are contained in data represented by collections of h bits.

When the maximum and minimum numbers of numerals represented in the form of D(h) are converted to p-adic numbers, a certain p is found, which allows the indication of the numeral on each digit to be represented in h-bit binary. The condition at that time is that the increase in the number of digits on conversion of the $2^h$-adic number to the p-adic number is limited to 1 digit at the maximum. In other words, the number of digits after the conversion to the p-adic number is limited to (δ+1) digits at the maximum.

In addition, D(h) can be represented as in Expression 2 with a binary, $a_0, a_1, \ldots, a_{\delta-2}, a_{\delta-1}, a_\delta$, represented by collections of h bits.

$$D(h)=a_0(p)^0+a_1(p)^1+\ldots+a_{\delta-2}(p)^{\delta-2}+a_{\delta-1}(p)^{\delta-1}+a_\delta(p)^\delta \quad a_\delta+a_{\delta-1}\ne 0,\ 0\le a_j<p$$
[Expression 2]

A relation between δ and h is sought, which can configure the format of D(h) universally. Namely, the minimum number $D_{min}(h)$ and the maximum number $D_{max}(h)$ of D(h) capable of providing a δ-digit representation at the minimum by selecting h are given as in Expression 3.

$$D_{min}(h)=(2^h)^{\delta-1} \therefore d_{\delta-1}=1,\ d_i=0$$

$$D_{max}(h)=(2^h)^\delta-1 \therefore d_{\delta-1}=d_i=2^h-1 \quad \text{[Expression 3]}$$

Therefore, the minimum number $D_{min}(h)$ minus 1 consists of (δ−1) digits and accordingly loses the format of D(h). Then, when a consideration is given to the maximum number $D_{max}(h-1)$ composed of collections of (h−1) bits, that is, a $2^{h-1}$-adic number, it does not lower below δ digits as the representation of D(h), if $D_{min}(h)-1 \ge D_{max}(h-1)$.

Namely, the condition on $\delta$ and h, under which D(h) cannot establish other than a $\delta$-digit, $2^h$-adic representation, has a relation as in Expression 4.

$$\delta \geq h \cdot (2^h)^{\delta-1} - 1 \geq (2^h)^{\delta-1} - 1 \quad \text{[Expression 4]}$$

A condition is described as the second condition, under which data D can be treated with a ($\delta+1$)-digit, p-adic representation as shown in Expression 5.

$$D_{max}(h)(\bmod p^\delta) \neq D_{max}(h)(\bmod p^{\delta+1}) = D_{max}(h)(\bmod p^{\delta+2}) = \ldots \therefore (p)^\delta \leq (2^h)^\delta - 1 < (p)^{\delta+1} \quad \text{[Expression 5]}$$

As can be found from Expression 5, all are integers, and accordingly the condition under which data D can be treated with the ($\delta+1$)-digit, p-adic representation is as in Expression 6.

$$(p)^\delta < (2^h)^{\delta} (2^h)^\delta \leq (p)^{\delta+1} \quad \text{[Expression 6]}$$

Namely, it can be represented as in Expression 7.

$$(2^h)^{\delta/(\delta+1)} \leq p < 2^h \quad \text{[Expression 7]}$$

Further, as $\delta/(\delta+1) = (1-1/\delta)/(1-(1/\delta)^2) > 1 - 1/\delta > 1 - 1/h$ ($h \leq \delta$) and p is a prime, the condition on selecting the prime p is as in Expression 8.

$$2^{h-1} < p < 2^h \quad \text{[Expression 8]}$$

In this connection, the minimum value $p^{\delta-1}$ of the $\delta$-digit, p-adic number at this time establishes the following.

$$p^{\delta-1} < (2^h)^{\delta-1} = D_{min}(h) \quad \text{[Expression 9]}$$

Accordingly, data D after the p-adic number conversion cannot consist of ($\delta-1$) digits.

Thus, if the prime p can be selected under the condition shown in Expression 8, the increase in the number of digits on conversion from the $2^h$-adic number to the p-adic number can be suppressed to 1 at the maximum.

The following description is given to the principle of conversion from a $\delta$-digit, $2^h$-adic number $D = (d_0, d_2, \ldots, d_{\delta-1})$ in the "binary world" to a ($\delta+1$)-digit, p-adic number $D = (a_0, a_1, \ldots, a_{\delta-1}, a_\delta)$ in the "p-adic Zp world", which are equivalent as data.

At the start, paying attention to an h-bit binary, it is treated as a numeral A. The numeral A is as in Expression 10.

$$A = d_0 2^0 + d_1 2^0 + d_1 2^1 + \ldots + d_{h-3} 2^{h-3} + d_{h-2} 2^{h-2} + d_{h-1} 2^{h-1} \quad \text{[Expression 10]}$$

In addition, the condition on selecting the h-bit prime p is as in Expression 8.

A replacement of $d_{h-1} = 1$ establishes a relation as in Expression 11 because $2^{h-1} \leq A < 2^h$.

$$2^{h-1} - 2^h = -2^{h-1} < A - p < 2^h - 2^{h-1} = 2^{h-1} \quad \text{[Expression 11]}$$

If $0 \leq A - p$ in Expression 11, the coefficient on $2^{h-1}$ in the residue becomes 0 and accordingly the residue comes to an ($h-1$)-bit numeral in Zp.

A replacement of $d_{h-1} = 0$ brings A to the numeral in Zp itself because $A < p$. Therefore, $A - p < 0$ yields $A - p \leq -1$, and further $(2A+1) - 2p \leq -1$.

In a word, the h-bit binary contains only a single p at most under the condition on selecting the prime p shown in Expression 8. Even after the numeral in Zp, such as the residue, is doubled and given an addition of 1, it contains only a single p at most. Therefore, repeating the subtraction of p from an (h+1)-bit binary and counting the number of possible subtractions of p makes it possible to directly obtain a binary representation of the number of pieces of p contained.

Figure 4:
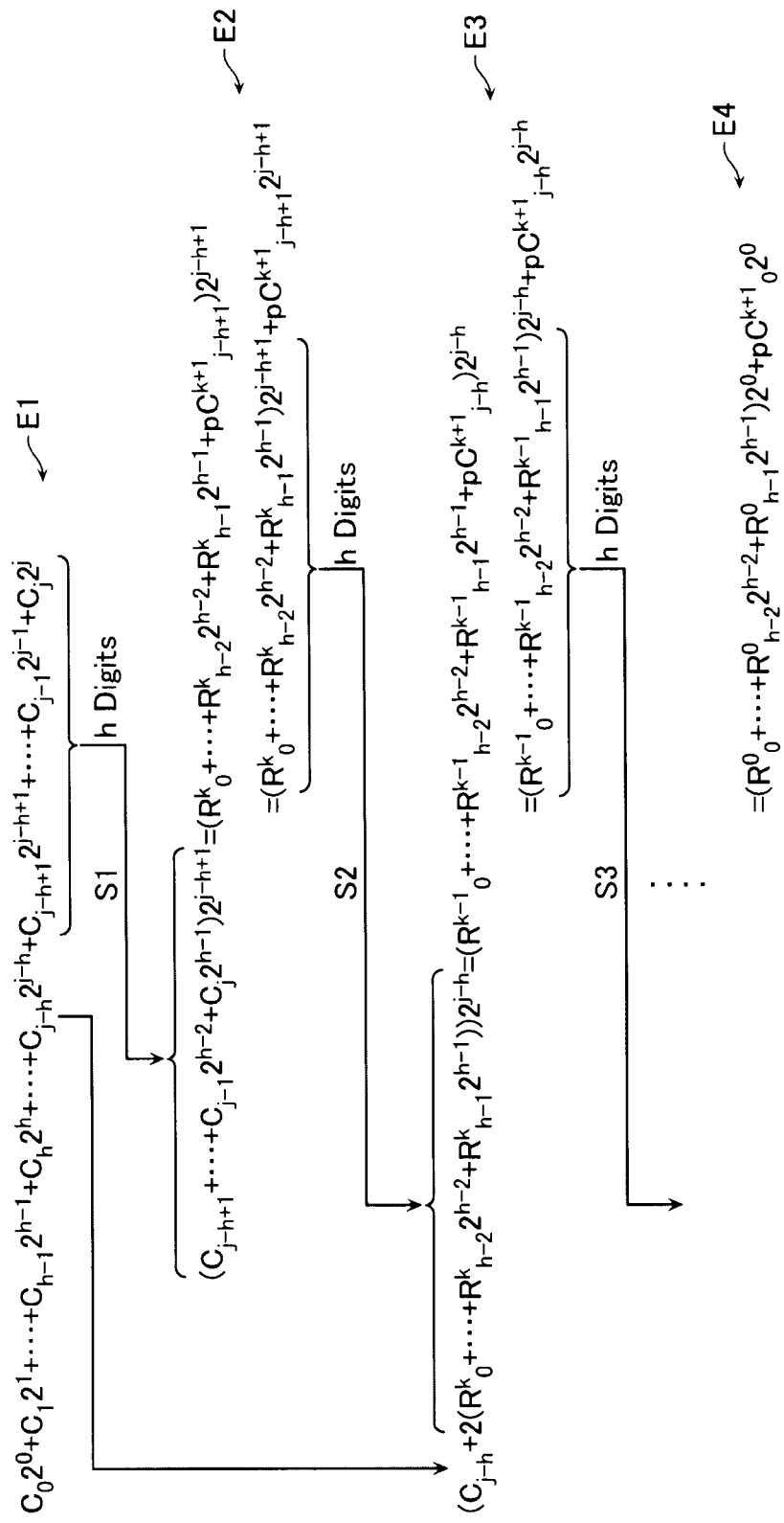
FIG. 4 is diagram showing a part of the conversion process from a binary to a p-adic number in the memory system according to the embodiment.

FIG. 4 is a diagram showing a part of the process of converting from a binary to a p-adic number, that is, the computation process for deriving a coefficient at a digit having a weight of $p^0$ (the least significant digit) in the p-adic number.

The binary A can be represented by an equation E1 $(=C_0 2^0 + C_1 2^1 + \ldots + C_{h-1} 2^{h-1} + C_h 2^h + \ldots + C_{j-h} 2^{j-h} + C_{j-h+1} 2^{j-h+1} + \ldots + C_{j-1} 2^{j-1} + C_j 2^j)$ in FIG. 4.

At the start, as shown with S1 in FIG. 4, an equation E2 $(C_{j-h+1} 2^{j-h+1} + \ldots + C_{j-1} 2^{j-1} + C_j 2^j)$, corresponding to h digits from the most significant digit having a weight of $2^j$ in the equation E1, that is, the digits having weights of $2^{j-h+1}$ to $2^j$, is divided by $p 2^{j-h+1}$ to yield a quotient $C^{k+1}_{j-h+1}$ and the residue $(R^k_0 + \ldots + R^k_{h-2} 2^{h-2} + R^k_{h-1} 2^{h-1})$.

Subsequently, as shown with S2 in FIG. 4, the residue resulted from the equation E2 divided by $p 2^{j-h+1}$ is added to the term $C_{j-h} 2^{j-h}$ corresponding to the digit having a weight of $2^{j-h}$ in the equation E1 to yield an equation E3 $(=(C_{j-h} + 2(R^k_0 + \ldots + R^k_{h-2} 2^{h-2} + R^k_{h-1} 2^{h-1}))2^{j-h})$, which is then divided by $p 2^{j-h}$ to obtain a quotient $C^{k+1}_{j-h}$ and the residue $(R^{k-1}_0 + \ldots + R^{k-1}_{h-2} 2^{h-2} + R^{k-1}_{h-1} 2^{h-1})$.

Thereafter, the computation similar to S2 in FIG. 4 is repeated while shifting the digit to finally yield an equation E4 $(=C_0 + 2(R^1_0 + \ldots + R^1_{h-2} 2^{h-2} + R^1_{h-1} 2^{h-1}))2^0$ which is then divided by $p 2^0$ to obtain a quotient $C^{k+1}$ and the residue $(R^0_0 + \ldots + R^0_{h-2} 2^{h-2} + R^0_{h-1} 2^{h-1})2^0$.

Through a series of these computations, the total number of the primes p can be obtained as $C^{k+1}_{j-h+1} 2^{j-h+1}$, $C^{k+1}_{j-h} 2^{j-h}, \ldots$ in turn from the top of the powers of 2. Note that the top of the numbers of primes p becomes $2^{j-h+1}$ having an index lower by $h-1$ than the original top $2^j$ in the equation E1. In a word, when the coefficients of the h-bit, p-adic number are obtained, a binary representation of the total number of primes p cannot consist of j digits but reduces to $j-(h-1)$ digits. When the finally-obtained coefficient $C^{k+1}_0$ on $p 2^0$ is derived, the resultant residue $(R^0_0 + R^0_1 2 + \ldots + R^0_{h-2} 2^{h-2} + R^0_{h-1} 2^{h-1})2^0$ indicates the numeral in Zp and becomes the coefficient on a digit having a weight of $p^0$ in the p-adic number.

Further, when the binary representation, $C^{k+1}_m$, of the number of pieces of p obtained through the above computation steps is used as new data and the computation steps similar to those in FIG. 4 are repeated, it is made possible to obtain the coefficient, $R^h_0 + R^h_1 2 + \ldots + R^h_{h-2} 2^{h-2} + R^h_{h-1} 2^{h-1}$, on a digit having a weight of $p^1$ in the p-adic number.

Thereafter, the similar computation steps can be repeated to obtain the coefficients on the digits in the p-adic number in turn.

In a word, a circuit operative to numerate the number of primes p contained in binary data can be configured with a ladder of circuits operative to derive the residues from (h+1)-bit binary data divided by the prime p as can be found.

Figure 5:
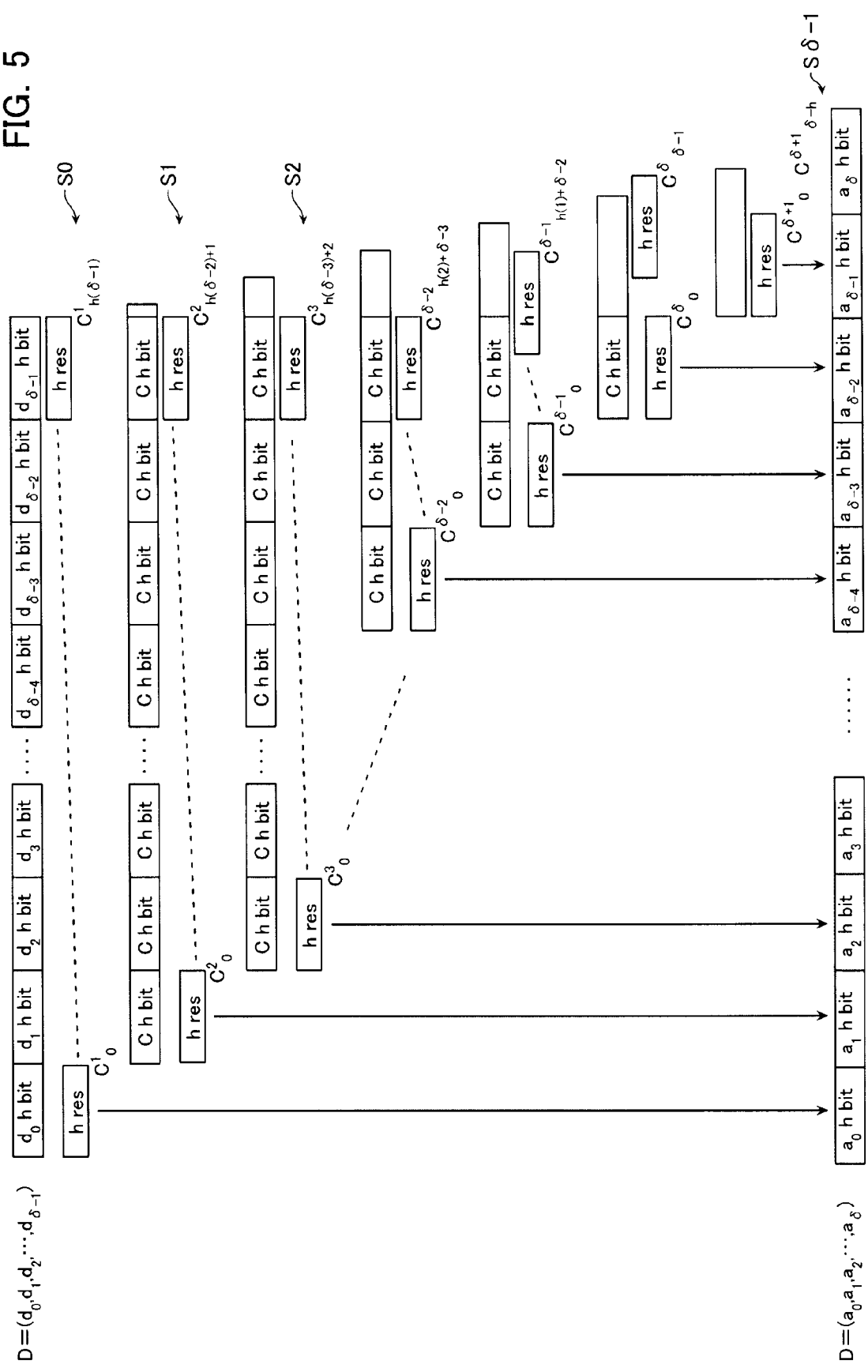
FIG. 5 is a diagram showing the configuration of a to-p-adic converter circuit in the memory system according to the embodiment.

FIG. 5 is a diagram schematically showing the configuration of the process of conversion computation from a $\delta$-digit, $2^h$-adic number D $(d_0, d_1, \ldots, d_{\delta-1})$ in the "binary world" to a ($\delta+1$)-digit, p-adic number D $(a_0, a_1, \ldots, a_{\delta-1}, a_\delta)$ in the "p-adic Zp mod p world".

A square shown with "h res" in FIG. 5 indicates an operating circuit operative to derive a quotient and the residue from the input binary data divided by the prime p. The input to the operating circuit is (h+1)-bit binary data and the output therefrom is the residue obtained by dividing the binary data by the prime p. If the input binary data is equal to or larger than the prime p, the quotient is output as a carry C. Hereinafter, the operating circuit element is referred to as the "h res" circuit block.

At the start, at the 0-th step (S0 in FIG. 5), $\delta$-digit, $2^h$-adic data D $(d_0, d_1, \ldots, d_{\delta-1})$ is subject to numeration from $d_{\delta-1}$ on the rightmost side. Here, the flow directly generates the residue and a quotient or carry $C^1_{h(\delta-1)}$ by substituting 0 for the most significant bit of (h+1)-bit binary data input to the "h res" circuit block and dividing $d_{\delta-1}$ by the prime p.

Subsequently, (h+1)-bit binary data, of which No. 1 to h−1 bits are the outputs from the previous "h res" circuit block (the residue represented by h bits) and No. 0 bit (the least significant bit) is the most significant bit $D^{\delta-2}{}_{h-1}$ ($=D_{h(\delta-2)-1}$) of $d_{\delta-2}$, is input to the next "h res" circuit block, which generates the residue and a quotient or carry $C^1{}_{h(\delta-1)-1}$ derived from the input binary data divided by the prime p.

Thereafter, until No. 0 bit of (h+1)-bit binary data input to the "h res" circuit block reaches the least significant bit $D^0{}_0$ ($=D_0$) of $d_0$, (h(δ−1)+1) "h res" circuit blocks are used to generate carries $C^1{}_0\text{-}C^1{}_{h(\delta-1)}$. Binary data expressed by these generated carries $C^1{}_0\text{-}C^1{}_{h(\delta-1)}$ indicates the number of the primes p contained in the data D.

The output from the "h res" circuit block having the input of $d_0$ has a binary representation $a_0$ of a (δ+1)-digit, p-adic number D ($a_0, a_1, \ldots, a_{\delta-1}, a_\delta$).

Subsequently, at the 1st step (S1 in FIG. 5), over the number of the primes p contained in the data D obtained at the 0-th step, a further computation is executed to determine how many primes p are contained to seek the number of pieces of $p^2$, thereby obtaining a binary having a coefficient $a_1$ on a digit of a weight of $p^1$ in the p-adic number D.

At the 1st step, numeration of the prime p is executed to the carries $C^1{}_0\text{-}C^1{}_{h(\delta-1)}$ from $C^1{}_{h(\delta-1)}$ on the rightmost side. At the time of the numeration of the prime p executed to the carries $C^1{}_{h(\delta-2)+1}\text{-}C^1{}_{h(\delta-1)}$, the flow directly generates the residue and a carry $C^2{}_{h(\delta-2)+1}$ by substituting 0 for the most significant bit of (h+1)-bit input binary data and dividing the input binary data by the prime p.

Subsequently, (h+1)-bit binary data, of which No. 1 to h−1 bits are the outputs from the previous "h res" circuit block (the residue represented by h bits) and No. 0 bit (the least significant bit) is $C^1{}_{h(\delta-2)}$, is input to the next "h res" circuit block, which generates the residue and a quotient or carry $C^2{}_{h(\delta-2)}$ derived from the input binary data divided by the prime p.

Thereafter, until No. 0 bit of (h+1)-bit binary data input to the "h res" circuit block reaches the least significant bit $C^1{}_0$ of $C^1{}_0\text{-}C^1{}_{h(\delta-1)}$, (h(δ−2)+1) "h res" circuit blocks are used to generate carries $C^2{}_0\text{-}C^2{}_{h(\delta-2)+1}$. Binary data expressed by these generated carries $C^2{}_0\text{-}C^2{}_{h(\delta-2)+1}$ indicates the number of pieces of the prime $p^2$ contained in the data D.

The output from the "h res" circuit block having the input $C^1{}_0$ becomes a binary $a_1$ of a (δ+1)-digit, p-adic number D ($a_0, a_1, \ldots, a_{\delta-1}, a_\delta$).

At the subsequent 2nd step (S2 in FIG. 5), over the number of pieces of $p^2$ contained in the data D obtained at the 1st step, a further computation is executed to determine how many primes p are contained to seek the number of pieces of $p^3$, thereby obtaining a binary having a coefficient $a_2$ on a digit of a weight of $p^2$ of the p-adic number D.

Thereafter, the flow advances up to the (δ−1)-th step (Sδ−1 in FIG. 5) similarly to obtain a binary representation of a coefficient $a_\delta$ on a digit of a weight of $p^\delta$ in the p-adic number.

The carries $C^{\delta+1}{}_0\text{-}C^{\delta+1}{}_{\delta-h}$ at the step Sδ−1 are not used in computation.

Next, the "h res" circuit block shown in FIG. 5, that is, the "h+1 bit mod p" circuit block (adder circuit) is described specifically.

Figure 6:
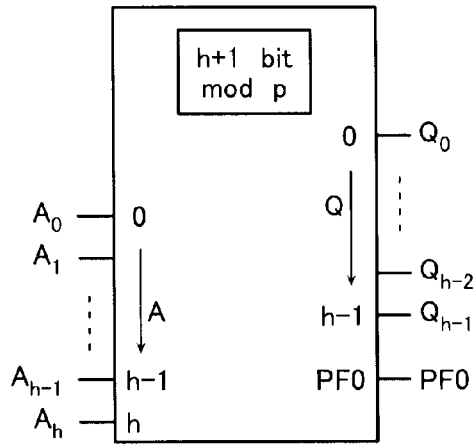
FIG. 6 is a diagram showing a circuit symbol of a "h+1 bit mod p" circuit block in the memory system according to the embodiment.

FIG. 6 shows a circuit symbol of the "h+1 bit mod p" circuit block. The "h+1 bit mod p" circuit block receives an (h+1)-bit binary $A_0\text{-}A_h$ and provides an h-bit binary $Q_0\text{-}Q_{h-1}$ and a carry PF0.

The "h+1 bit mod p" circuit block provides the residue Q modulo the prime p of the input binary A, and provides '1' from PF0 if the input binary A is equal to or more than p and '0' from PF0 if it is lower than p.

In the case of h=7, p=79, relations shown in Expression 12 can establish among the binary A, the binary Q and the prime p.

$$a=A_0+A_12+A_22^2+A_32^3+A_42^4+A_52^5+A_62^6+A_72^7$$

$$Q \equiv a \pmod{p} \;\; (a=Q+PF0 \times p)$$

$$Q=Q_0+Q_12+Q_22^2+Q_32^3+Q_42^4+Q_52^5+Q_62^6 \quad \text{[Expression 12]}$$

Figure 7:
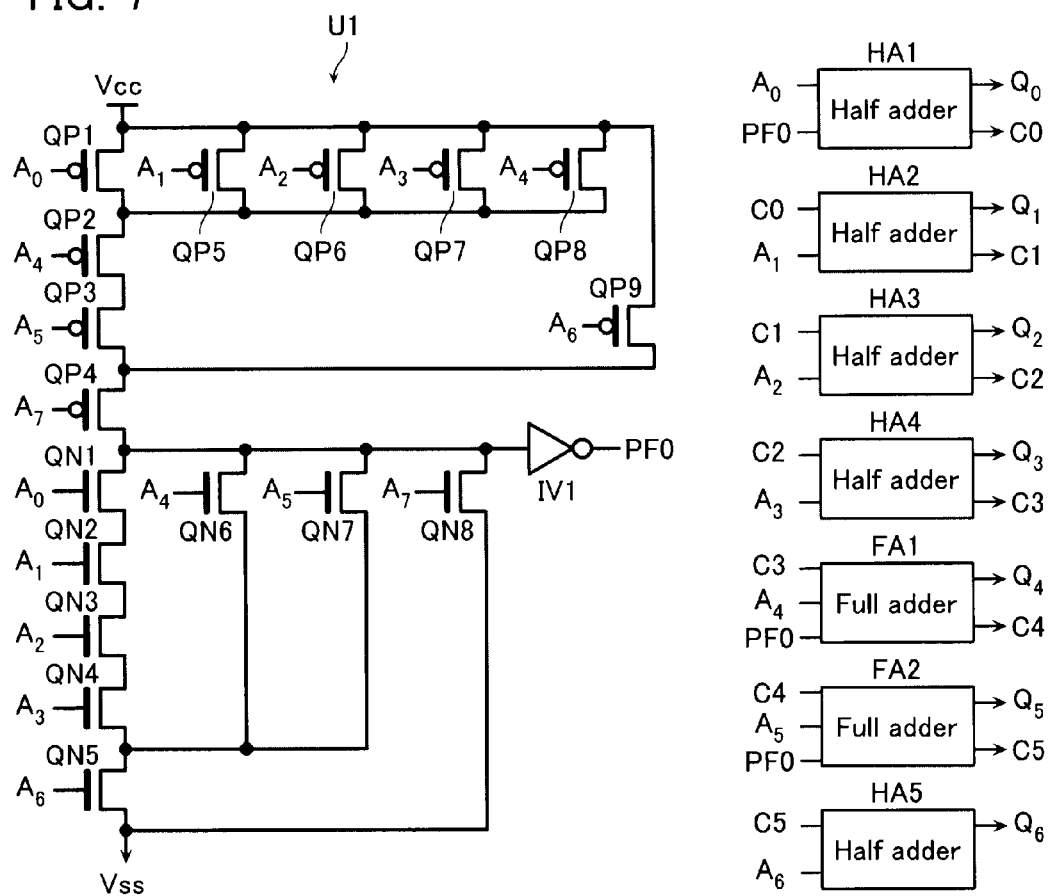
FIG. 7 is a circuit diagram of the "h+1 bit mod p" circuit block in the memory system according to the embodiment.

FIG. 7 is a block diagram of the "h+1 bit mod p" circuit block in the case of h=7, p=79.

The "h+1 bit mod p" circuit block comprises a PF0 generator unit U1, 5 half adders HA1-HA5, and 2 full adders FA1, FA2.

The PF0 generator unit U1 includes serially connected PMOS transistors QP1-QP4 and NMOS transistors QN1-QN5 between the Vcc terminal supplied with a certain voltage and the Vss terminal supplied with the ground voltage. These transistors QP1, QP2, QP3, QP4, QN1, QN2, QN3, QN4 and QN5 are controlled by $A_0, A_4, A_5, A_7, A_0, A_1, A_2, A_3$ and $A_6$, respectively.

The PF0 generator unit U1 also includes 5 PMOS transistors QP5-QP9, 3 NMOS transistors QN6-QN8, and an inverter IV1.

The transistors QP5-QP8 are connected between the source and drain of the transistor QP1. The transistor QP9 is connected between the source of the transistor QP1 and the drain of the transistor QP3. The transistors QP5, QP6, QP7, QP8 and QP9 are controlled by $A_1, A_2, A_3, A_4$ and $A_6$, respectively.

The transistors QN6, QN7 are connected between the source of the transistor QN1 and the drain of the transistor QN4. The transistor QN8 is connected between the source of the transistor QN1 and the drain of the transistor QN5 (Vss terminal). The transistors QN6, QN7 and QN8 are controlled by $A_4, A_5$ and $A_7$, respectively.

The inverter IV1 has an input connected to a node between the transistors QP4 and QN1. The output from the inverter IV1 provides the carry PF0.

The half adder HA1 has inputs $A_0$ and PF0, an output $Q_0$, and a carry output C0. The half adder HA2 has inputs C0 and $A_1$, an output $Q_1$, and a carry output C1. The half adder HA3 has inputs C1 and $A_2$, an output $Q_2$, and a carry output C2. The half adder HA4 has inputs C2 and $A_3$, an output $Q_3$, and a carry output C3. The full adder FA1 has inputs C3 and $A_4$, a carry input PF0, an output $Q_4$, and a carry output C4. The full adder FA2 has inputs C4 and $A_5$, a carry input PF0, an output $Q_5$, and a carry output C5. The half adder HA5 has inputs C5 and $A_6$, and an output $Q_6$.

In accordance with the above configuration, the PF0 generator unit U1 decides if the binary A input to the "h+1 bit mod p" circuit block is equal to or more than p=79, and provides the result from PF0. If the binary A is equal to or more than p=79, the half adders HA111-HA115 and the full adders FA111-FA112 are used to add 49, a complement of the 8-bit binary 79, to the binary A in order to subtract 79 from the binary A.

The following description is given to the full adder FA and the half adder HA serving as the basic unit for binary addition used in the "h+1 bit mod p" circuit block.

Figure 8:
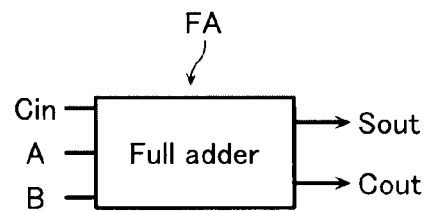
FIG. 8 is a diagram showing a circuit symbol of a full adder in the memory system according to the embodiment.

The full adder FA has inputs A, B, a carry input Cin, an output Sout, and a carry output Cout as shown in FIG. 8.

Figure 9:
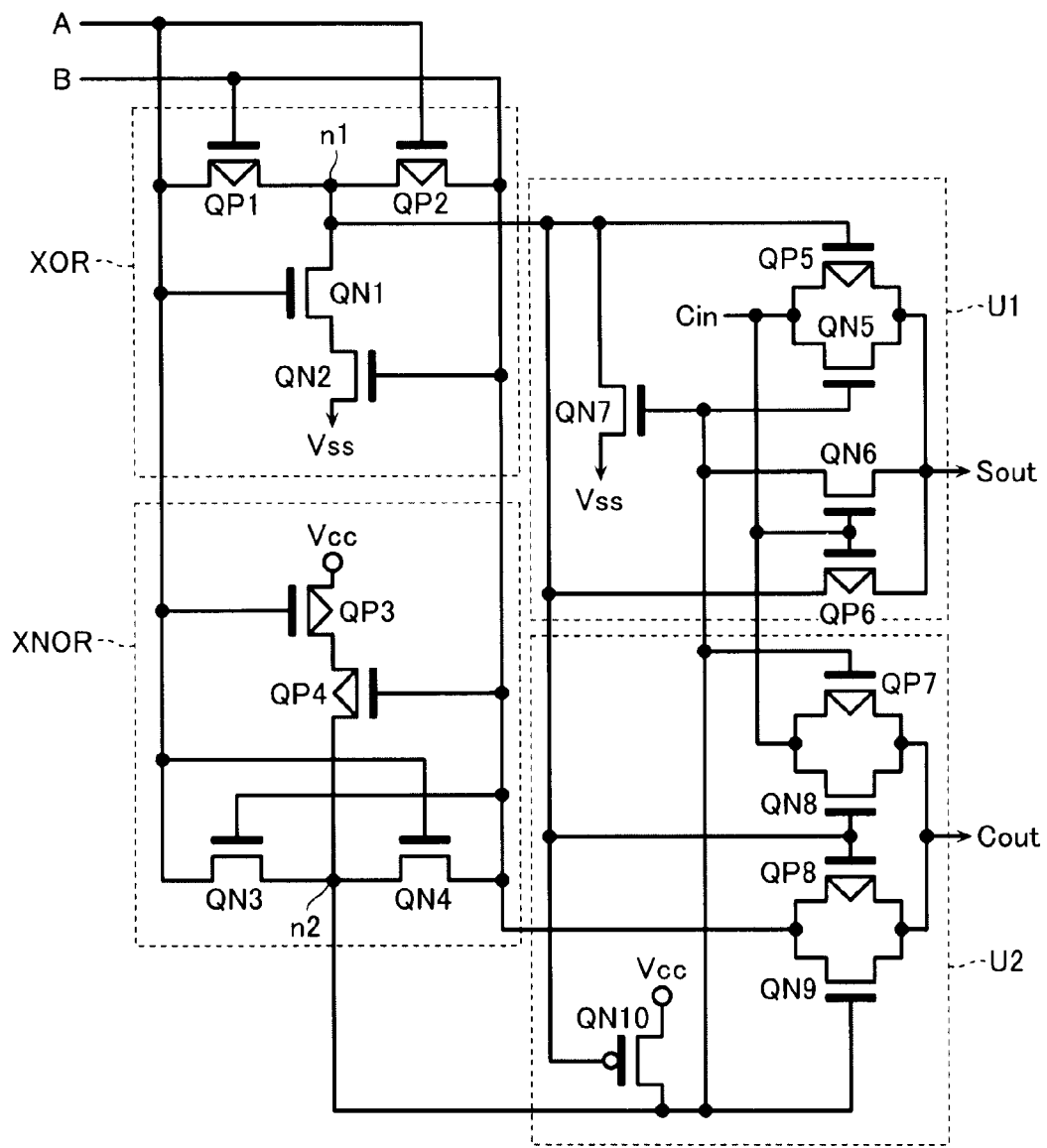
FIG. 9 is a circuit diagram of the full adder in the memory system according to the embodiment.

The full adder FA includes an XOR (exclusive logical sum) circuit, an XNOR (exclusive not logical sum) circuit, an output circuit U1, and a carry output circuit U2 as shown in FIG. 9.

The XOR circuit includes PNOS transistors QP1 and QP2 serially connected between the inputs A and B, and NMOS transistors QN1 and QN2 serially connected between a node n1 of the transistors QP1 and QP2 and the Vss terminal. Among those, the gates of the transistors QP2 and QN1 are connected to the input A. The gates of the transistors QP1 and QN2 are connected to the input B. This configuration leads the node n1 to the output of the XOR circuit.

The XNOR circuit includes NMOS transistors QN3 and QN4 serially connected between the inputs A and B, and PMOS transistors QP3 and QP4 serially connected between a node n2 of the transistors QN3 and QN4 and the Vcc terminal. Among those, the gates of the transistors QN4 and QP3 are connected to the input A. The gates of the transistors QN3 and QP4 are connected to the input B. This configuration leads the node n2 to the output of the XNOR circuit.

The output circuit U1 includes a PMOS transistor QP5 connected between the carry input Cin and the output Sout, and a similarly-connected NMOS transistor QN5, an NMOS transistor QN6 connected between the node n2 and the output Sout, and a PMOS transistor QP6 connected between the node n1 and the output Sout. Among those, the gate of the transistor QP5 is connected to the node n1, that is, the output of the XOR circuit. The gate of the transistor QN5 is connected to the node n2, that is, the output of the XNOR circuit. The gates of the transistors QN6 and QP6 are connected to the carry output Cin. The output circuit U1 also includes an NMOS transistor QN7 between the node n1 and the Vss terminal. The gate of the transistor QN7 is connected to the node n2, that is, the output of the XNOR circuit.

The carry output circuit U2 includes a PMOS transistor QP7 connected between the carry input Cin and the carry output Cout, a similarly-connected NMOS transistor QN8, a PMOS transistor QP8 connected between the input B and the carry output Cout, and a similarly-connected NMOS transistor QN9. Among those, the gates of the transistors QP7 and QN9 are connected to the node n2, that is, the output of the XNOR circuit. The gates of the transistors QN8 and QP8 are connected to the node n1, that is, the output of the XOR circuit. The carry output circuit U2 also includes an NMOS transistor QN10 connected between the Vss terminal and the node n2. The gate of the transistor QN10 is connected to the node n1, that is, the output of the XOR circuit via an inverter.

With the above configuration, the full adder FA executes logical operations on the inputs A and B at the XOR circuit and the XNOR circuit, and feeds the operation result and the carry input Cin to the output circuit U1 and the carry output circuit U2 to create the output Sout and the carry output Cout.

Figure 10:
FIG. 10 is a diagram showing a circuit symbol of a half adder in the memory system according to the embodiment.

The half adder HA has inputs A, B, an output Sout, and a carry output Cout as shown in FIG. 10.

Figure 11:
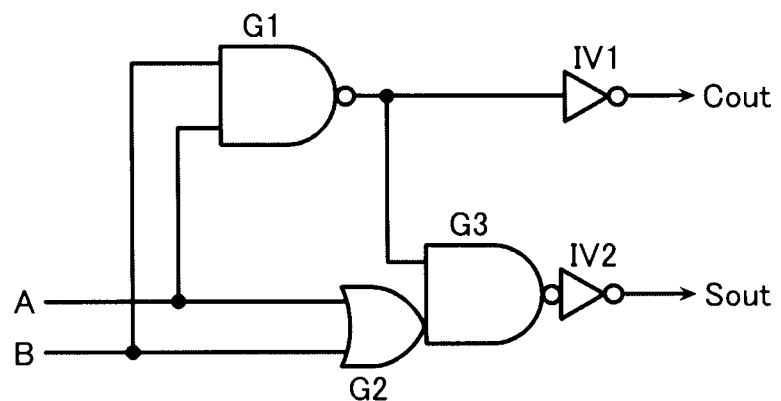
FIG. 11 is a circuit diagram of the half adder in the memory system according to the embodiment.

The half adder HA can be configured with general logical gates and inverters as shown in FIG. 11. Specifically, it can be configured with a NAND gate G1 that receives the input A and the input B, an OR gate G2 that receives the input A and the input B, a NAND gate G3 that receives the output from the NAND gate G1 and the output from the OR gate G2, an inverter IV1 that receives the output from the NAND gate G1, and an inverter IV2 that receives the output from the NAND gate G3. With this configuration, the output from the inverter IV1 provides the carry output Cout, and the output from the inverter IV2 provides the output Sout.

A consideration is given next to the configuration of the "binary to p-adic" converter unit using an "h+1 bit mod p" circuit block.

Figures 12A, 12B:
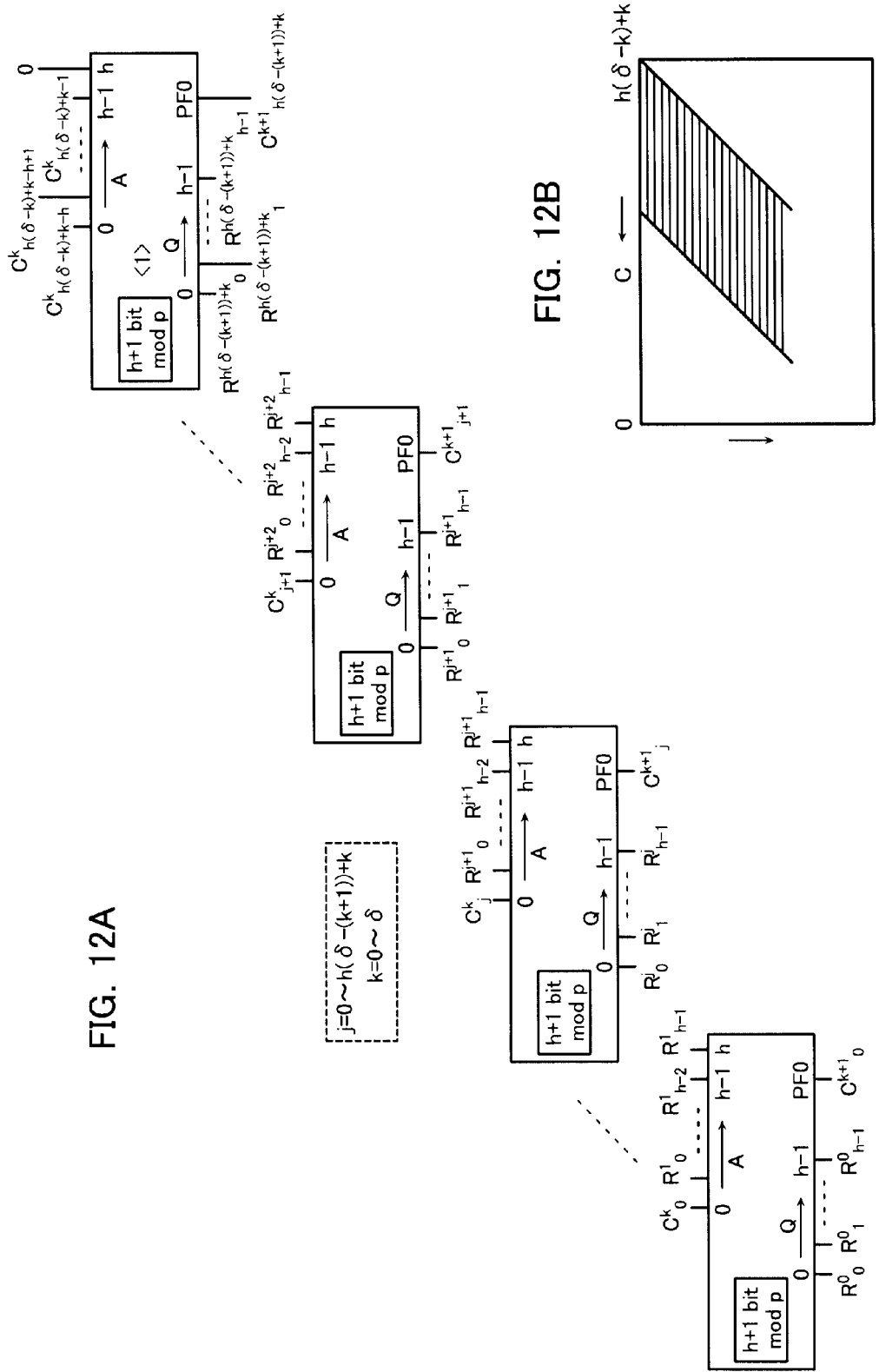
FIG. 12A is a diagram showing the configuration of an "X to p" circuit block in the memory system according to the embodiment.
FIG. 12B is a schematic diagram showing the execution sequence of the "X to p" circuit block in the memory system according to the embodiment when converting into p-adic number from binary.

FIG. 12A shows a circuit at the k-th step in the "binary to p-adic" conversion operating circuit, which is configured with "h+1 bit mod p" circuit blocks.

Here, the j-th digit is denoted with $d_j$ when data is subject to a δ-digit, $2^h$-adic expression. In this case, $d_j$ can be indicated in h-bit binary. For the purpose of representing the coefficient D as the indication of a binary number, though, sub-indexes are used as shown in Expression 13.

$$d_j = D^j_0 + D^j_1 2 + D^j_2 2^2 + \ldots + D^j_{h-3} 2^{h-3} + D^j_{h-2} 2^{h-2} + D^j_{h-1} 2^{h-1}$$

$$d_j(2^h)^j = D_{hj} 2^{hj} + D_{hj+1} 2^{hj+1} + \ldots + D_{h(j+1)-2} 2^{h(j+1)-2} + D_{h(j+1)-1} 2^{h(j+1)-1}$$

[Expression 13]

The input to the operation at the k-th step, that is, the carry at the previous step (the (k−1)-th step) is $C^k_0 - C^k_{h(\delta-k)+k-1}$, the coefficients of a binary number which sub-index is the powers of 2, and the numeral expressed by this binary indicates the number of pieces of $p^k$ contained in the data.

At the k-th step, the input includes h(δ−k)+k pieces of binaries (carries $C^k_0 - C^k_{h(\delta-k)+k-1}$) as shown in FIG. 12A, which are received at h(δ−(k+1))+k+1 pieces of "h+1 bit mod p" circuit blocks.

The 1st "h+1 bit mod p" circuit block <1> receives $C^k_{h(\delta-k)+k-h}$ to $C^k_{h(\delta-k)+k-1}$ and 0 on the input binary $A_0$-$A_{h-1}$, $A_h$, and provides $R^{h(\delta-(k+1))+k}_0$ to $R^{h(\delta-(k+1))+k}_{h-1}$ and $C^{k+1}_{h(\delta-(k+1))+k}$ from the outputs $Q_0$-$Q_{h-1}$ and the carry PF0, respectively.

The 2nd "h+1 bit mod p" circuit block <2>, not shown, receives the outputs $R^{h(\delta-(k+1))+k}_0$ to $R^{h(\delta-(k+1))+k}_0$ and a carry $C^k_{h(\delta-(k+1))+k-1}$ from the 1st "h+1 bit mod p" circuit block <1> on the input binary $A_1$-$A_h$ and $A_0$, and provides $R^{h(\delta-(k+1))+k}_0$ to $R^{h(\delta-(k+1))+k-1}_{h-1}$ and $C^{k+1}_{h(\delta-(k+1))+k-1}$ from the outputs $Q_0$-$Q_{h-1}$ and the carry PF0, respectively.

Thereafter, as shown in FIG. 12A, "h+1 bit mod p" circuit blocks having the same input/output are aligned h(δ−(k+1))+k+1 pieces in total, and the carries $C^{k+1}_0$ to $C^{k+1}_{h(\delta-(k+1))+k}$ output from the "h+1 bit mod p" circuit blocks turn to the inputs at the next step, that is, the (k+1)-th step.

Thus, the conversion of binary to p-adic number is executed sequentially from the most significant bit of the carry C as in the schematic diagram shown in FIG. 12B.

FIG. 12A shows the circuitry related to the k-th step. The circuitry shown in FIG. 12A can be used over steps if the steps are processed in time division. In this case, for the purpose of using simple on/off for control of the inputs/outputs of the "h+1 bit mod p" circuit blocks, the circuitry at the 0-th step having the maximum number of required "h+1 bit mod p" circuit blocks is additionally provided with δ "h+1 bit mod p" circuit blocks.

A circuit including h(δ−1)+δ+1 pieces of "h+1 bit mod p" circuit blocks thus configured is referred to as the "X to p" circuit block.

Figure 13:
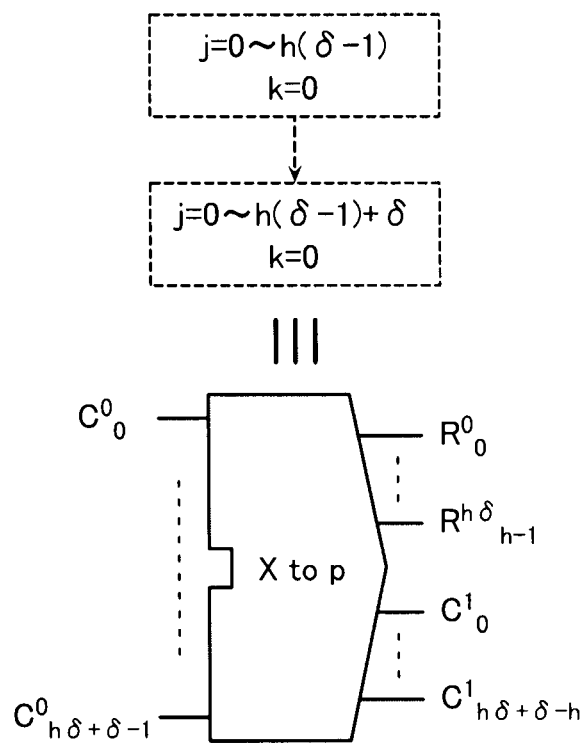
FIG. 13 is a diagram showing a circuit symbol of the "X to p" circuit block in the memory system according to the embodiment.

As shown in FIG. 13, the inputs to the "X to p" circuit block include $C^0_0$-$C^0_{h\delta+\delta-1}$, (h+1) δ pieces in total, δ pieces more than that in the case of k=0 in FIG. 12A. The outputs therefrom include (δ+1) pieces of h-bit binaries $R^0_0$-$R^0_{h-1}$, $R^h_0$-$R^h_{h-1}$, ..., $R^{h(\delta-1)}_0$-$R^{h(\delta-1)}_{h-1}$, $R^{h\delta}_0$-$R^{h\delta}_{h-1}$ output from every h "h+1 bit mod p" circuit blocks, and (hδ+δ−h) pieces of carries $C^1_0$-$C^1_{h(\delta-1)+\delta}$ to be used as the inputs at the next step.

The following description is given to the core part of the "binary to p-adic" conversion operating circuit, that is, the "p-adic" circuit block.

Figure 14:
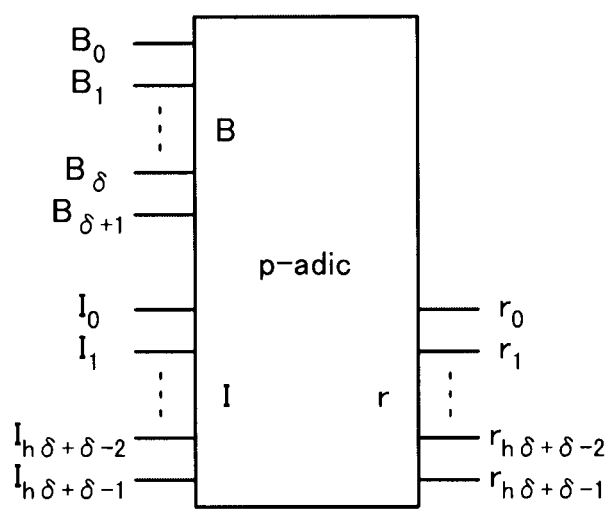
FIG. 14 is a diagram showing a circuit symbol of a "p-adic" circuit block in the memory system according to the embodiment.

FIG. 14 is a diagram showing a circuit symbol of the "p-adic" circuit block.

The "p-adic" circuit block receives $B_0$-$B_{\delta+1}$, $I_0$-$I_{h\delta+\delta-1}$, and provides $r_0$-$r_{h\delta+\delta-1}$ as shown in FIG. 14.

Figure 15:
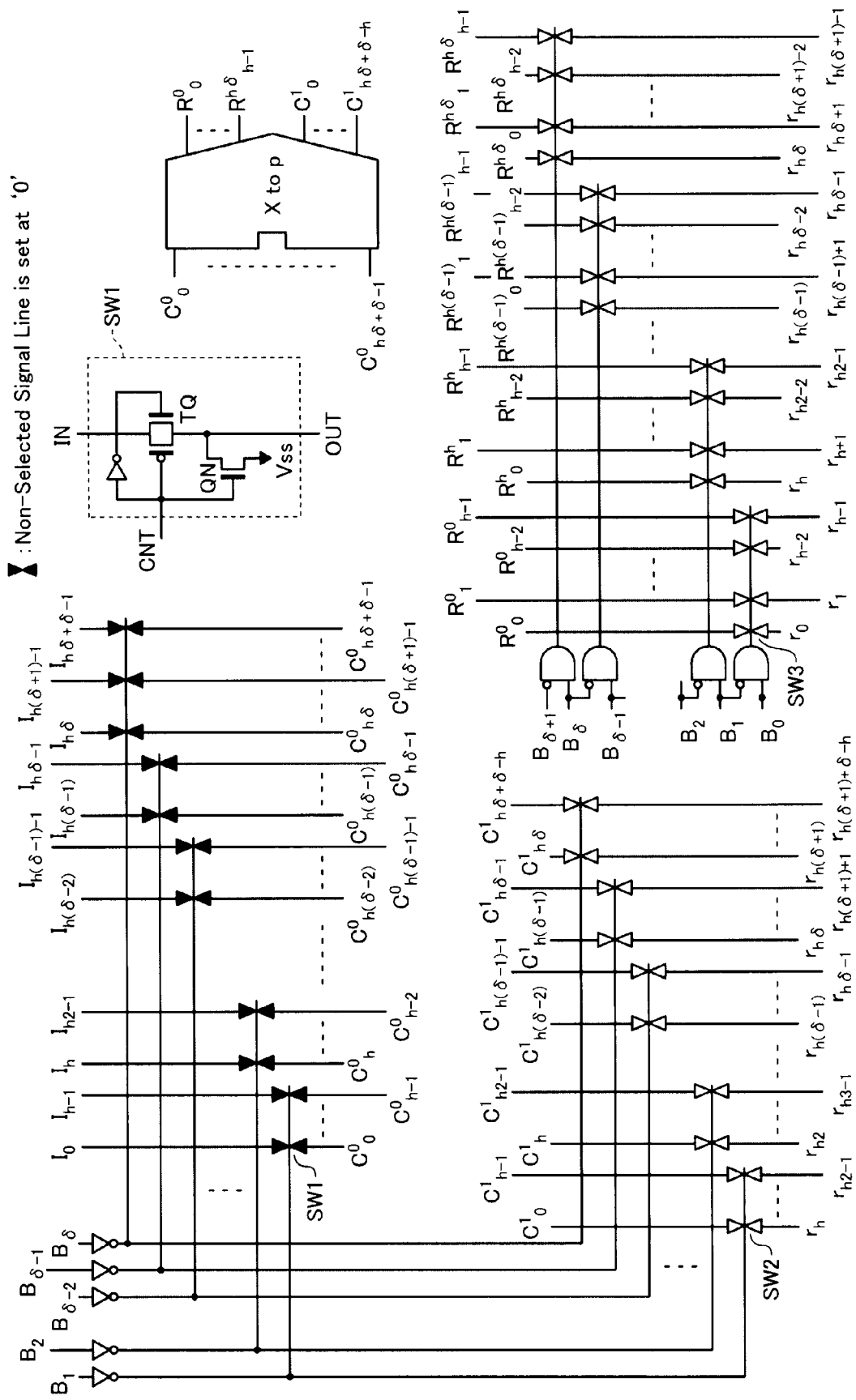
FIG. 15 is a block diagram of the "p-adic" circuit block in the memory system according to the embodiment.

FIG. 15 is a block diagram of the "p-adic" circuit block. The "p-adic" circuit block includes an "X to p" circuit block in the 1-step circuitry, and additional control switches SW for controlling the input/output of the "X to p" circuit block.

Specifically, the inputs $I_0$-$I_{h\delta+\delta-1}$ are fed via the control switches SW1 to the "X to p" circuit block as $C^0_0$-$C^0_{h\delta+\delta-1}$, respectively. These δ groups of control switches SW1 are controlled by the inputs /$B_1$-/$B_\delta$ ('/' indicates "not"), respectively.

One control switch SW1 includes a transfer transistor TQ operative to connect the input IN with the output OUT, and an NMOS transistor QN operative to pull down the output OUT to the ground voltage. The transfer transistor TQ turns on if the control signal is CNT='0' while the transistor QN turns on if the control signal is CNT='1'.

In the case of the control switches SW1, the control signals CNT include /$B_1$-/$B_\delta$. Therefore, $I_0$-$I_{h\delta+\delta-1}$ are provided directly as $C^0_0$-$C^0_{h\delta+\delta-1}$ if B='1', and the output turns to '0' independent of the input if B='0'. This is effective to prevent the input to the "X to p" circuit block from becoming infinite even if the inputs $I_0$-$I_{h\delta+\delta-1}$ to the "p-adic" circuit block are infinite.

The "X to p" circuit block on receipt of $C^0_0$-$C^0_{h\delta+\delta-1}$ provides $R^0_0$-$R^{h\delta}_{h-1}$, $C^1_0$-$C^1_{h\delta+\delta-1}$ as described above.

The outputs $C^1_0$-$C^1_{h\delta+\delta-h}$ from the "X to p" circuit block pass through the control switches SW2 and turn to $r_h$-$r_{h(\delta+1)+\delta-h}$, that is, the outputs from the "p-adic" circuit block. These control switches SW2 are controlled by the inputs /$B_1$-/$B_\delta$. Therefore, these control switches SW2 directly pass $C^1_0$-$C^1_{h\delta+\delta-h}$ as $r_h$-$r_{h(\delta+1)+\delta-h}$ if B='0'.

The outputs $R^0_0$-$R^{h\delta}_{h-1}$ from the "X to p" circuit block pass through the control switches SW3 and turn to $r_0$-$r_{h(\delta+1)-1}$, that is, the outputs from the "p-adic" circuit block. These control switches SW3 are controlled by $B_0 \square /B_1$ to $B_{10} \square /B_{\delta+1}$, respectively. Therefore, the control switches SW3 located between $R^0_0$ and $r_0$, for example, directly provide $R^0_0$ as $r_0$ only if $B_0$='1' and $B_1$='0'.

$B_1$-$B_{\delta+1}$ for use in control of the control switches SW are timing signals, which are signals that rise sequentially. In sync with this, the paths for the inputs I close at every h bits from the lower bit side and the paths for the outputs r switch to the paths for the outputs R.

In order to provide the result at the present step until the flow enters the computation process at the next step, R corresponding to a coefficient A on each digit of a p-adic number is provided to the later-described external "D-r" register via the control switches SW3 on/off-controlled by the signals resulted from the logical operation with the adjacent timing signals B.

The following description is given to the "binary to p-adic" conversion operating circuit including the above-described circuits grouped together.

Figure 16:
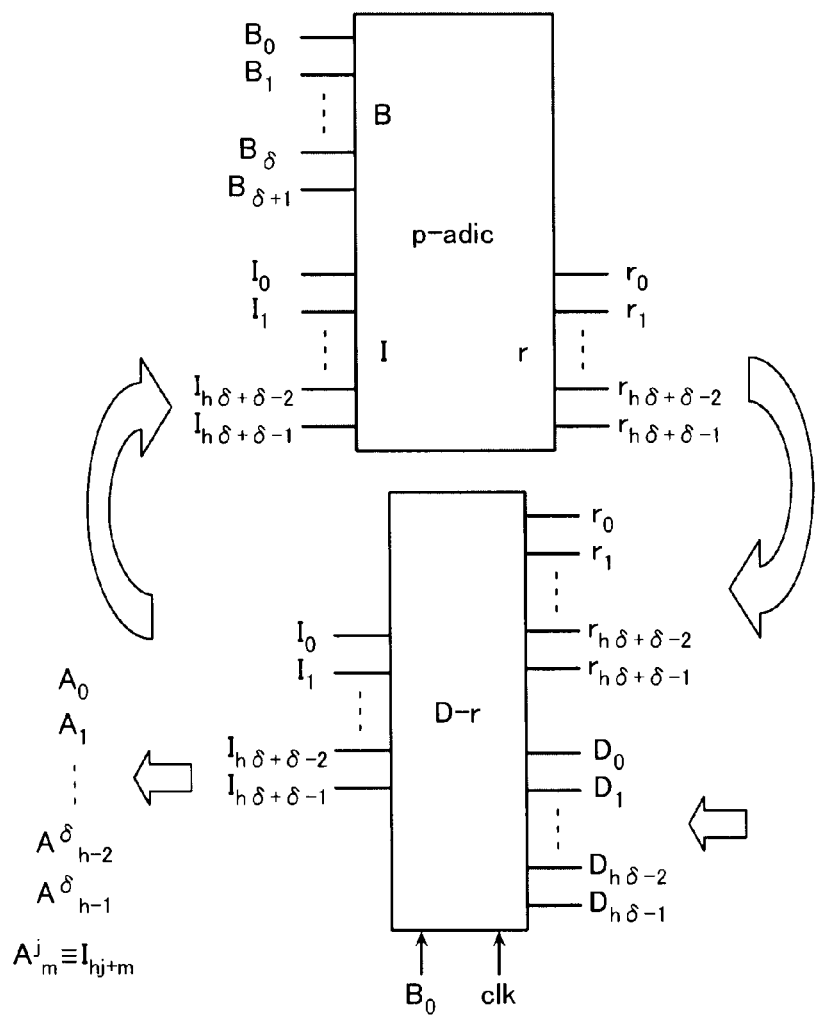
FIG. 16 is a block diagram of a "binary to p-adic" conversion operating circuit in the memory system according to the embodiment.

FIG. 16 is a block diagram of the "binary to p-adic" conversion operating circuit. The "binary to p-adic" conversion operating circuit includes the "p-adic" circuit block and the "D-r" register coupled thereto.

The "D-r" register is a register controlled by the timing signal B and the clock clk as shown in FIG. 16. It has the inputs $r_0$-$r_{h\delta+\delta-1}$, $D_0$-$D_{h\delta-1}$ and the outputs $I_0$-$I_{h\delta+\delta-1}$.

Figure 17:
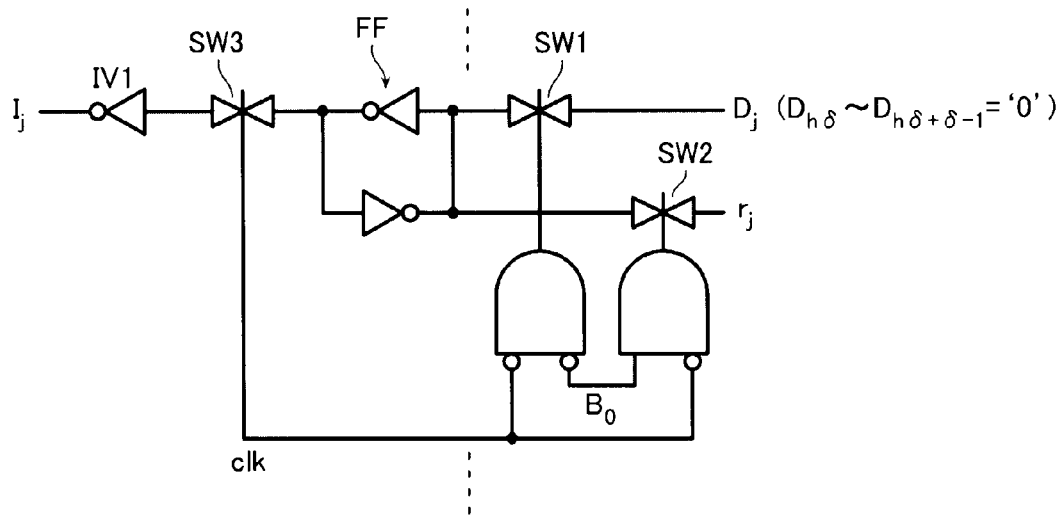
FIG. 17 is a circuit diagram of a "D-r" register in the memory system according to the embodiment.

FIG. 17 is a circuit diagram of the "D-r" register.

The "D-r" register includes a flip-flop FF composed of 2 inverters at every bit. The flip-flop FF receives $D_j$ (j=0 to hδ−1) via the control switch SW1 and receives $r_j$ via the control switch SW2. On the other hand, the flip-flop FF is connected to an inverter IV1 on the output side via the control switch SW3. The output from the inverter IV1 provides $I_j$.

The control switches SW1-SW3 are controlled by the timing signal $B_0$ and the clock clk. Specifically, the control switch SW1 turns on if /clk$\square$/$B_0$='1', the control switch SW2 if /clk$\square B_0$='1', and the control switch SW3 if clk='1', respectively.

$D_{h\delta}$-$D_{h\delta+\delta-1}$ not contained in the data input to the "D-r" register are held at '0'.

In the initial state of the "D-r" register, a binary $D_0$-$D_{h\delta-1}$ is set, and the rest is filled with '0'. Thereafter, when $B_0$ rises, data $r_j$ is taken in sync with the fall of clk, and the taken $r_j$ is provided as $I_j$ in sync with the rise of clk.

Figure 18:
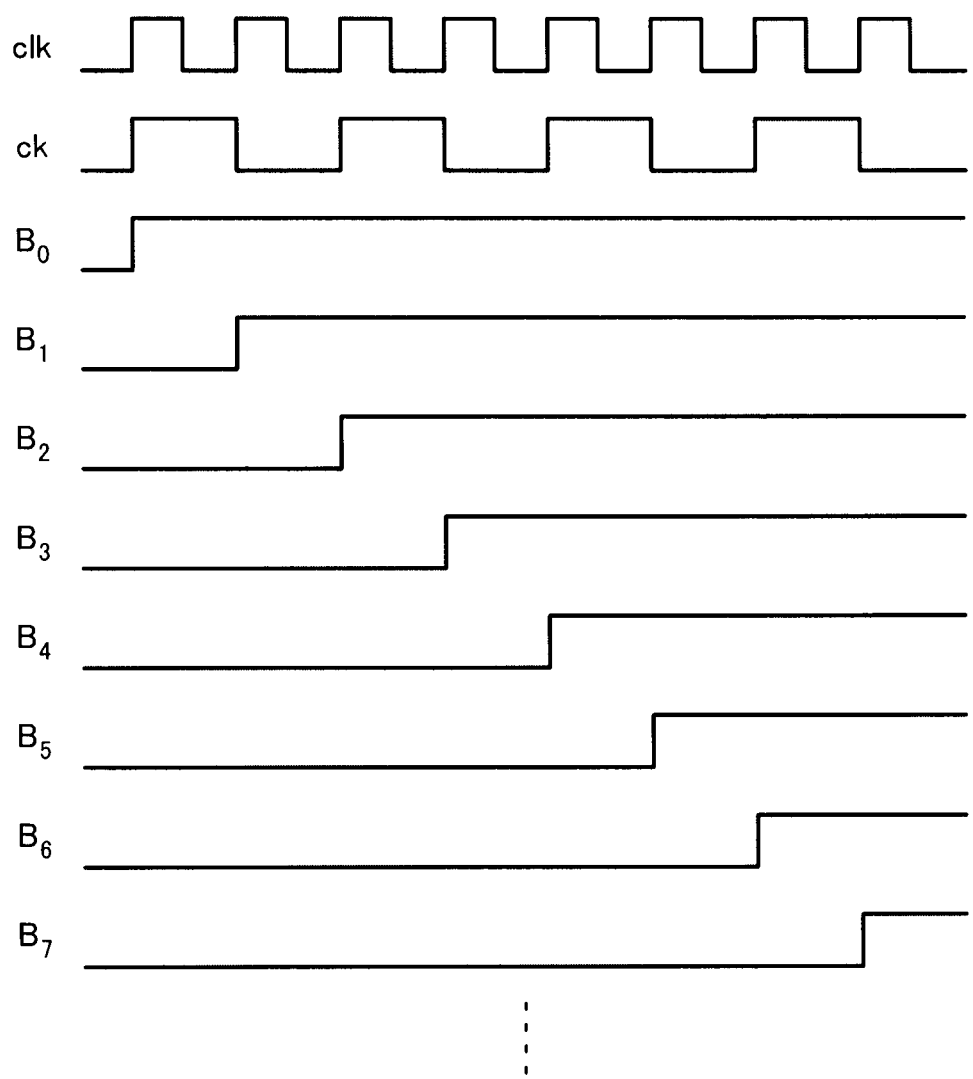
FIG. 18 is a timing chart of clocks for use in control of the "binary to p-adic" conversion operating circuit in the memory system according to the embodiment.

The "D-r" register couples with the "p-adic" circuit block to advance the computation step at every timing signal $B_j$. The state of variations in each clock is shown in FIG. 18. The clock clk is used to generate a clock ck and further generate timing signals $B_j$.

At each computation step, each digit $A_j$ of a p-adic number is obtained as the output r from the lower side, and this is held at the same timing as that for taking $I_j$ in the second half of the timing signal $B_j$.

After completion of all the computation steps, the "D-r" register holds the coefficients $A^j_m$ on respective digits when the coefficients a on respective digits of p-adic data D are converted to binaries.

Although various cases are compared with each other later, in the system using an actual prime p, the number of computation steps is equal to or below 10, and the number of the "h+1 bit mod p" circuit blocks contained in the "p-adic" circuit block is equal to or below 50.

[Conversion from Zp Data to Binary Data]

A specific circuit is shown below for the conversion from a (δ+1)-digit, p-adic number D=($a_0$, $a_1$, ..., $a_{\delta-1}$, $a_\delta$) in the "p-adic Zp world" to a δ-digit, $2^h$-adic number D=($d_0$, $d_2$, ..., $d_{\delta-1}$) in the "binary world", which are equivalent as data.

The conversion from a p-adic number to a 2-adic number can be executed by the operation of numerating the number of primes p contained in the p-adic number and summing up the binary representations of the prime p by the number of the primes. The operation executes the conversion to the binary while lowering the degree one by one from the largest degree in the p-adic number, and uses the fact that the binary finally becomes a 2-adic number of the same number at the zero-degree of the prime p. Therefore, (h+1) bits are obtained through the computation at every h bits, then the least significant bit is separated therefrom, and the computation at the next degree of the power of 2 is executed. Such the computation process is repeated to complete processing.

Figure 19:
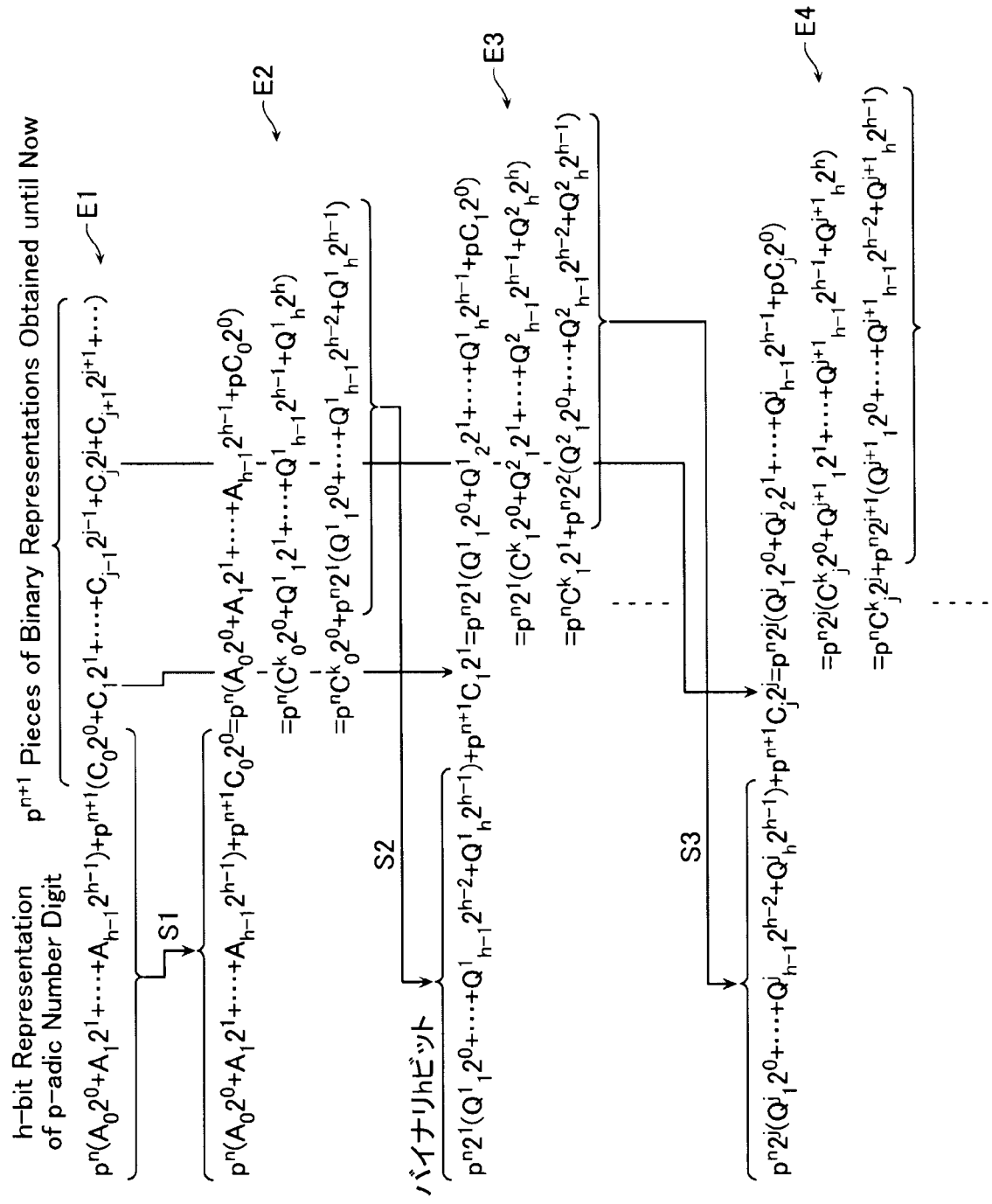
FIG. 19 is diagram showing a part of the conversion process from a p-adic number to a binary in the memory system according to the embodiment.

FIG. 19 is a diagram showing a part of the conversion process from a p-adic number to a binary. In this case, it is assumed that the number of pieces of $p^{n+1}$ contained in the p-adic data has already been represented in binary, and the binary representation of a numeral on a digit having a weight of $p^n$ in the p-adic number is used to describe the process for obtaining binaries by the number of $p^n$.

If the number of pieces of $p^{n+1}$ contained in the data is represented in binary as $C_0 2^0 + C_1 2^1 + \ldots + C_{j-1} 2^{j-1} + C_j 2^j + C_{j+1} 2^{j+1} \ldots$, the number of $p^n$ in the data D can be represented as in the equation E1 (=$p^n(A_0 2^0 + A_1 2^1 + \ldots + A_{h-1} 2^{h-1}) + p^{n+1}(C_0 2^0 + C_1 2^1 + \ldots + C_{j-1} 2^{j-1} + C_j 2^j + C_{j+1} 2^{j+1} \ldots)$) in FIG. 19. The coefficient of $p^n$, that is, $A_0 2^0 + A_1 2^1 + \ldots + A_{h-1} 2^{h-1}$, is an h-bit representation on a digit having a weight of $p^n$ in the p-adic number.

At the start, as shown with S1 in FIG. 19, a prime p is added to the h-bit binary. This operation is executed to add the term of $p^n$, that is, $p^n(A_0 2^0 + A_1 2^1 + \ldots + A_{h-1} 2^{h-1})$ in the equation E1 to the term of $p^{n+1} C_0 2^0$ corresponding to the least significant bit when the digit having a weight of $p^n$ in the p-adic number of the term $p^{n+1}$ is binary-represented, thereby creating an equation E2 (=$p^n (A_0 2^0 + A_1 2^1 + \ldots + A_{h-1} 2^{h-1}) + p^{n+}$ $_1C_02^0$). This equation E2 is applied to obtain an (h+1)-bit binary representation $p''(C^k_0 2^0 + Q^1_1 2^1 + \ldots + Q^1_{h-1} 2^{h-1} + Q^1_h 2^h)$. For the next processing, the equation E2 is applied to obtain a new h-bit binary $p''2^1 (Q^1_1 2^0 + \ldots + Q^1_{h-1} 2^{h-2} + Q^1_h 2^{h-1})$ by separating therefrom the lowermost term $p''C^k_0 2^0$ in the binary representation of the number of pieces of p'' contained in the equation E2.

Subsequently, as shown with S2 in FIG. 19, a prime p is added to the h-bit binary. This operation is executed to add the term $p''2^1 (Q^1_1 2^0 + \ldots + Q^1_{h-1} 2^{h-2} + Q^1_h 2^{h-1})$ obtained at S1 in FIG. 19 to the term $p^{n+1}C_1 2^1$ in the equation E1, thereby creating an equation E3 $(=p''2^1(Q^1_1 2^0 + \ldots + Q^1_{h-1} 2^{h-2} + Q^1_h 2^{h-1})) + p^{n+1}C_1 2^1)$. This equation E3 is applied to obtain an (h+1)-bit binary representation $p''2^1 (C^k_1 2^0 + Q^2_0 2^1 + \ldots + Q^2_{h-2} 2^{h-1} + Q^2_{h-1} 2^h)$. For the next processing, the equation E3 is applied to obtain $p''2^2 (Q^2_0 2^0 + \ldots + Q^2_{h-2} 2^{h-2} + C^2_{h-1} 2^{h-1})$ by separating therefrom the lowermost term $p''C^k_1 2^1$ in the binary representation of the number of pieces of p'' contained in the equation E3.

Thereafter, all the binary representations, $p''C^k_j 2^j$, of the number of pieces of p'' are obtained similar to S2 in FIG. 19 to finish the computation at this step.

At the next step, the binary representations of the number of pieces of $p^{n-1}$ in the p-adic number are obtained similarly.

Thus, the computation process uses the fact that a prime p is selected such that the number derived from the h-bit binary plus the prime p reaches (h+1) bits or below.

A numeral A in h-bit binary can be represented as in Expression 14, and accordingly $0 \leq A < 2^h$ can establish.

$$A = a_0 2^0 + a_1 2^1 + \ldots + a_{h-3} 2^{h-3} + a_{h-2} 2^{h-2} + a_{h-1} 2^{h-1} \quad \text{[Expression 14]}$$

In addition, an h-bit prime p falls within $2^{h-1} < p < 2^h$. Therefore, a relation as in Expression 15 establishes.

$$2^{h-1} < p + A < 2^{h+1} \quad \text{[Expression 15]}$$

Expression 15 means that even after a prime p is added to the h-bit binary, it can be represented in (h+1)-bit binary or below, under the condition on selecting the prime p shown in Expression 8.

Therefore, the "p-adic to binary" conversion operating circuit operative to convert data from a p-adic number to a binary can be composed of a ladder of h-bit input, (h+1)-bit output adder circuits as can be found.

Figure 20:
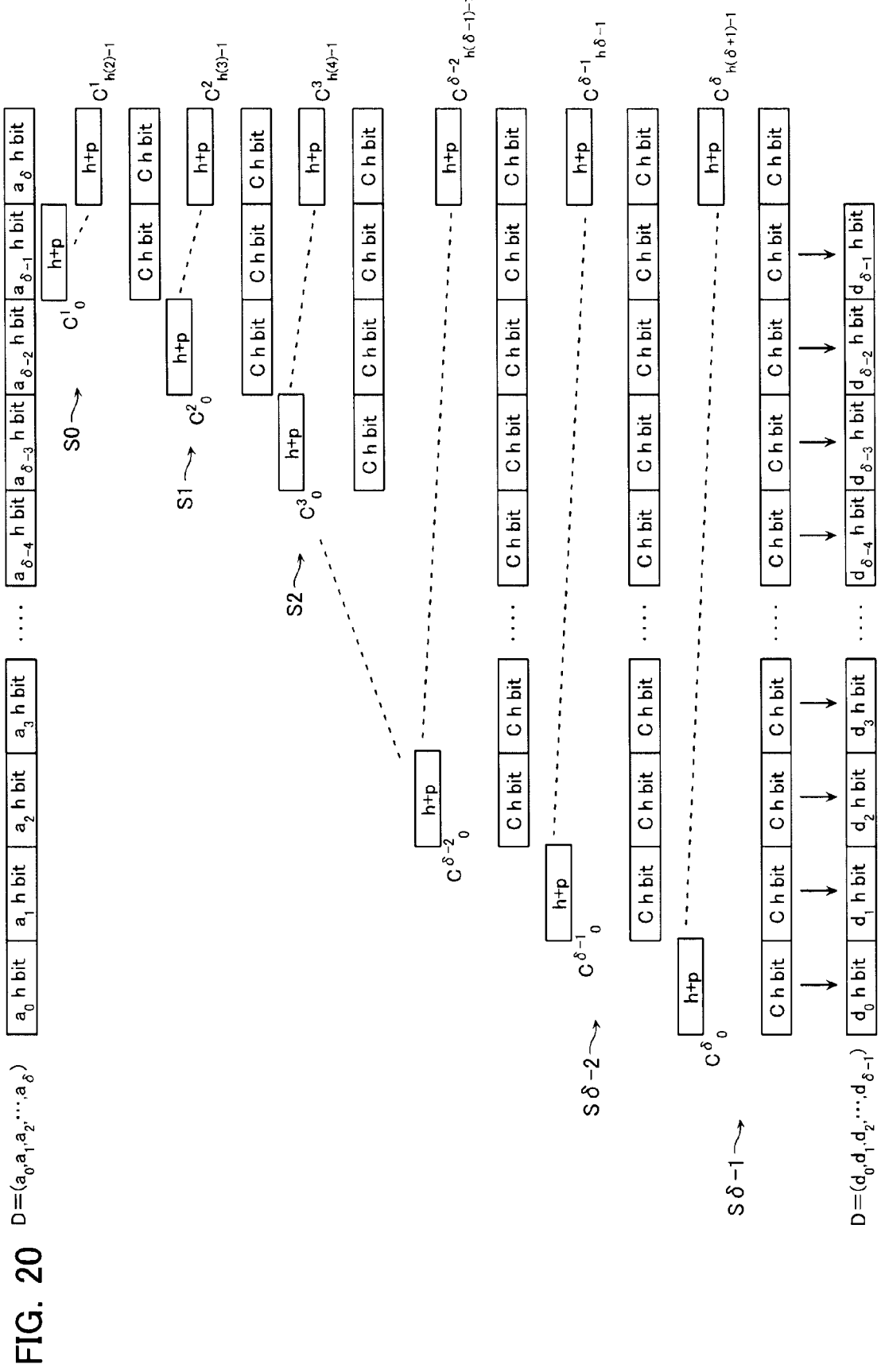
FIG. 20 is a diagram showing the configuration of a to-$2^h$-adic converter circuit in the memory system according to the embodiment.

FIG. 20 is a diagram schematically showing the configuration of a circuit for converting a (δ+1)-digit, p-adic number D ($a_0, a_1, \ldots, a_{δ-1}, a_δ$) in the "p-adic Zp world" to a δ-digit, $2^h$-adic number D ($d_0, d_1, \ldots, d_{δ-1}$) in the "binary world".

A square shown with "h+p" in FIG. 20 indicates an operating circuit operative to add the prime p to the input h-bit data in accordance with the input carry C to provide an (h+1)-bit binary. Hereinafter, this circuit is referred to as the "h+p" circuit block.

At the start, at the 0-th step (S0 in FIG. 20), the above-described computation is executed to a binary representation of the digit at the (δ−1)-th degree in the p-adic number using a binary representation of the digit at the δ-th degree as a carry, that is, a binary representation of the number of pieces of $p^δ$, thereby obtaining 2h bits of a carry $C^1_0$-$C^1_{h2-1}$ as the number of pieces of $p^{δ-1}$. This carry $C^1_0$-$C^1_{h2-1}$ turns to the input at the next 1st step.

Subsequently, at the 1st step (S1 in FIG. 20), the above-described computation is executed to a binary representation of the digit at the (δ−2)-th degree in the p-adic number using the carry $C^1_0$-$C^1_{h2-1}$ obtained at the 0-th step as a binary representation of the number of pieces of $p^{δ-1}$, thereby obtaining 3h bits of a carry $C^2_0$-$C^2_{h3-1}$ as the number of pieces of $p^{δ-2}$. This carry $C^2_0$-$C^2_{h3-1}$ turns to the input at the next 2nd step (S2 in FIG. 20).

Thereafter, the same steps as the 0-th step and the 1st step are repeated and, at the (δ−1)-th step, the above-described computation is executed to a binary representation of the digit at the 0-th degree in the p-adic representation using a carry $C^{δ-1}_0$-$C^{δ-1}_{hδ-1}$ obtained at the previous (δ−2)-th step as a binary representation of the number of p, thereby obtaining h (δ+1) bits of a carry $C^δ_0$-$C^δ_{h(δ+1)-1}$ as the number of pieces of $p^0$, that is, a binary representation of D. In this case, the upper h bits are held at zero in accordance with the setting of the p-adic number and the $2^h$-adic number associated with D. When $C^δ_{hδ}$-$C^δ_{h(δ+1)-1}$ are excluded from the carries $C^δ_0$-$C^δ_{h(δ+1)-1}$ and the remaining $C^δ_0$-$C^δ_{hδ-1}$ are grouped at every h bits, a binary representation of D, that is, D ($d_0, d_1, \ldots, d_{δ-1}$) can be obtained.

The following specific description is given to the "h+p" circuit block shown in FIG. 20, that is, the "h+1 bit add p" circuit block.

Figure 21:
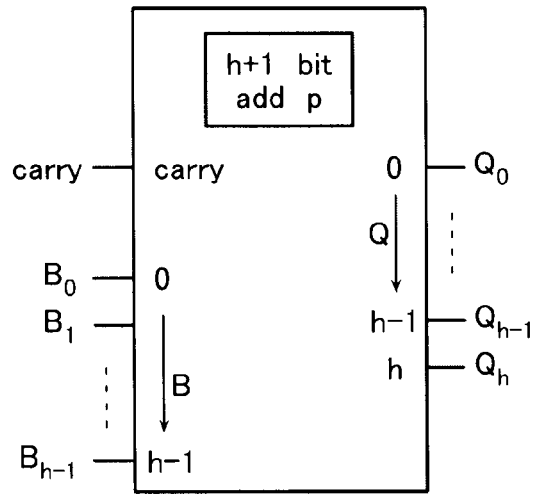
FIG. 21 is a diagram showing a circuit symbol of a "h+1 bit add p" circuit block in the memory system according to the embodiment.

FIG. 21 shows a circuit symbol of the "h+1 bit add p" circuit block. The "h+1 bit add p" circuit block receives an h-bit binary $B_0$-$B_{h-1}$ and a 1-bit carry (carry), and provides an (h+1)-bit binary $Q_0$-$Q_h$. The "h+1 bit add p" circuit block adds a prime p to the input B if the carry is '1', and provides the result as Q.

The "h+1 bit add p" circuit block in the case of h=7, p=79 is considered. In this case, the relation shown in Expression 16 can establish among the binaries b and Q and the prime p.

$$b = B_0 + B_1 2 + B_2 2^2 + B_3 2^3 + B_4 2^4 + B_5 2^5 + B_6 2^6$$

$$Q = b + \text{carry} \times p$$

$$Q = Q_0 + Q_1 2 + Q_2 2^2 + Q_3 2^3 + Q_4 2^4 + Q_5 2^5 + Q_6 2^6 + Q_7 2^7 \quad \text{[Expression 16]}$$

Figure 22:
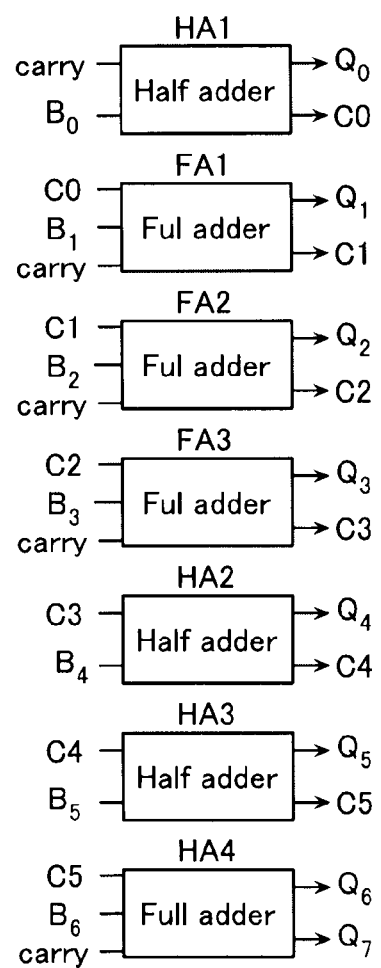
FIG. 22 is a circuit diagram of the "h+1 bit add p" circuit block in the memory system according to the embodiment.

FIG. 22 is a circuit diagram of the "h+1 bit add p" circuit block in the case of h=7, p=79.

The "h+1 bit add p" circuit block includes 3 half adders HA1-HA3 and 4 full adders FA1-FA4.

The half adder HA1 has inputs $B_o$ and carry, an output $Q_0$, and a carry output C0. The full adder FA1 has inputs $B_1$ and carry, a carry input C0, an output $Q_1$, and a carry output C1. The full adder FA2 has inputs $B_2$ and carry, a carry input C1, an output $Q_2$, and a carry output C2. The full adder FA3 has inputs $B_3$ and carry, a carry input C2, an output $Q_3$, and a carry output C3. The half adder HA2 has an input $B_4$, a carry input C3, an output $Q_4$, and a carry output C4. The half adder HA3 has an input $B_5$, a carry input C4, an output $Q_5$, and a carry output C5. The full adder FA4 has inputs $B_6$ and carry, a carry input C5, an output $Q_6$, and a carry output Q7.

In accordance with the above configuration, the "h+1 bit add p" circuit block adds p=79 to the input binary B if carry='1'.

The circuitry of the full adder FA and the half adder HA is similar to that in FIGS. 9 and 11 and accordingly omitted from the following description.

A consideration is given next to the configuration of the "p-adic to binary" conversion operating circuit using the above-described "h+1 bit add p" circuit block.

Figure 23B:
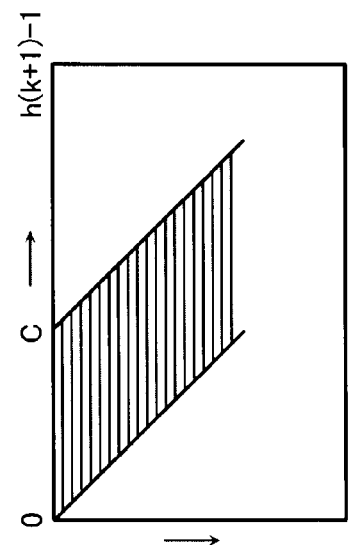
FIG. 23B is a schematic diagram showing the execution sequence of the "X to p" circuit block in the memory system according to the embodiment when converting into binary from p-adic number.
Figure 23A:
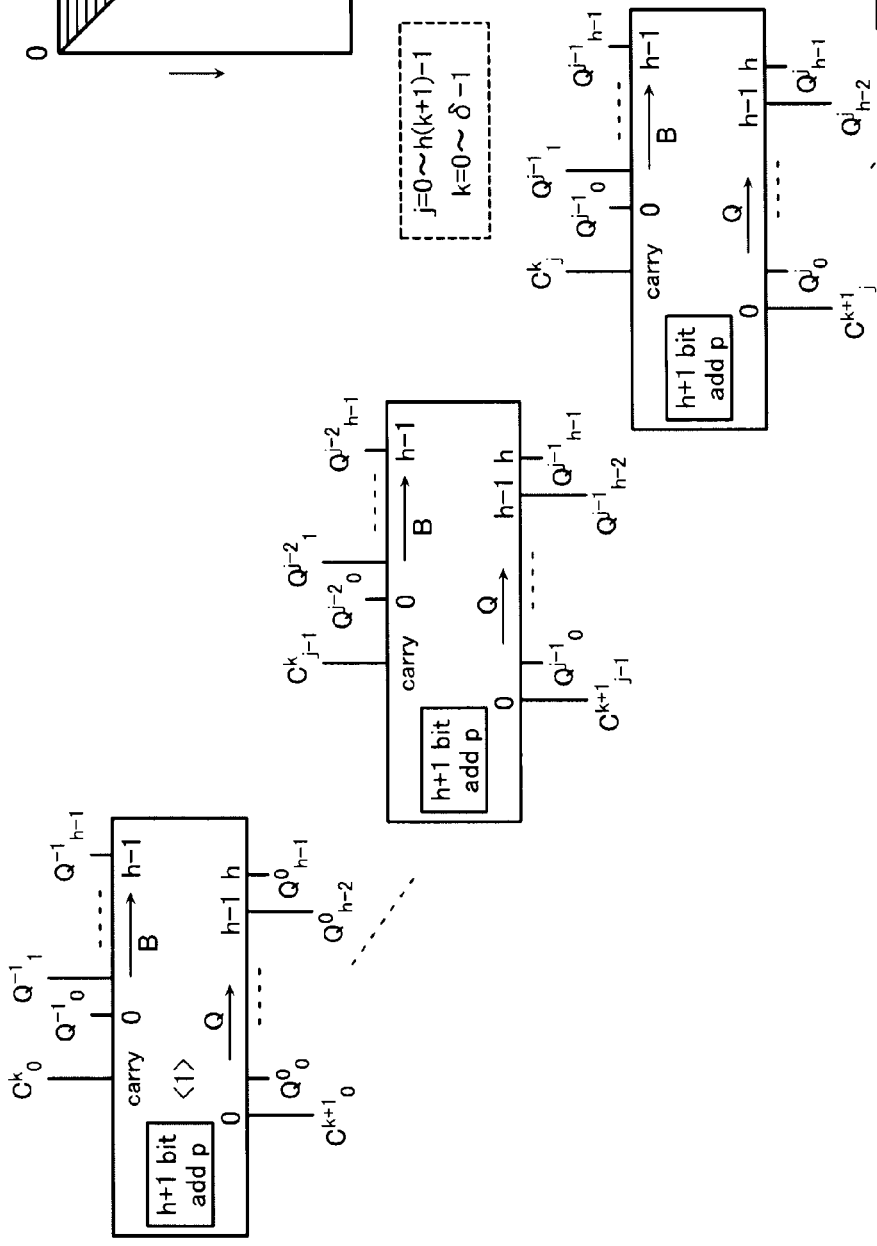
FIG. 23A is a diagram showing the configuration of an "a to X" circuit block in the memory system according to the embodiment.

FIG. 23A shows the circuitry at the k-th step in the "p-adic to binary" conversion operating circuit configured using "h+1 bit add p" circuit blocks.

It is possible to binary-represent data, a coefficient $a_j$ on the digit at the j-th degree in a (δ+1)-digit, p-adic representation. For the purpose of distinguishing the coefficient A of this binary representation from coefficients a on other digits, sub-indexes as shown in Expression 17 are used.

$$a_j = A^j{}_0 + A^j{}_1 2 + A^j{}_2 2^2 + \ldots + A^j{}_{h-3} 2^{h-3} + A^j{}_{h-2} 2^{h-2} + A^j{}_{h-1} 2^{h-1}$$

$$a_j(2^h)^j = A_{hj} 2^{hj} + A_{hj+1} 2^{hj+1} + \ldots + A_{h(j+1)-2} 2^{h(j+1)-2} + A_{h(j+1)-1} 2^{h(j+1)-1}$$

[Expression 17]

The input to the operation at the k-th step, that is, the carry at the previous step (the (k−1)-th step) includes $C^k{}_0$-$C^k{}_{h(k+1)-1}$, the coefficients of a binary number which sub-index is the powers of 2. The number expressed by this binary indicates the number of pieces of $p^{\delta-k}$ contained in the data.

At the k-th step, h(k+1) pieces of "h+1 bit add p" circuit blocks are used in processing as shown in FIG. 23A. Each "h+1 bit add p" circuit block receives 1 carry, and h binaries indicative of a coefficient on 1 digit in a p-adic representation.

The 1st "h+1 bit add p" circuit block <1> receives $C^k{}_0$, $Q^{-1}{}_0$-$Q^{-1}{}_{h-1}$ at the carry and the inputs $B_0$-$B_{h-1}$, and provides $C^{k+1}{}_0$, $Q^0{}_0$-$Q^0{}_{h-1}$ from $Q_0$, $Q_1$-$Q_h$, respectively.

The 2nd "h+1 bit add p" circuit block <2>, not shown, receives $C^k{}_1$, $Q^0{}_0$-$Q^0{}_{h-1}$ at the carry and the inputs $B_0$-$B_{h-1}$, and provides $C^{k+1}{}_1$, $Q^1{}_0$-$Q^1{}_{h-1}$ from $Q_0$, $Q_1$-$Q_h$ respectively.

Thereafter, the "h+1 bit add p" circuit blocks having the similar inputs and outputs are aligned h(k+1) pieces in total as shown in FIG. 23A, and a carry $C^{k+1}{}_0$-$C^{k+1}{}_{h(k+1)-1}$ output from each "h+1 bit add p" circuit block turns to the input at the next step, that is, the (k+1)-th step.

Thus, the conversion of a p-adic number to a binary is executed sequentially from the least significant bit of a carry C as in a schematic diagram shown in FIG. 23B.

FIG. 23A shows the circuitry related to the k-th step as described above. The circuitry shown in FIG. 23A can be used over at each step if each step is processed in time division. In this case, for the purpose of making the input/output of each "h+1 bit add p" circuit block controllable in accordance with simple on/off, h "h+1 bit add p" circuit blocks in the case of k=0 are used as a circuit block with a minimum configuration.

The circuit including the h "h+1 bit add p" circuit blocks thus configured is referred to as an "a to X" circuit block.

Figure 24:
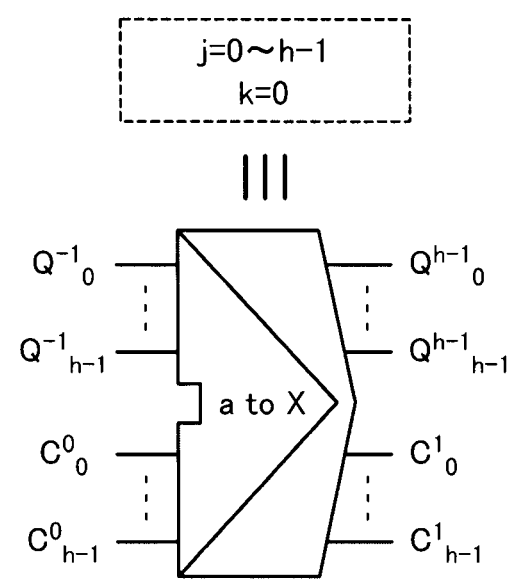
FIG. 24 is a diagram showing a circuit symbol of the "a to X" circuit block in the memory system according to the embodiment.

As shown in FIG. 24, the "a to X" circuit block has the inputs of $Q^{-1}{}_0$-$Q^{-1}{}_{h-1}$ and $C^0{}_0$-$C^0{}_{h-1}$, 2h in number, and the outputs of $Q^{h-1}{}_0$-$Q^{h-1}{}_{h-1}$ and $C^1{}_0$-$C^1{}_{h-1}$, 2h in number.

Next, the above-described "a to X" circuit blocks are used to configure a circuit for 1 step operative to lower the degree of the p-adic number by 1. Hereinafter, the circuit is referred to as the "p to X" circuit block. The "p to X" circuit block can be used in all the computation steps in common.

Figure 25:
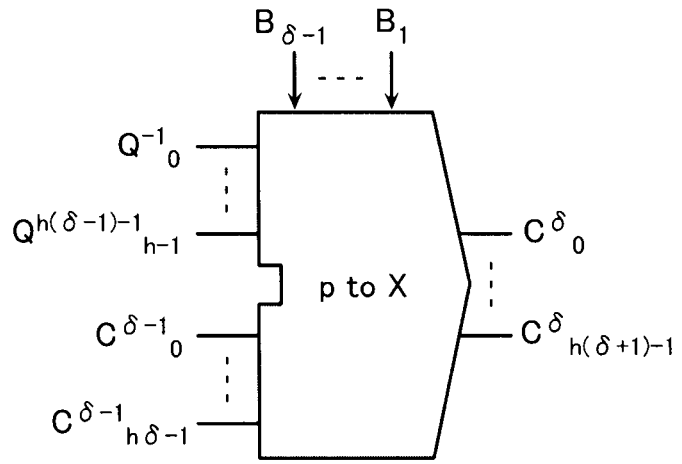
FIG. 25 is a diagram showing a circuit symbol of a "p to X" circuit block in the memory system according to the embodiment.

FIG. 25 is a diagram showing a circuit symbol of the "p to X" circuit block. The "p to X" circuit block is controlled by the timing signals $B_1$-$B_{\delta-1}$ to provide outputs $C^\delta{}_0$-$C^\delta{}_{h(\delta+1)-1}$ in response to inputs $Q^{-1}{}_0$-$Q^{h(\delta-1)-1}{}_{h-1}$, $C^{\delta-1}{}_0$-$C^{\delta-1}{}_{h\delta-1}$.

Figure 26:
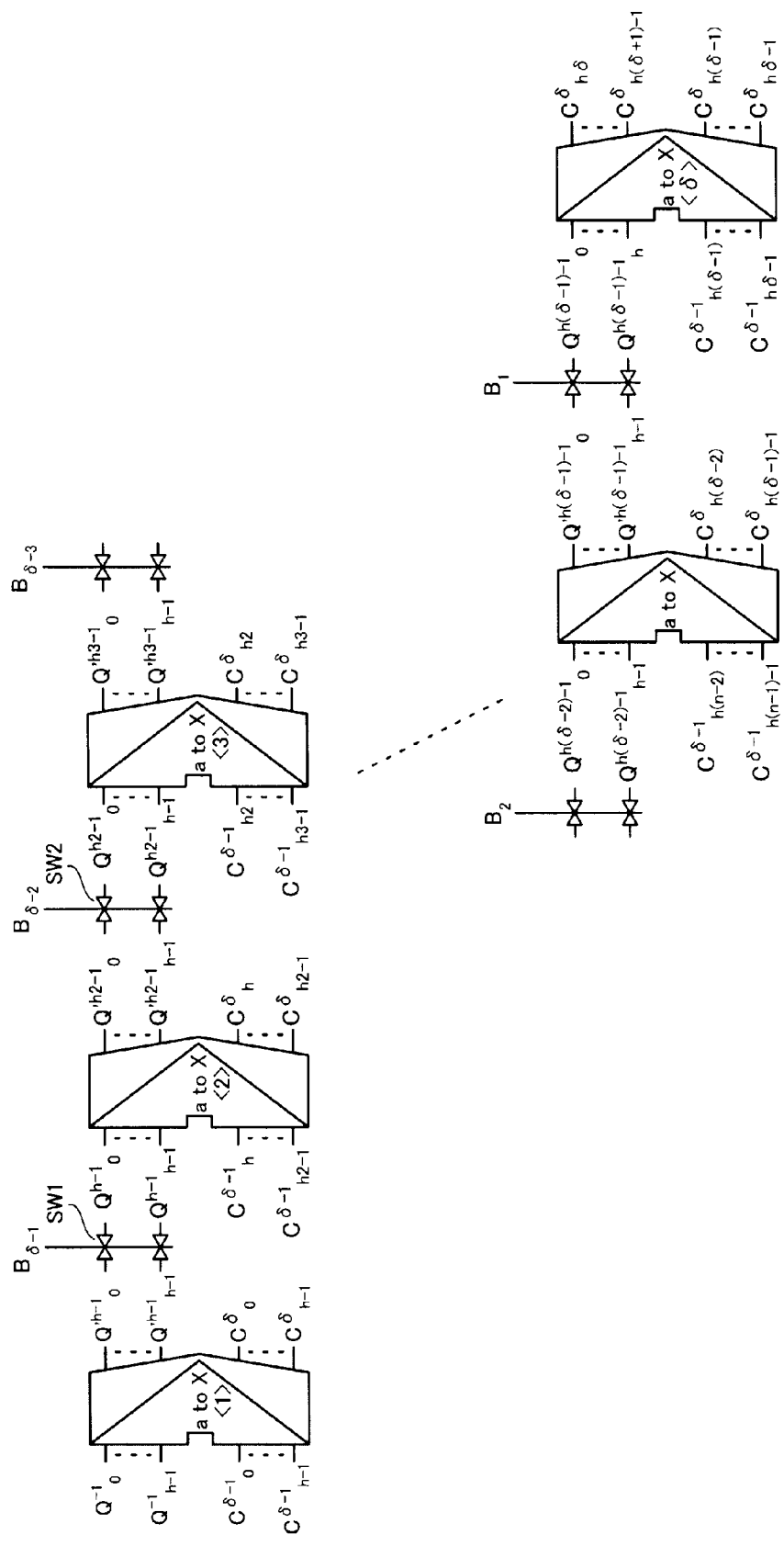
FIG. 26 is a block diagram of the "p to X" circuit block in the memory system according to the embodiment.

FIG. 26 is a block diagram of the "p to X" circuit block.

The "p to X" circuit block comprises δ "a to X" circuit blocks.

The 1st "a to X" circuit block <1> receives part of the inputs to the "p to X" circuit block, that is, $Q^{-1}{}_0$-$Q^{-1}{}_{h-1}$, and $C^{\delta-1}{}_0$-$C^{\delta-1}{}_{h-1}$, and provides $Q'^{h-1}{}_0$-$Q'^{h-1}{}_{h-1}$ and part of the outputs from the "p to X" circuit block, that is, $C^\delta{}_0$-$C^\delta{}_{h-1}$.

The 2nd "a to X" circuit block <2> receives $Q'^{h-1}{}_0$-$Q'^{h-1}{}_{h-1}$ and part of the inputs to the "p to X" circuit block, that is, $C^{\delta-1}{}_h$-$C^{\delta-1}{}_{h2-1}$, and provides $Q'^{h2-1}{}_0$-$Q'^{h2-1}{}_{h-1}$ and part of the outputs from the "p to X" circuit block, that is, $C^\delta{}_h$-$C^\delta{}_{h2-1}$. Among the inputs, $Q'^{h-1}{}_0$-$Q'^{h-1}{}_{h-1}$ are signals fed via the control switches SW1, through which the outputs $Q'^{h-1}{}_0$-$Q'^{h-1}{}_{h-1}$ from the 1st "a to X" circuit block <1> are controlled by the timing signal $B_{\delta-1}$.

The 3rd "a to X" circuit block <3> receives $Q'^{h2-1}{}_0$-$Q'^{h2-1}{}_{h-1}$ and part of the inputs to the "p to X" circuit block, that is, $C^{\delta-1}{}_{h2}$-$C^{\delta-1}{}_{h3-1}$, and provides $Q'^{h3-1}{}_0$-$Q'^{h3-1}{}_{h-1}$ and part of the outputs from the "p to X" circuit block, that is, $C^\delta{}_{h2}$-$C^\delta{}_{h3-1}$. Among the inputs, $Q'^{h2-1}{}_0$-$Q'^{h2-1}{}_{h-1}$ are signals fed via the control switches SW2, through which the outputs $Q'^{h2-1}{}_0$-$Q'^{h2-1}{}_{h-1}$ from the 2nd "a to X" circuit block are controlled by the timing signal $B_{\delta-2}$.

Thereafter, similar connections will be made up to the δ-th "a to X" circuit block <δ>.

The inputs and outputs of the "a to X" circuit block are connected via the control switches SW in this way, because the connection of the input is switched between the external input and the internal input at every computation step, and for the purpose of preventing the output from the internal circuit from interfering in the case of the external input.

In the case of the circuitry of FIG. 26, all the control switches SW are turned off at the timing when only the timing signal $B_0$ is at '1', thereby activating only the last "a to X" circuit block <δ>. This corresponds to the 0-th step.

Subsequently, when the timing signal $B_1$ also turns to '1', the (δ−1)-th "a to X" circuit block <δ−1> is activated additionally. This corresponds to the 1st step.

Thereafter, at every sequential rise of the timing signals $B_2$-$B_{\delta-1}$, the "a to X" circuit block required at each step is activated.

The following description is given to the core part of the $2^h$-adic converter circuit, that is, the "binary" circuit block.

Figure 27:
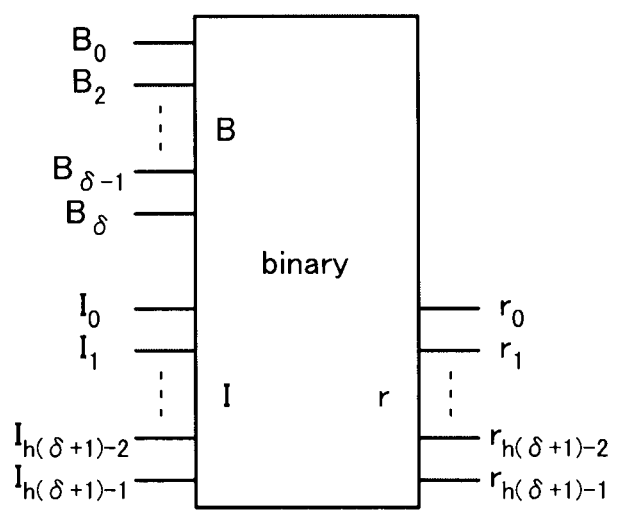
FIG. 27 is a diagram showing a circuit symbol of a "binary" circuit block in the memory system according to the embodiment.

FIG. 27 shows a circuit symbol of the "binary" circuit block.

As shown in FIG. 27, the "binary" circuit block receives $B_0$-$B_\delta$, $I_0$-$I_{h(\delta+1)-1}$, and provides $r_0$-$r_{h(\delta+1)-1}$.

Figure 28:
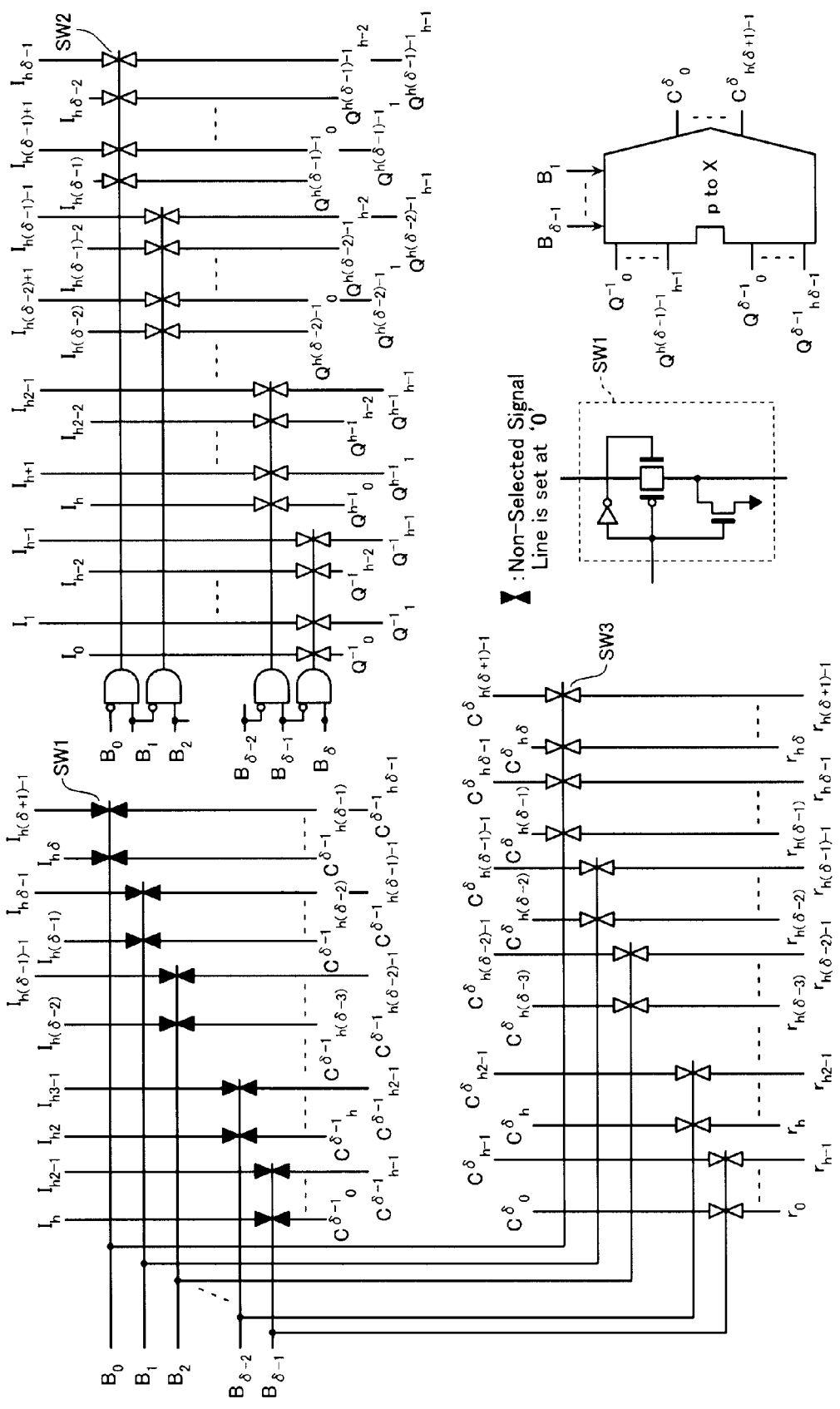
FIG. 28 is a block diagram of the "binary" circuit block in the memory system according to the embodiment.

FIG. 28 is a block diagram of the "binary" circuit block. The "binary" circuit block includes the "p to X" circuit block in the circuitry for 1 step, and additionally the control switch SW for use in control of the input/output of the "p to X" circuit block.

Specifically, the inputs $I_h$-$I_{h(\delta+1)-1}$ are fed as $C^{\delta-1}{}_0$-$C^{\delta-1}{}_{h\delta-1}$ to the "p to X" circuit block via the control switches SW1. These δ pieces of control switches SW1 are controlled by the timing signals $B_1$-$B_{\delta-1}$. Therefore, the control switches SW1 pass $I_h$-$I_{h(\delta+1)-1}$ directly as $C^{\delta-1}{}_0$-$C^{\delta-1}{}_{h\delta-1}$ if B='1' and keep the outputs at '0' independent of the inputs if B='0'.

In addition, the input $I_0$-$I_{h\delta-1}$ are fed as $Q^{-1}{}_0$-$Q^{h(\delta-1)-1}{}_{h-1}$ to the "p to X" circuit block via the control switches SW2, respectively. These δ pieces of control switches SW2 are controlled in accordance with $B_\delta \square B_{\delta-1}$ to $B_1 \square B_0$, respectively. Therefore, the control switch SW2 located between $I_0$ and $Q^{-1}{}_0$ passes $I_0$ directly as $Q^{-1}{}_0$ only if $B_\delta$='1', $B_{\delta-1}$='0'.

The outputs $C^\delta{}_0$-$C^\delta{}_{h(\delta+1)-1}$ from the "p to X" circuit block turn to $r_0$-$r_{h(\delta+1)-1}$, that is, the outputs from the "binary" circuit block via the control switches SW3. These control switches SW3 are controlled by the timing signals $B_{\delta-1}$-$B_0$. Therefore, the control switches SW3 pass $C^\delta{}_0$-$C^\delta{}_{h(\delta+1)-1}$ directly as $r_0$-$r_{h(\delta+1)-1}$ if B='1'.

In accordance with the above circuitry, the "p to X" circuit block responds to each computation step while increasing the bit widths of the input and output h-bit by h-bit sequentially. While taking the numerals A on the digits of the p-adic number from the upper digit sequentially at each computation step, and when all the computation steps are completed, a binary representation of data can be obtained.

As described earlier, the timing signals $B_0$-$B_\delta$ are the signals that rise in order. In accordance therewith, the paths to the inputs I and outputs r conduct h-bit by h-bit from the upper bit.

The numeral A on each digit of the p-adic number is initially set in the later-described external "A-r" register, and fed to the "A-r" register via the control switch SW3 on/off-controlled by the signal logically operated with the adjacent timing signal B, such that the path switches selectively, until the flow enters the next computation step.

The following description is given to the "p-adic to binary" conversion operating circuit including the above-described circuits grouped together.

Figure 29:
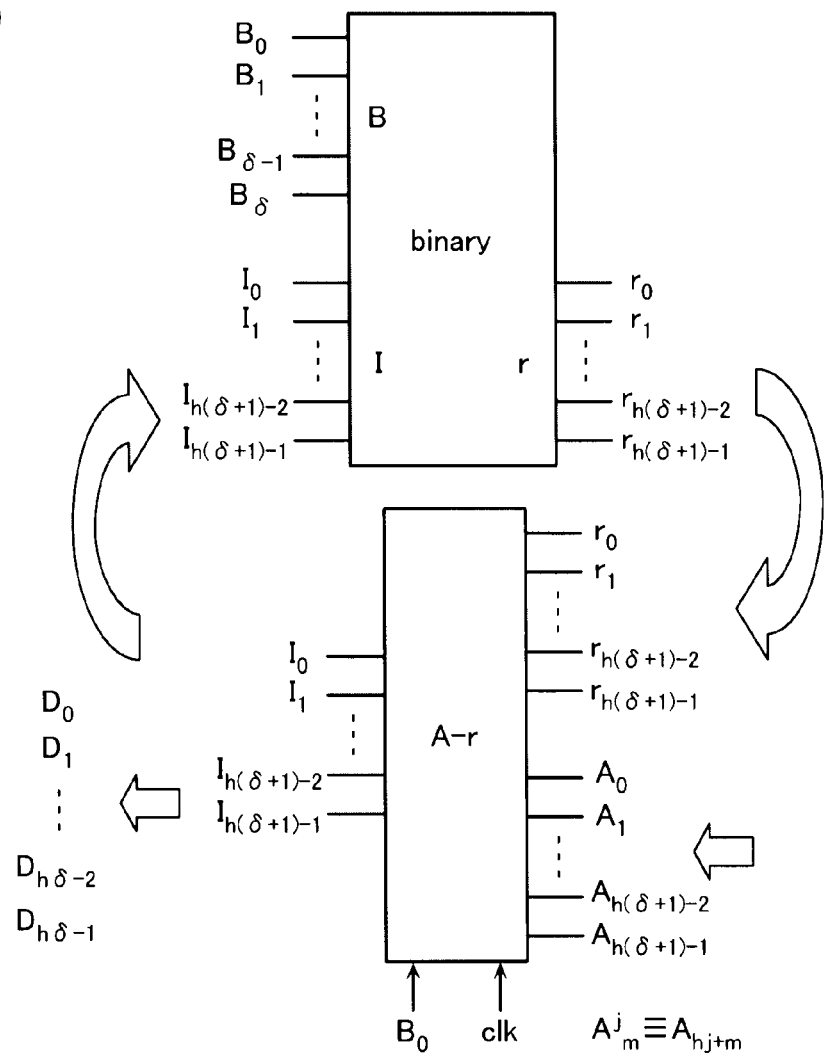
FIG. 29 is a block diagram of a "p-adic to binary" conversion operating circuit in the memory system according to the embodiment.

FIG. 29 is a block diagram of the "p-adic to binary" conversion operating circuit. The "p-adic to binary" conversion operating circuit includes the "binary" circuit block and the "A-r" register coupled thereto.

The "A-r" register is a register controlled by the timing signal $B_0$ and the clock clk and having the inputs $r_0$-$r_{h(\delta+1)-1}$, $A_0$-$A_{h(\delta+1)-1}$ and the outputs $I_0$-$I_{h(\delta+1)-1}$ as shown in FIG. 29.

Figure 30:
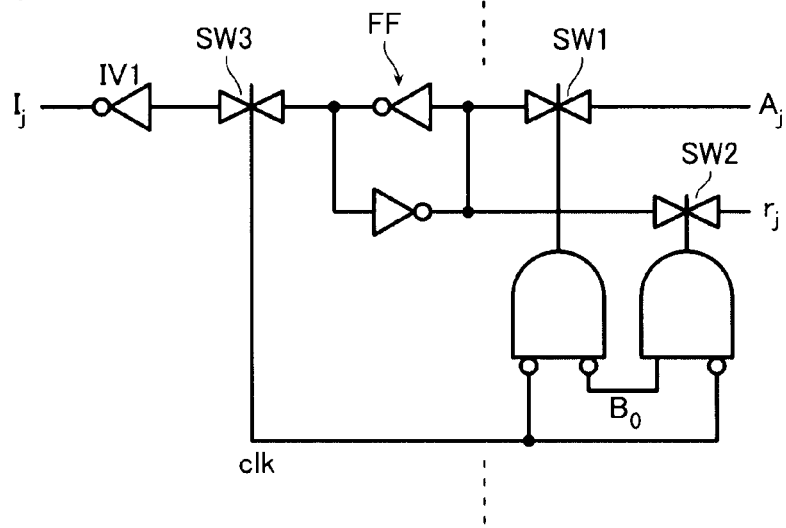
FIG. 30 is a circuit diagram of an "A-r" register in the memory system according to the embodiment.

FIG. 30 is a circuit diagram of the "A-r" register.

The "A-r" register includes, at every bit, a flip-flop FF composed of 2 inverters. The flip-flop FF receives $A_j$ (j=0 to h($\delta$+1)−1) via the control switch SW1 and receives $r_j$ via the control switch SW2. On the other hand, the output of the flip-flop FF is connected to an inverter IV1 via the control switch SW3. The output from the inverter IV1 provides $I_j$.

The control switches SW1-SW3 are controlled by the timing signal $B_0$ and the clock clk. Specifically, the control switch SW1 turns on if /clk□/B0='1', the control switch SW2 if /clk□B0='1, and the control switch SW3 if clk='1, respectively.

The initial state of the "A-r" register includes the digits $A_0$-$A_{h(\delta+1)-1}$ of the p-adic number.

Thereafter, after the timing signal $B_0$ rises, $r_j$ taken in sync with the fall of the clock clk is provided as $I_j$ in sync with the rise of the clock clk.

The "A-r" register couples with the "binary" circuit block to advance the computation step at every timing signal $B_j$. The state of variations in each clock is similar to FIG. 18. The clock clk is used to generate ck and further generate the timing signal $B_j$.

After completion of all the computation steps, the "A-r" register holds a binary representation $D_j$ of the input, that is, the p-adic number A.

Although various cases are compared with each other later, in the system using an actual prime p, the number of computation steps is equal to or below 10, and the number of the "h+1 bit mod p" circuit blocks contained in the "binary" circuit block is equal to or below 50.

[Timing Signal Generator Circuit]

The following description is given to a timing signal generator circuit operative to generate clocks and so forth for use in time-division control of the "binary to p-adic" conversion operating circuit and the "p-adic to binary" conversion operating circuit.

First, the operational concept of the timing signal generator circuit is described.

The timing signal generator circuit is a circuit including later-described unit circuits sequentially connected to generate the steps required at the minimum in accordance with the number of the unit circuits.

Figure 31:
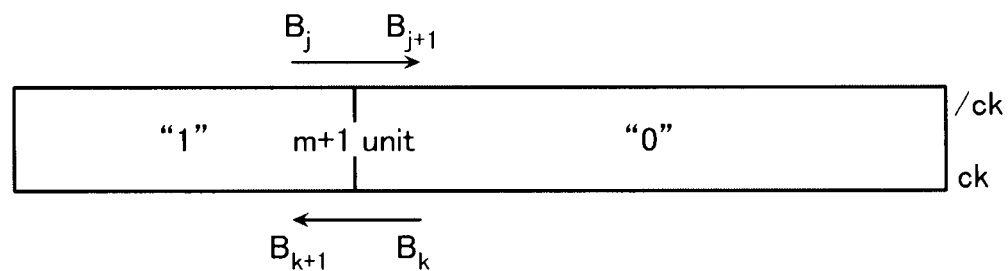
FIG. 31 is an operating conceptual view of a timing signal generator circuit in the memory system according to the embodiment.

FIG. 31 is an operational concept view of the timing signal generator circuit.

The timing signal generator circuit uses the clock ck to shift the state of the unit circuit in the state of '1' to generate the timing signal B at the boundary between the '1' state and the '0' state.

Figure 32:
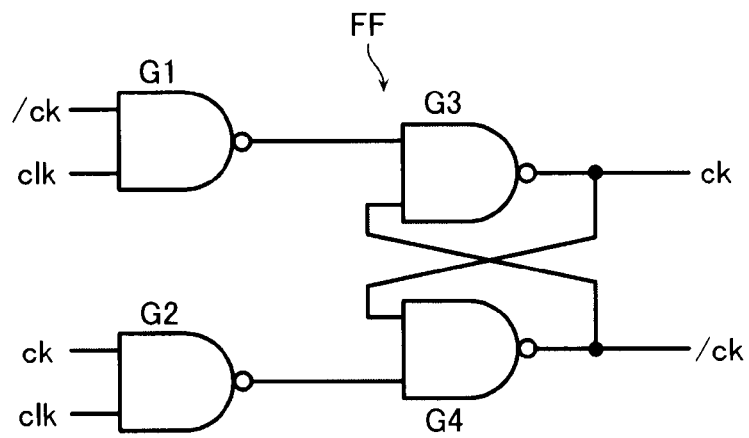
FIG. 32 is a circuit diagram of a flip-flop circuit operative to generate clocks in the memory system according to the embodiment.

The clocks ck and /ck toggled at the rise of the clock clk are generated from the clock clk at a flip-flop circuit FF shown in FIG. 32. In a word, the flip-flop circuit FF includes a NAND gate G1 operative to receive /ck and clk, a NAND gate G2 operative to receive ck and clk, a NAND gate G3 operative to receive the output from the NAND gate G1 on one input, and a NAND gate G4 operative to receive the output from the NAND gate G2 on one input. The other input of the NAND gate G3 and the other input of the NAND gate G4 are connected to the output of the NAND gate G4 and the output of the NAND gate G3, respectively.

As shown in FIG. 31, the boundary in the flip-flop circuit FF shifts rightward at every variation of the clock ck and, when it reaches the right end, it shifts leftward after reflected therefrom. When the boundary in the flip-flop circuit FF reaches the left end, it shifts rightward after reflected therefrom. Thereafter, the boundary shifts rightward and leftward repeatedly. With such the operation, the boundary in the flip-flop circuit FF, if it is regarded as the output of the timing signal B, can be used to generate such timing signals B that rise with delays of the cycle of the clock ck as shown in FIG. 18.

Figure 33:
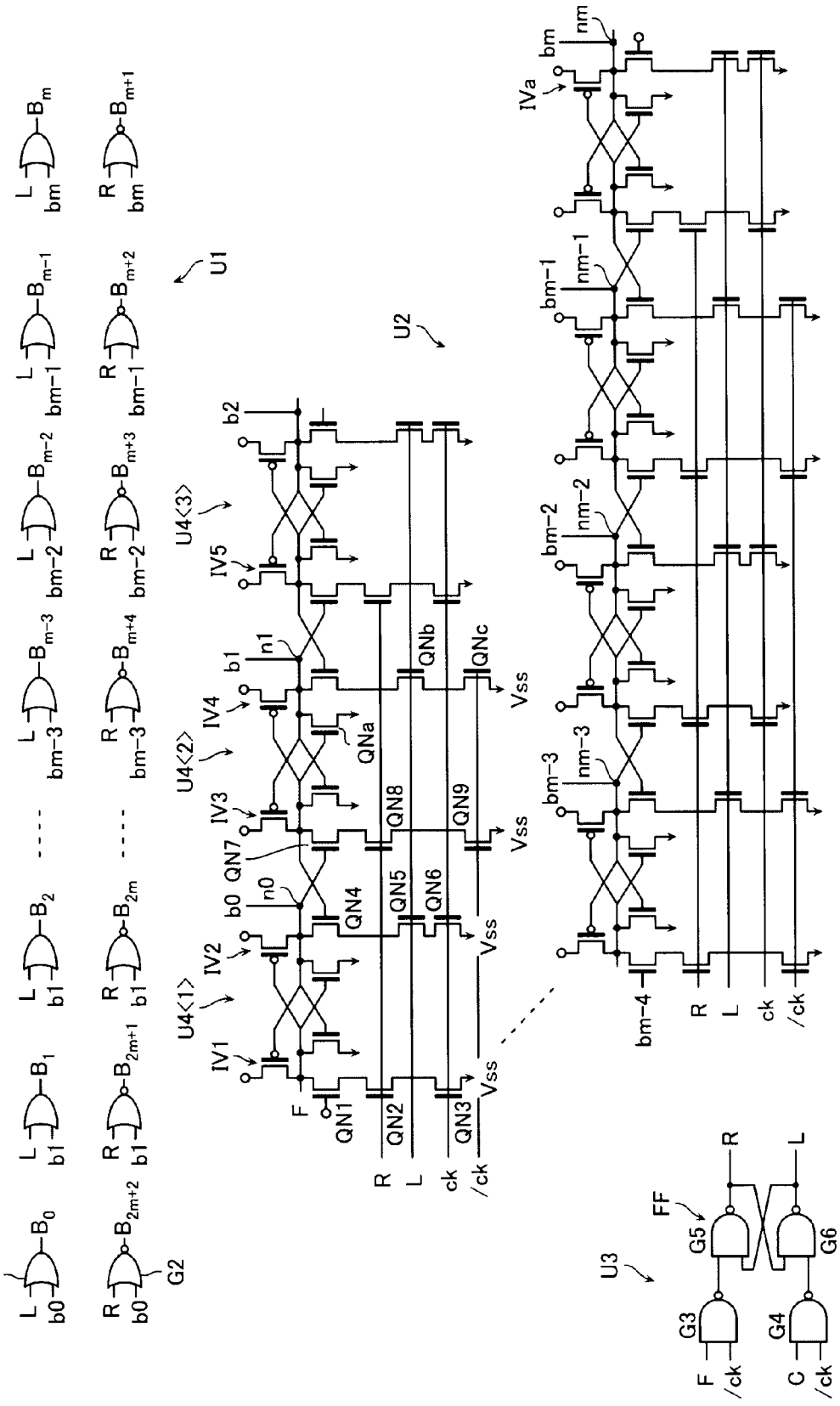
FIG. 33 is a circuit diagram of the timing signal generator circuit in the memory system according to the embodiment.

Subsequently, FIG. 33 illustrates an example of detailed circuitry of the timing signal generator circuit block.

The timing signal generator circuit block comprises a timing signal generator unit U1 operative to generate timing signals $B_0$-$B_{2m+2}$ from the boundary signals b0-bm output from nodes n between unit circuits; a boundary signal generator unit U2 including unit circuits connected; and a shift direction generator unit U3 operative to generate signals R and L capable of determining the shift direction of the state of the unit circuit.

The timing signal generator unit U1 includes (m+1) OR gates G1 operative to receive L and bj (j=0−m) and provide $B_j$, and (m+1) NOR gates G2 operative to receive R and bj and provide $B_k$ (k=2m+1 to m+1).

The boundary signal generator unit U2 comprises plural unit circuits as shown in FIG. 33.

Each unit circuit U4 includes 2 cross-coupled inverters, and 6 NMOS transistors for transmitting the state of the unit circuit U4 to an adjacent unit circuit U4.

Specifically, the 1st unit circuit U4<1>, for example, includes cross-coupled inverters IV1 and IV2.

Among those, the inverter IV1 includes 3 NMOS transistors QN1-QN3 serially connected between the output node thereof and the Vss terminal. These transistors QN1, QN2, QN3 are controlled by 'H' (normally on), the signal R, and the clock ck, respectively.

On the other hand, the inverter IV2 includes 3 NMOS transistors QN4-QN6 serially connected between the output node thereof and the Vss terminal. These transistors QN4, QN5, QN6 are controlled by the output from an inverter IV3 in an adjacent unit circuit U4<2>, the signal L, and the clock ck, respectively.

The 2nd unit circuit U4<2> includes cross-coupled inverters IV3 and IV4.

Among those, the inverter IV3 includes 3 NMOS transistors QN7-QN9 serially connected between the output node thereof and the Vss terminal. These transistors QN7, QN8, QN9 are controlled by the output from the inverter IV2 in the adjacent unit circuit U4<1>, the signal L, and the clock /ck, respectively.

On the other hand, the inverter IV4 includes 3 NMOS transistors QNa-QNc serially connected between the output node thereof and the Vss terminal. These transistors QNa, QNb, QNc are controlled by the output from an inverter IV5 in an adjacent 3rd unit circuit U4<3>, the signal L, and the clock /ck, respectively.

The remaining configuration includes similar unit circuits to the 1st unit circuit U4<1> and the 2nd unit circuit U4<2> alternately connected.

With this configuration, the nodes n between the unit circuits U4 provide the boundary signals b0-bm. In addition, the output from the first inverter IV1 provides a signal F, and the last inverter IVa provides a signal C.

The shift direction generator unit U3 comprises a flip-flop circuit FF as shown in FIG. 33. In a word, the shift direction generator unit U3 includes a NAND gate G3 operative to receive F and /ck, a NAND gate G4 operative to receive C and /ck, a NAND gate G5 operative to receive the output from the NAND gate G3 on one input, and a NAND gate G146 operative to receive the output from the NAND gate G144 on one input. The other input of the NAND gate G5 and the other input of the NAND gate G6 are connected to the output of the NAND gate G5 and the output of the NAND gate G6, respectively.

The shift direction generator unit U3 generates the signals R and L capable of determining the shift direction of the state in accordance with the signals F and C from the node n0 and nm on the both sides of the boundary signal generator unit U2.

The above-described circuit is possible to configure the door that can come and go between the "binary world" and the "p-adic Zp world".

[Overview of Lee Metric Code]

Next, data processing in the "p-adic Zp world" is described. Here, each digit in a code is referred as a "code word symbol".

A code word symbol c is an integer shown in Expression 18.

$$c \in GF(p) = Zp,\ 0 \le c < p \quad \text{[Expression 18]}$$

When Lee metrics of these integers are denoted with |c|, and all Lee metrics |c| are represented by integers of p/2 or below, the Lee metrics |c| can be defined as in Expression 19.

$$0 \le c < \frac{p}{2}:\ |c| = c \quad \text{[Expression 19]}$$
$$\frac{p}{2} < c < p:\ |c| = p - c$$

As the code C can be considered a row of n(=p−1) code word symbols c, it can be represented by $C=(c_1, c_2, \ldots, c_n)$ as shown in FIG. 1, and a metric w(C) of the code C can be defined as the sum of Lee metrics |c| of the code word symbols c as in Expression 20.

$$w(C) = |c_1| + |c_2| + \ldots + |c_n| \quad \text{[Expression 20]}$$

The distance between codes can be defined by the sum of Lee metrics of differences between the code word symbols corresponding to the code. Here, a difference between 2 codes C and Y (Lee distance), $d_L(C, Y)$, is given as Expression 21.

$$d_L(C,Y) = w(C-Y) \quad \text{[Expression 21]}$$

Further, the minimum Lee distance of the code C can be defined by the minimum metric of the metric w(C) of the code C as shown in Expression 22.

$$d_L(C) = \min w(C) \quad \text{[Expression 22]}$$

In this case, the Lee metric code is such a code that has the minimum distance of 2γ between codes having a generator matrix G and a syndrome matrix H shown in Expression 23 and that can correct (γ−1) or lower Lee metric errors.

$$G = \begin{bmatrix} 1 & 2 & \ldots & (p-1) \\ 1^2 & 2^2 & \ldots & (p-1)^2 \\ \vdots & \vdots & \ddots & \vdots \\ 1^k & 2^k & \ldots & (p-1)^k \end{bmatrix}, \quad \text{[Expression 23]}$$

$$H = \begin{bmatrix} 1 & 2 & \ldots & (p-1) \\ 1^1 & 2^1 & \ldots & (p-1)^1 \\ \vdots & \vdots & \ddots & \vdots \\ 1^{\gamma-1} & 2^{\gamma-1} & \ldots & (p-1)^{\gamma-1} \end{bmatrix}$$

Here, when the number of symbols in the code C is denoted with n and the number of symbols in the data word D is denoted with k, then γ=n−k where γ represents the number of redundant symbols contained in the code C.

For the purpose of generating the Lee metric code thus configured, the input-converted data, that is, numerals on the digits in a k-digit, p-adic number are regarded as numerals in Zp, which are used as a data word X of the Lee metric code, thereby obtaining a code expression through an operation C=XG based on the generator matrix G. The obtained code word is stored in the memory. Information about the error caused on the stored numeral in Zp is used as a data word Y of the Lee metric code read out of the memory to obtain a syndrome through an operation S=YH$^t$ (H$^t$ is a transpose of H) so that the position and quantity of the error can be computed to correct the error.

Next, for the purpose of indicating memory cells optimal to store the Lee metric code, the conditions on the relations between the quantities caused on the Lee metric code are collected.

The Lee metric code in Zp, which is δ-digit, $2^h$-adic data in the "binary world", can be used to create a code from (δ+1) pieces of code data as in Expression 24 where the word length of the code is denoted with n, that is, $C=(c_1, c_2, \ldots, c_n)$; the word length of data is denoted with k; and the maximum value of the error-correctable Lee metric is denoted with ε=γ−1.

$$n=p-1,\ d_L(C) \ge 2\gamma,\ k=n-\gamma,\ k=\kappa+\delta+1 \quad \text{[Expression 24]}$$

Namely, k=δ+1 corresponds to the maximum word length of data in the Lee metric code.

The selection of the prime p is determined so as to provide δ+1=k, and further as k=n−γ=p−1−ε−1=p−ε−2, Expression 25 provides the condition satisfied by the prime p.

$$\delta + \epsilon + 3 = p \quad \text{[Expression 25]}$$

The conditions on the prime p are grouped here. The condition on selecting M and p is shown in Expression 26 based on δh=M and Expression 25 where the total number of Lee metrics of correctable errors is denoted with ε, and the number of data bits ECC-processed in batch in the "binary world" is denoted with M.

$$2^{h-1} < p < 2^h \cap M = h(p-\epsilon-3) \quad \text{[Expression 26]}$$

In this case, the code in Zp has a redundant word length of γ=ε+1=n−k=n−(δ+1) from the data. Accordingly, the number of digits, δ, of data as a $2^h$-adic number in the "binary world" and the number of code words, n, in the "p-adic Zp world" establish a relation therebetween as in Expression 27.

$$n - \delta = \gamma + 1 = \epsilon + 2 \quad \text{[Expression 27]}$$

[p-adic Cell]

The following description is given to memory cells used to store each code $c_j$ in the Lee metric code $C=(c_1, c_2, \ldots, c_n)$ in the "p-adic Zp world".

If a memory cell can set plural physical quantity values per cell and the quantities physically form an ordered set, such the memory cell is referred to as a "p-adic cell".

Available examples of the p-adic cell include a memory cell that uses plural thresholds of a MOS transistor as the physical quantities; a memory cell that uses plural resistances of a variable resistance element as the physical quantities; a memory cell that uses the numbers of held flux quanta as the physical quantities; and a memory cell that uses the quantities of trapped charge as the physical quantities. In a word, any memory cell is sufficient if it can hold a certain physical quantity as an element in a quantity-setting ordered set. Hereinafter, the order of the physical quantity is referred to as the "level".

After the levels of such the memory cell are assigned to the elements in Zp, the memory cell is turned to the p-adic cell.

Figure 34:
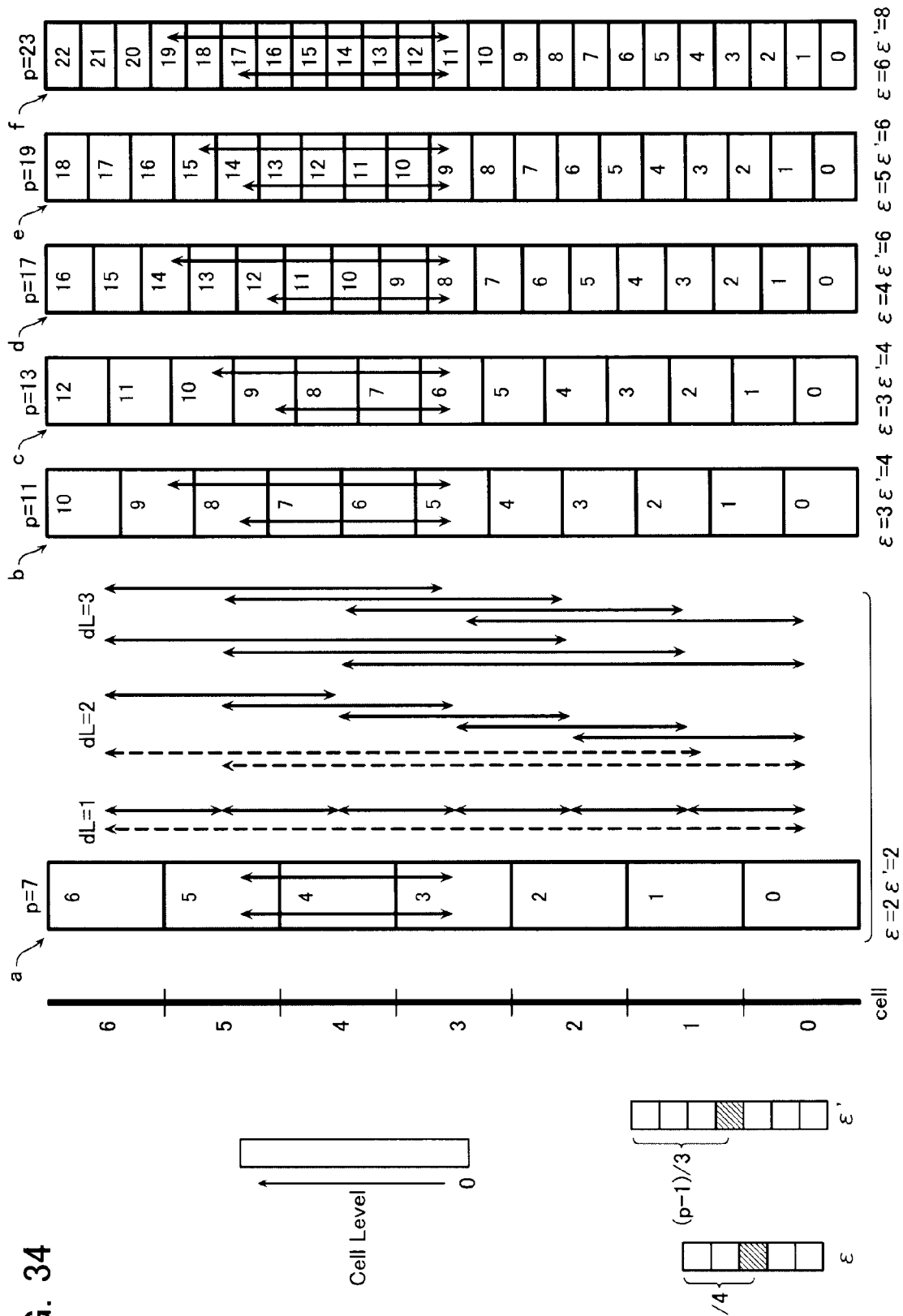
FIG. 34 is a diagram showing an example of assignment of Zp to p-adic cells in the memory system according to the embodiment.

An example of assignment of Zp to the p-adic cell is shown in FIG. 34. This example relates to one memory cell in which the same levels as the number of representations of Zp are set thereto, and the levels are assigned to the representations. In a word, the p-adic cell, that is, a cell unit comprises a single memory cell.

FIG. 34($a$)-($f$) shows examples in the case of the prime p=7, 11, 13, 17, 19, 23. The order of the physical quantity is divided into p pieces, and the resultant divisions are assigned to Zp.

A memory cell operates with fail as an error between order-closer levels with a high possibility. Accordingly, one with a closer Lee metric is assigned to one with a closer level order. This assignment makes the order of the levels as the physical quantities match the order of the representations of Zp inevitably. As the order of Zp is cyclic, there are p ways of assigning the order to a single memory cell. The example shown in FIG. 34 relates to the assignment of the lowermost level to 0. If the cell levels, which can hold the order by the Lee metrics of Zp, correspond to the representations of Zp, it is also possible to utilize other assignments than those shown in FIG. 34. Even if the way of assigning changes at every memory cell, the consistency of the Lee metric code viewed from outside the cell array can be maintained.

The variation in Lee metric due to the variation in level is detailed in the case of p=7 shown in FIG. 34($a$). The quantity of variation is denoted with dL=1, 2, 3, and the leap of the corresponding level is indicated with the arrow. In any case, the number in the case of the corresponding level variation is for p=7.

Note that the quantity of variation in Lee metric cannot become higher than (p−1)/2. As the order of Zp is cyclic, even if a failed operation with a large leap as shown with the dashed line as the arrow at dL=1 or 2 occurs, such a operation has a low possibility.

FIG. 34($a$)-($f$) shows a typical level variation for each p as the quantity of variation in Lee metric in the case of $\epsilon$=(p−1)/4 and in the case of $\epsilon'$=(p−1)/3. The variation in Lee metric as a failed operation on the physical level has almost the same quantity for any prime p at $\epsilon$ and $\epsilon'$. Therefore, a larger p given to the memory cell that uses the same physical quantity increases the code error and requires a larger error correctable quantity.

Next, a method of reading from the p-adic cell is described with reference to FIG. 35.

In the definition of words, "divisionally serial-applying bias" refers to changing the bias in turn in accordance with the level of the memory cell.

$\Delta\Sigma$ modulation (Delta-Sigma Modulation) and so forth can be used to directly sense the physical quantity of the cell level as can be considered. In consideration of write and verify for memory cells, though, the bias given to the memory cell is divisionally serial-applied, and compared with the reference physical quantity Iref to sense which level of bias exceeds Iref. Such a sensing method is described here by way of example.

Figure 35:
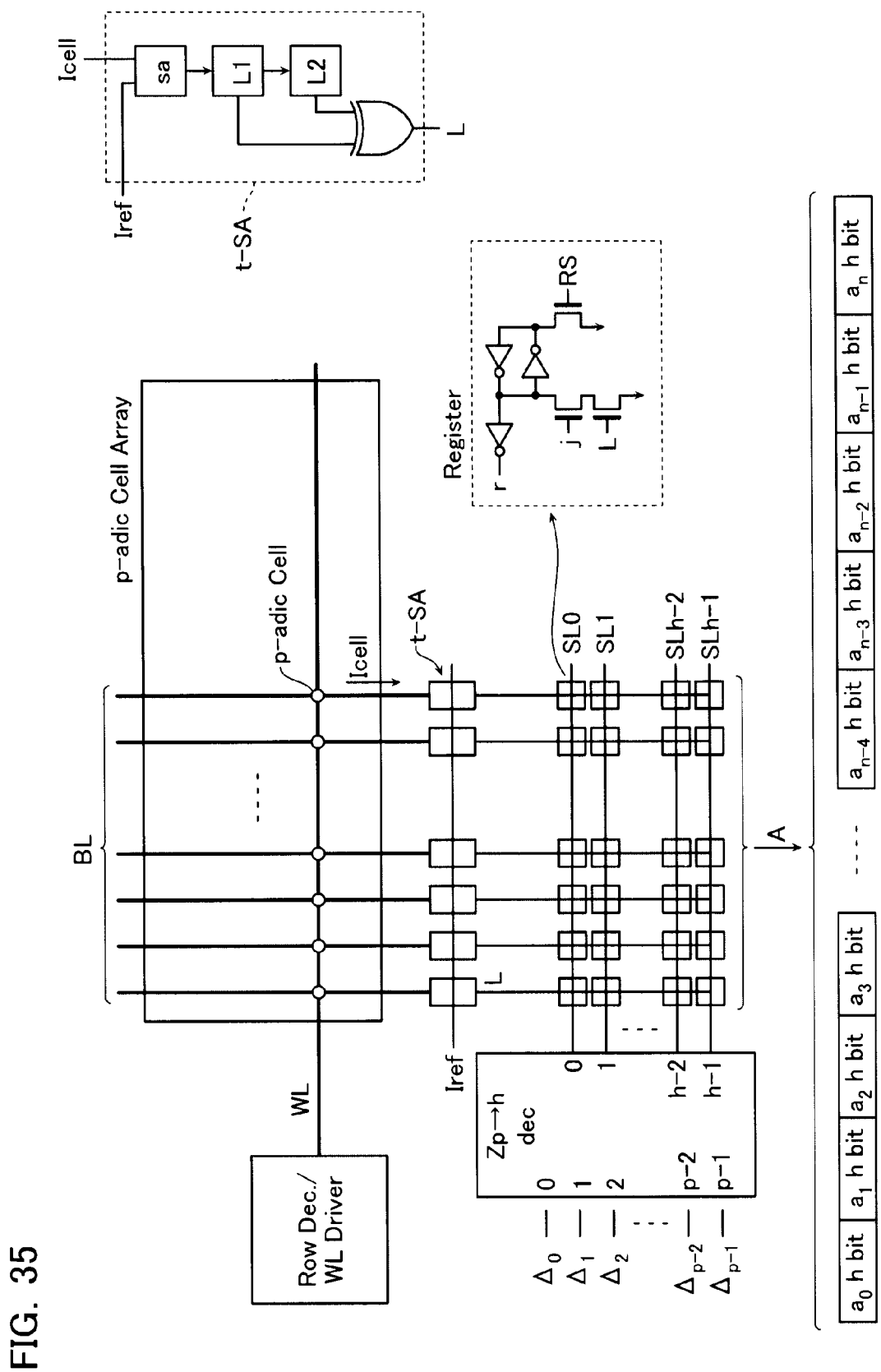
FIG. 35 is a diagram illustrative of a method of reading from p-adic cells in the memory system according to the embodiment.

FIG. 35 is a block diagram required for reading from the p-adic cell.

FIG. 35 shows a p-adic cell array including p-adic cells aligned in array. It also shows a sense amp unit t-SA operative to compare the physical quantity read out of the p-adic cell with Iref, a register operative to hold the data read out of the p-adic cell based on the t-SA result, a "Zp→h dec" circuit block operative to selectively connect the sense amp unit t-SA with the register, and a row decoder/word line driver, which are contained in a code read unit.

In the p-adic cell array, the p-adic cells used to store the codes $a_j$ of data A=($a_1, a_2, \ldots, a_n$) in Zp are accessed at the same time. As this access method, a conventional method using word lines WL and bit lines BL is assumed, and bias is applied to the p-adic cells arranged on cross-points of 1 word line WL and plural bit lines BL. This bias is a voltage, a current or another physical quantity, which is caused on the bit line BL as the physical quantity comparable with Iref using the sense amp unit t-SA.

The row decoder/word line driver (Row Dec./WL Driver) arranged at one end of the word line WL is used to select a word line WL and divisionally serial-apply bias required for read to the word line WL. The divisions of the bias at this time are in p stages.

The row decoder/word line driver in the code read unit is used at the time of code write as part of the code write unit to divisionally serial-apply bias required for code write to the selected word line WL. The divisions of the bias at this time are in (p−1) stages.

The sense amp unit t-SA is a circuit operative to compare Iref with the physical quantity Icell from the p-adic cell. The sense amp unit t-SA compares Icell with Iref at a sense amp sa, as shown in FIG. 35, then saves the previous comparison result into a latch L2, and overwrites and holds the present comparison result in a latch L1.

The output from the sense amp unit t-SA provides '1' as the signal L only when the contents of data in the latches L1 and L2 are different from each other. Namely, only when the serial cycle first reverses the relation of the orders between Iref and Icell while Icell varies in accordance with the order, the output L turns to '1'. The latches L1 and L2 are prepared to have the same initial value so that a correct sense output can be obtained at the first time of the change between Iref and Icell.

The "Zp→h dec" circuit block receives signals $\Delta 0, \Delta 1, \ldots, \Delta p-2, \Delta p-1$ for use in control of the bias divisionally serial-applied and, in accordance with the inputs, activates h-bit selection lines $SL_0$ to $SL_{h-1}$ designative of selection registers. The outputs of the sense amp units t-SA corresponding to n p-adic cells selected at the same time by the word line WL are each selectively connected to h registers. The "Zp→h dec" circuit block associates the sense amp units t-SA to the registers through the selection lines $SL_0$ to $SL_{h-1}$ activated in accordance with the signals $\Delta 0, \Delta 1, \ldots, \Delta p-2, \Delta p-1$.

The register resets the content, that is, turns it to '0' on receipt of the signal RS and replaces the content by '1' when the signal j and the signal L output from the sense amp unit t-SA both turn to '1'.

In the configuration as above, reading from the p-adic cell is as follows.

Before reading, the registers have an initial value of '0'.

It is assumed here that sensing is executed in turn from the level 0, and the output L from the sense amp unit t-SA turns to '1' at the step of the level j. At the same time, the "Zp→h dec"

circuit block receives an activated signal $\Delta_j$ at the step of the level j so that the "Zp→h dec" circuit block converts j into an h-bit binary to activate the corresponding selection line SL.

As a result, the signals L and j both turn to '1' so that the content in the corresponding register can be rewritten to '1'.

Through the above operation, when all steps to the p-adic cell finish, the binary indication A of the elements in Zp stored in the p-adic cell is held in the registers. The A held in the registers are subject to operation processing in the "p-adic Zp world".

The above description is given to the case where the representation of Zp uses 1 p-adic cell. If a memory cell has a lower number of levels than the selection-desired prime p, the use of p-adic cells in a pair can increase the number of levels. Hereinafter, such the p-adic cells used in a pair may also be referred to as "pair p-adic cells" (a cell unit).

A method of representing Zp with the pair p-adic cells is described.

If it is possible to set n levels in a single p-adic cell, the use of such p-adic cells in a pair makes it possible to set $n^2$ levels. If the number of levels is associated with the prime p, the allowable prime is in the form of $p=n^2-2$, $n^2-3$, $n^2-5$ and so forth under the condition that p is smaller than $n^2$ and cannot be factorized.

A prime p is considered here, which can effectively utilize the most of the levels of the pair p-adic cells.

Figures 36, 37:
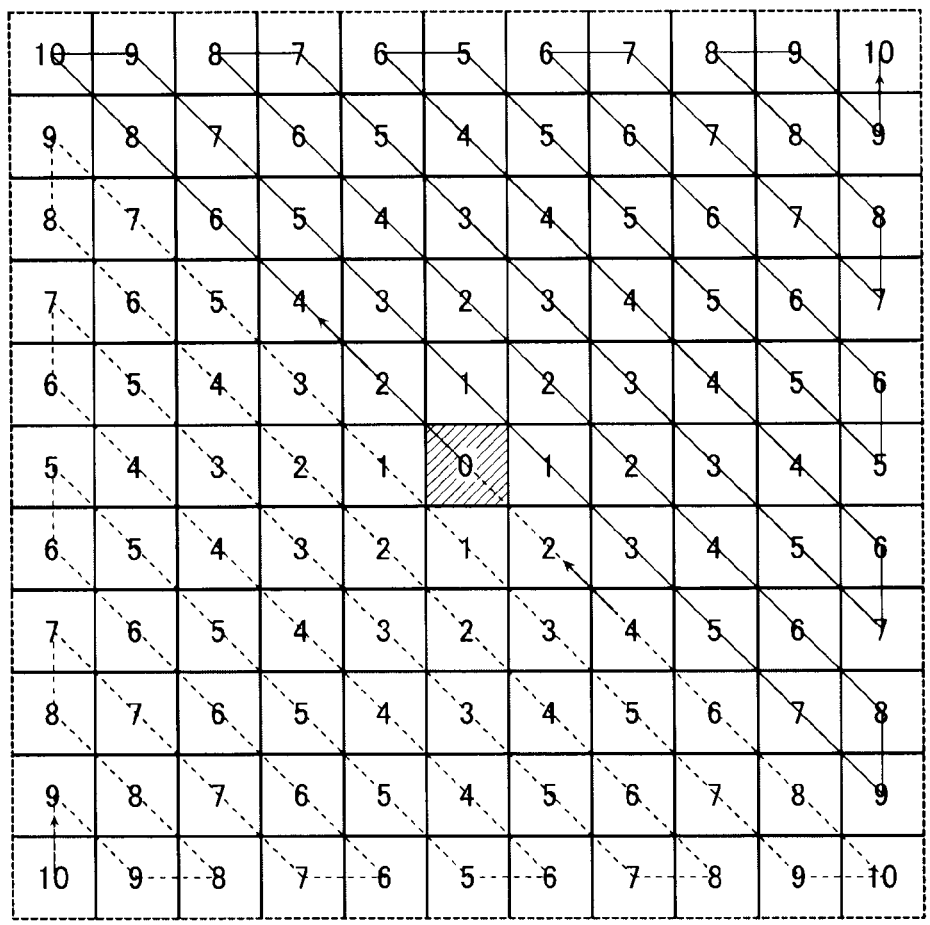
FIG. 36 is a diagram showing primes indicative by pair p-adic cells in the memory system according to the embodiment.
FIG. 37 is a diagram illustrative of a way of assigning Zp to pair p-adic cells in the memory system according to the embodiment.

FIG. 36 is a table including the relations among the number of levels settable in a single p-adic cell, and $n^2$, $n^2-2$, $n^2-3$, and $n^2-5$ grouped together. The numerals underlined in FIG. 36 are primes. The prime is $p=n^2-3$ or $p=n^2-5$ if n is even and the prime is $p=n^2-2$ if n is odd as can be found from the parity of $n^2$. As obvious from FIG. 36, no prime exists up to $n^2-5$ if n=11.

Subsequently, a consideration is given to the levels of the pair p-adic cells. As can be considered, there are various methods of setting the levels with the combinations of levels of each of the pair p-adic cells. In basic setting, when the level of any one of the pair p-adic cells varies by 1, the level of the pair p-adic cells also varies by 1.

From the viewpoint of error correction, the distance between levels is more important than the specific setting in the pair p-adic cells.

FIG. 37 is a diagram showing a matrix of inter-level distances within a range of 11×11. FIG. 37 shows how many levels of the pair p-adic cells should be leapt to reach the corresponding level on the basis of the central level hatched in the figure. In other words, it shows the difficulty in shifting to the surrounding level viewed from the central level. A failed operation easily occurs between levels of small numerals. When such the inter-level distances are given, the point on how to associate the orders of the elements in Zp to the levels is that the variation in Lee metric can be made closer to the variation in inter-level distance.

When the elements in Zp are represented by the ±number lines within a range of $-(p-1)/2$ to $(p-1)/2$ from the cardinal point of zero, Lee metrics are maximized at both ends seen from the center.

When the number line is regarded as a string, of which pattern varies at the center of the number line, it is considered how to extend the string to prevent Lee metrics from increasing. FIG. 37 shows the patterns of the strings with the solid line and the dashed line.

For the purpose of preventing Lee metrics from increasing, both ends of the string may be arranged such that they come to the locations with as large level distance as possible, that is, the corners of the matrix shown in FIG. 37, and the variation points on the pattern of the string come to the central part as near as possible.

In this case, it is desired to fold the string as shown in FIG. 37, then link the extra dummy portion caused in the assignment to the center of zero, and arrange zero at an appropriate location on the diagonal at the center of the string, so that the string has a shortest distance from the folded portion of the string with the shortest Lee metric, thereby eliminating the variation in Zp.

The above-described assignment of Zp is set such that the level distance from the central level in the matrix matches the Lee metric. Next, the effect by the match with the level distance from other level distances is observed.

Figure 38:
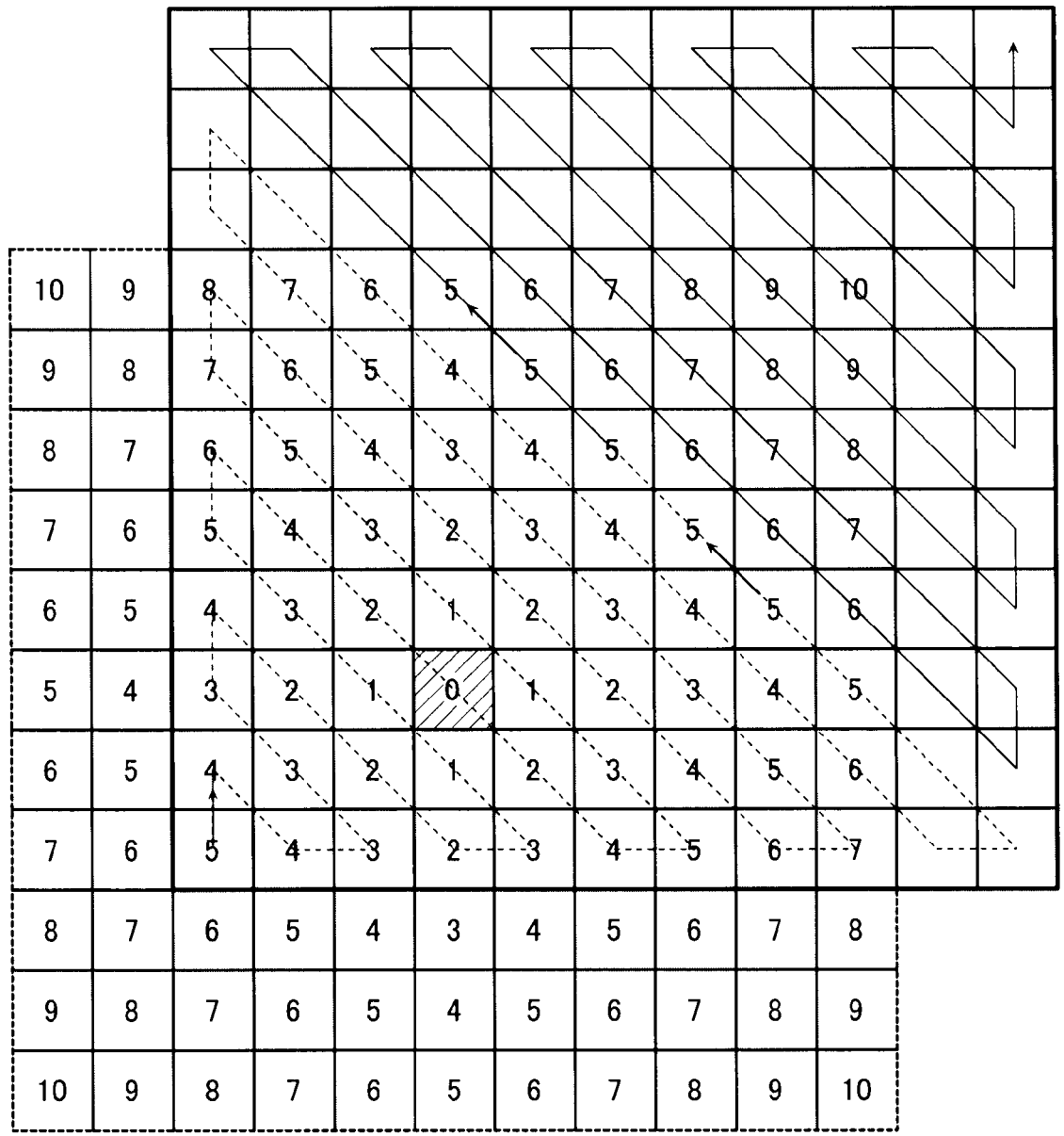
FIG. 38 is a diagram illustrative of an effect by the way of assigning shown in FIG. 37.
Figure 39:
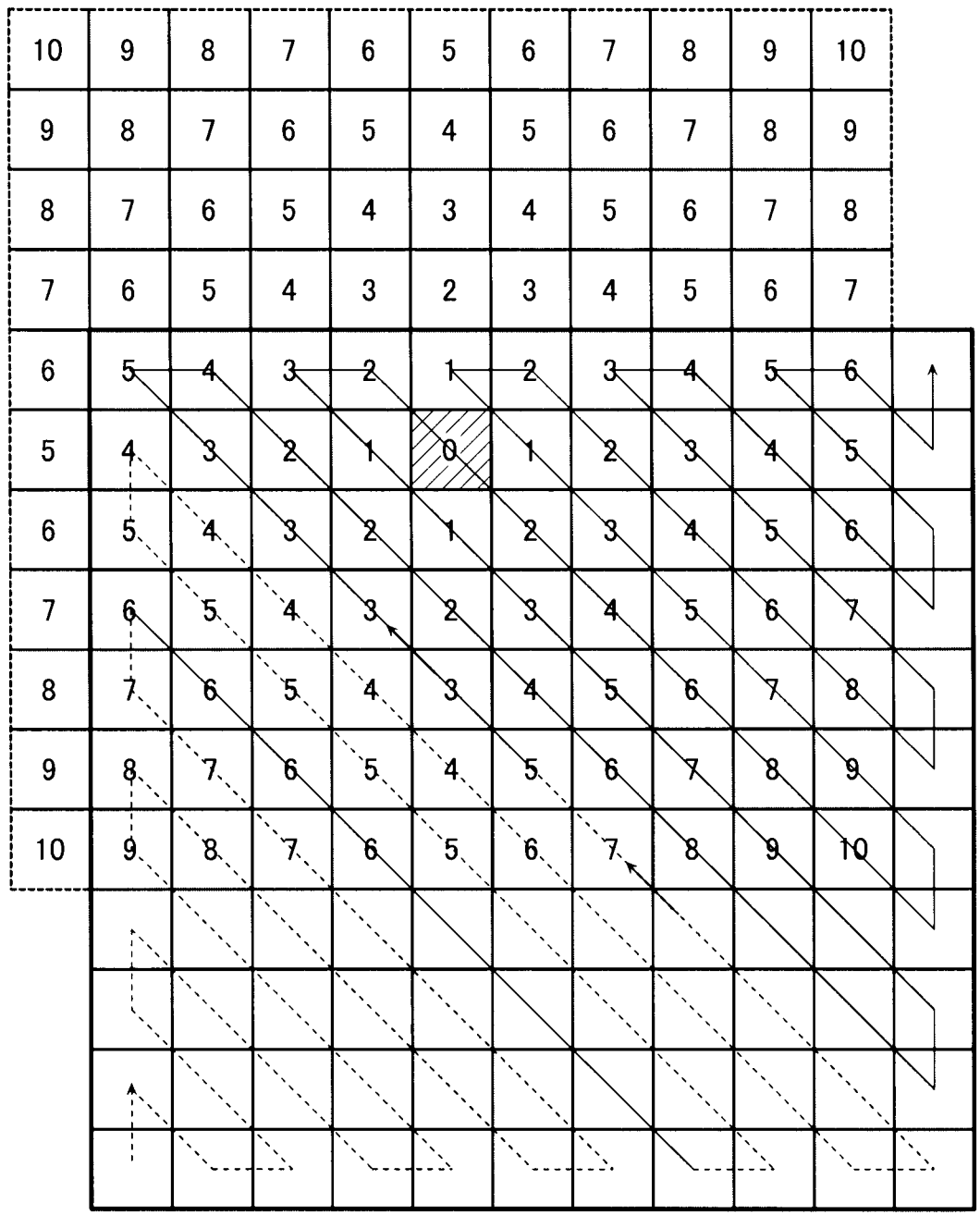
FIG. 39 is a diagram illustrative of an effect by the way of assigning shown in FIG. 37.
Figures 47, 48:
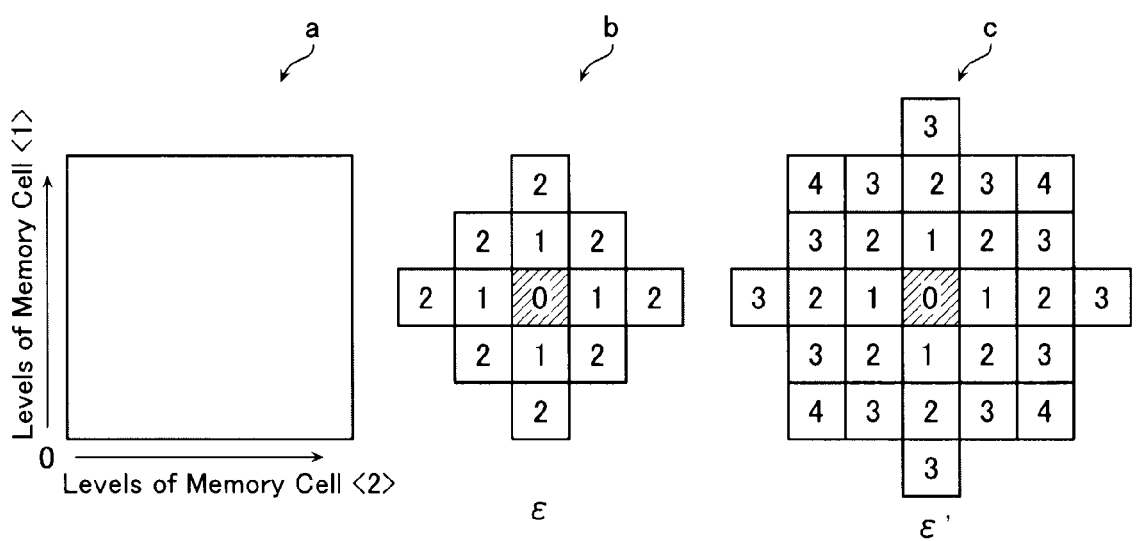
FIG. 47 is a diagram showing an example of assignment of Zp to pair p-adic cells in the memory system according to the embodiment.
FIG. 48 is a diagram illustrative of a Lee metric treatable by pair p-adic cells in the memory system according to the embodiment.
Figure 49:
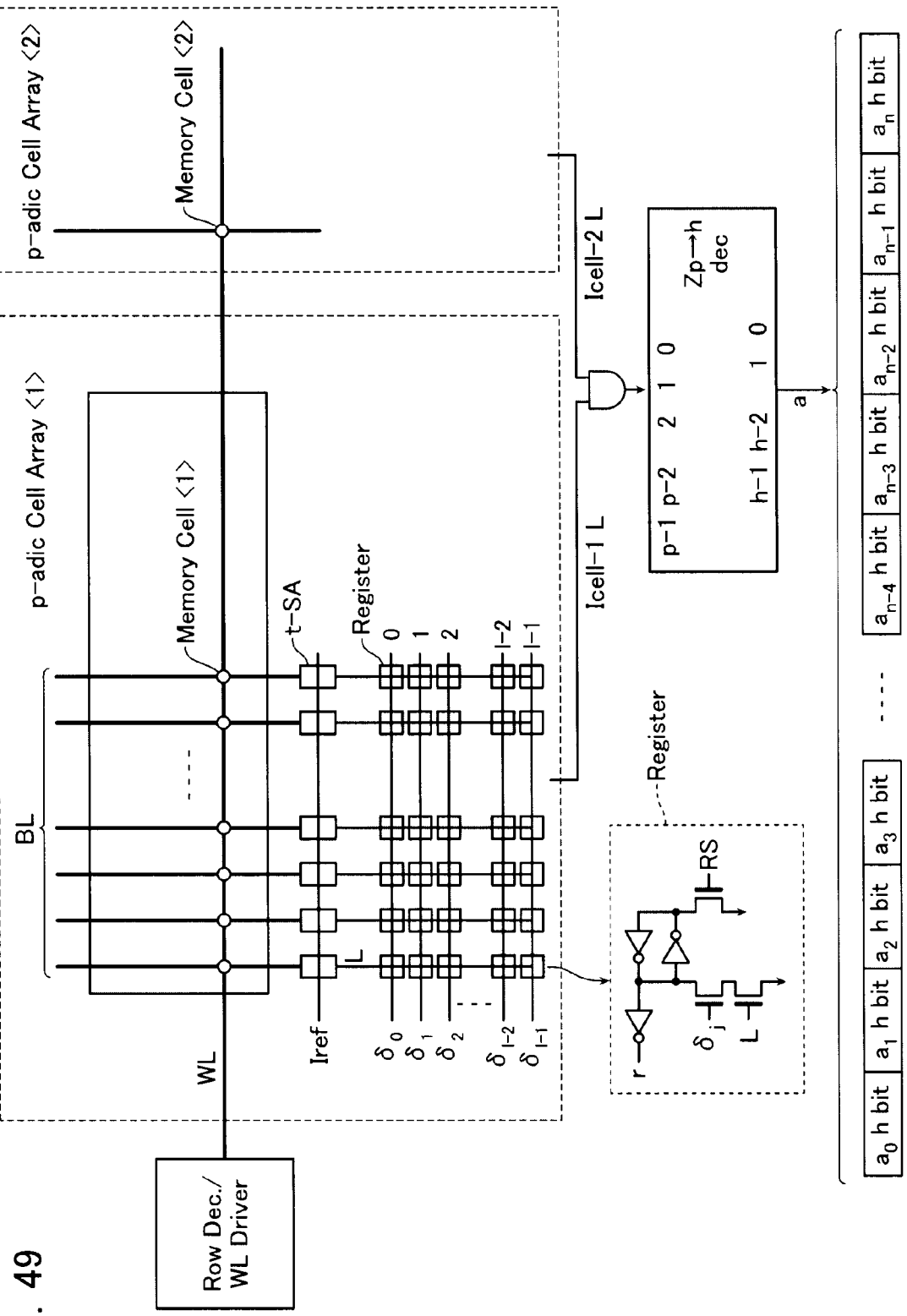
FIG. 49 is a diagram illustrative of a method of reading from pair p-adic cells in the memory system according to the embodiment.

FIGS. 38 and 39 relate to the pair p-adic cells both having the hatched level, and show the correspondences of the level distances to the strings of the number lines on the associations of Zp. In the periphery of 0, closer portions of the corresponding part of the string are folded gently, as such the state is found. That is, the environmental string pattern is similar for each location. Therefore, the variation in level of the pair p-adic cells matches the variation in Lee metric code as appropriate as possible.

The following description is given to an example of the assignment to the prime p.

In the case of a single p-adic cell having the number of levels equal to 3, 4, 5, 6, 7, 8, 9, 10, specific examples of the assignment of the primes p=7, 13, 23, 31, 47, 61, 79, 97 are shown in FIGS. 40-47. FIGS. 40-47 assign the pair p-adic cells with the elements $(-(p-1)/2$ to $(p-1)/2)$ in Zp, which are represented by the combinations of the levels in FIG. 48(a), which shows the level of the 1st memory cell <1> along the vertical axis and the level of the 2nd memory cell <2> along the lateral axis in each matrix table.

As shown in FIG. 48(b) and (c), $\epsilon$ and $\epsilon'$ represent the maximum, Lee metric variation quantities when a certain level distance pattern is assumed. Namely, $\epsilon$ represents the Lee metrics capable of treating the variation up to the level distance 2 as shown in FIG. 48(b), and $\epsilon'$ represents the Lee metrics capable of treating the case of the variation up to the level distance 3 and of 4 as a level variation 2 in the pair p-adic cells at once.

In the matrix tables shown in FIGS. 40-47, the solid line indicates the Zp assignment shift corresponding to $\epsilon$ and the dashed line indicates the assignment shift corresponding to $\epsilon'$. It is possible to treat any variations with $\epsilon'$ up to p=31.

The following description is given to an example of the method of reading from the pair p-adic cells.

The method of reading from the pair p-adic cells is basically similar to the method of reading from a single p-adic cell described with reference to FIG. 35. Therefore, the different point is described below.

When the individual single p-adic cells contained in the pair p-adic cells are viewed, they are set to different levels, which are read at the same time accordingly. Therefore, the word lines WL to be selected at the same time are provided with a p-adic cell array <1> including memory cells <1> and a p-adic cell <2> including memory cells <2> as the cell arrays that configure the pair p-adic cells. It is not required to physically distinguish these p-adic cell arrays <1> and <2> from each other and it is sufficient to distinguish them in accordance with the logical concept determined by the assignment of addresses according to the configuration of the cell array at least. As the bias given to the cell array, $\Delta_0$-$\Delta_{l-1}$ is divisionally serial-applied in the similar manner to FIG. 35. Here, l indicates the maximum number of levels that can be set to a single p-adic cell and, for example, n itself, that is, the number of rows or columns in the matrix tables shown in FIGS. 40-47.

In each p-adic cell array, p-adic cells used to store the codes $a_j$ of Zp data $A=(a_1, a_2, \ldots, a_n)$ are accessed at the same time.

The outputs from the sense amp units t-SA corresponding to n p-adic cells in each p-adic cell array selected by the word line WL at the same time are each connected to one register selectively.

The selective connections between the registers and the outputs of the sense amp units t-SA are controlled by a single signal $\delta_0, \delta_1, \ldots, \delta_{l-2}, \delta_{l-1}$ that turns to '1' in response to the application timing of the divisionally serial-applied bias, different from the case of FIG. 35. The signal $\delta_j$ is the bias corresponding to the level of the p-adic cell. Accordingly, if the output from the sense amp unit t-SA is '1' at the sense step of the level j, the level of the corresponding p-adic cell is at j.

The registers are previously initialized to '0' by the signal RS similar to the case of FIG. 35. When the output signal L from the sense amp unit t-SA and $\delta_j$ both turn to '1', the content in the register is set to '1'. When all the sense steps to the memory cells are completed, the levels stored in the memory cells are held in the registers. The held level L of each memory cell is subject to the logical product (AND) with the content in the register corresponding to the memory cells <1> and <2> contained in the pair p-adic cells, in accordance with the above-described matrix table of Zp associated with levels, to obtain the corresponding element in Zp. The obtained element in Zp is converted to an h-bit binary using the above-described "Zp→h dec" circuit block, which is then subject to operation processing in the "p-adic Zp world".

A comparison of the performance by the number of levels of the p-adic cell and the pair p-adic cells is made next.

At the start, with respect to the use of a single p-adic cell, the specific examples shown in FIG. 34 are grouped at every evaluated item in FIG. 50. The 1st column of the table shown in FIG. 50 provides the evaluated items. The evaluated items are as follows.

L: The number of levels of the p-adic cell.

p: A prime to be used.

h: A minimum number of bits required for binary representation of Zp.

$\epsilon$: A minimum integer larger than $(p-1)/4$, which indicates an overall quantity of Lee metrics of error-correctable errors.

$\epsilon'$: A minimum integer larger than $(p-1)/3$, which indicates an overall quantity of Lee metrics of error-correctable errors.

Here, $\epsilon$ and $\epsilon'$ are set on the assumption that the quantity of a failed operation on the physical quantity forming the level of the p-adic cell is almost constant independent of the number of setting levels of the p-adic cell.

M: A value determined by $M=h(p-\epsilon-3)$, which is the quantity of binary data in the "binary world" subject to batch processing by ECC.

M': A value determined by $M=h(p-\epsilon'-3)$, which is the quantity of binary data in the "binary world" subject to batch processing by ECC.

$\delta$: The number of digits of M as a $2^h$-adic number.

$\delta'$: The number of digits of M' as a $2^h$-adic number.

p-1: The number of p-adic cells required for storing the code word of the Lee metric code.

$\log_2 L$: The number of bits that can be stored in a p-adic cell when the p-adic cell is made as a binary storing multi-level cell.

$M/\log_2 L$: The number of memory cells when data M is stored in the "binary world" to a multi-level cell having the same number of levels as the p-adic cell.

The $M/\log_2 L$ is computed under the condition that ECC is not provided.

$M'/\log_2 L$: The number of memory cells when data M' is stored in the "binary world" to a multi-level cell having the same number of levels as the p-adic cell.

The $M'/\log_2 L$ is computed under the condition that ECC is not provided.

Redundancy: A ratio between the number of cells when data M is stored with ECC to a p-adic cell in the "p-adic Zp world" and the number of cells when the same data M is stored without ECC to the same p-adic cell used as a multi-level cell in the "binary world".

Redundancy': A ratio between the number of cells when data M' is stored with ECC to a p-adic cell in the "p-adic Zp world" and the number of cells when the same data M' is stored without ECC to the same p-adic cell used as a multi-level cell in the "binary world".

$\epsilon/(p-1)$: A proportion of the maximum number of correctable cells when $\epsilon$ is used.

$\epsilon'/(p-1)$: A proportion of the maximum number of correctable cells when $\epsilon'$ is used.

FIG. 50 shows the items on the primes of 7 or higher because the memory according to the present embodiment, that is, the "p-adic Zp world" cannot be configured with the prime of 3 or 5.

It is considered here that the number of levels is actually equal to 20 at most and the redundancy is equal to 2 or below from the viewpoint of the cost merit if ECC is included. Thus, the columns dotted in FIG. 50 provide a selectable range. This range makes it possible to ensure a correction rate of almost 30% and accordingly construct the memory system with considerably higher reliability as can be considered.

Subsequently, with respect to the pair p-adic cells, the specific examples shown in FIGS. 40-47 are grouped at every evaluated item in FIG. 51. The 1st column of the table shown in FIG. 51 provides the evaluated items. Among the evaluated items, those different from the items shown in FIG. 50 are as follows.

L: The number of levels of a single memory cell contained in the pair p-adic cells.

$L^2$-p: The number of extra levels when the levels of the pair p-adic cells are assigned with Zp, which is the number of levels redundantly assigned with '0' in Zp in the specific examples shown in FIGS. 40-47.

2 (p-1): The number of p-adic cells required for storing the code word of the Lee metric code.

The number is doubled compared with the table shown in FIG. 50 because the p-adic cells are used in a pair.

The $\epsilon$ and $\epsilon'$ shown in FIG. 51 are different from the $\epsilon$ and $\epsilon'$ shown in FIG. 50 and renewed as the Zp assignment-responding Lee metric with a fixed distance of variation in level of the p-adic cell. They are computed as the quantity of variation in failed operation on the physical quantity forming the level if the number of levels is large.

By the way, on the assumption that the pair p-adic cells are used if the number of levels of the memory cell cannot be made excessively larger, an actual L is assumed equal to or below 10. Therefore, the prime p becomes equal to or below 100. If it is further considered that the redundancy is equal to 2 or below from the viewpoint of the cost merit, the columns dotted in FIG. 51 provide a selectable range. This range makes it possible to ensure a correction rate of almost 20% and accordingly construct the memory system with considerably higher reliability as can be considered.

[Procedure of Data/Code Processing in p-adic Memory System]

Next, with respect to ECC operation in the "p-adic Zp world", the conversion procedure at the entrance of the "p-adic Zp world", the procedure of encoding the code input to the memory system as Zp data, the procedure of decoding the code read out of the memory system, and the conversion procedure at the exit of the "p-adic Zp world" are grouped.

It is assumed here that the Zp-determining prime p, the minimum number h of bits required for binary representation of p, the number δ of digits of batch-processed data as a $2^h$-adic number in the "binary" world, and the total quantity, $\epsilon=\gamma-1$, of Lee metrics of correctable errors are previously determined. In addition, it is assumed in the following description that n and k are $n=p-1$ and $k=n-\gamma$, respectively.

The conversion procedure at the entrance of the "p-adic Zp world" is as follows.

Figure 52:
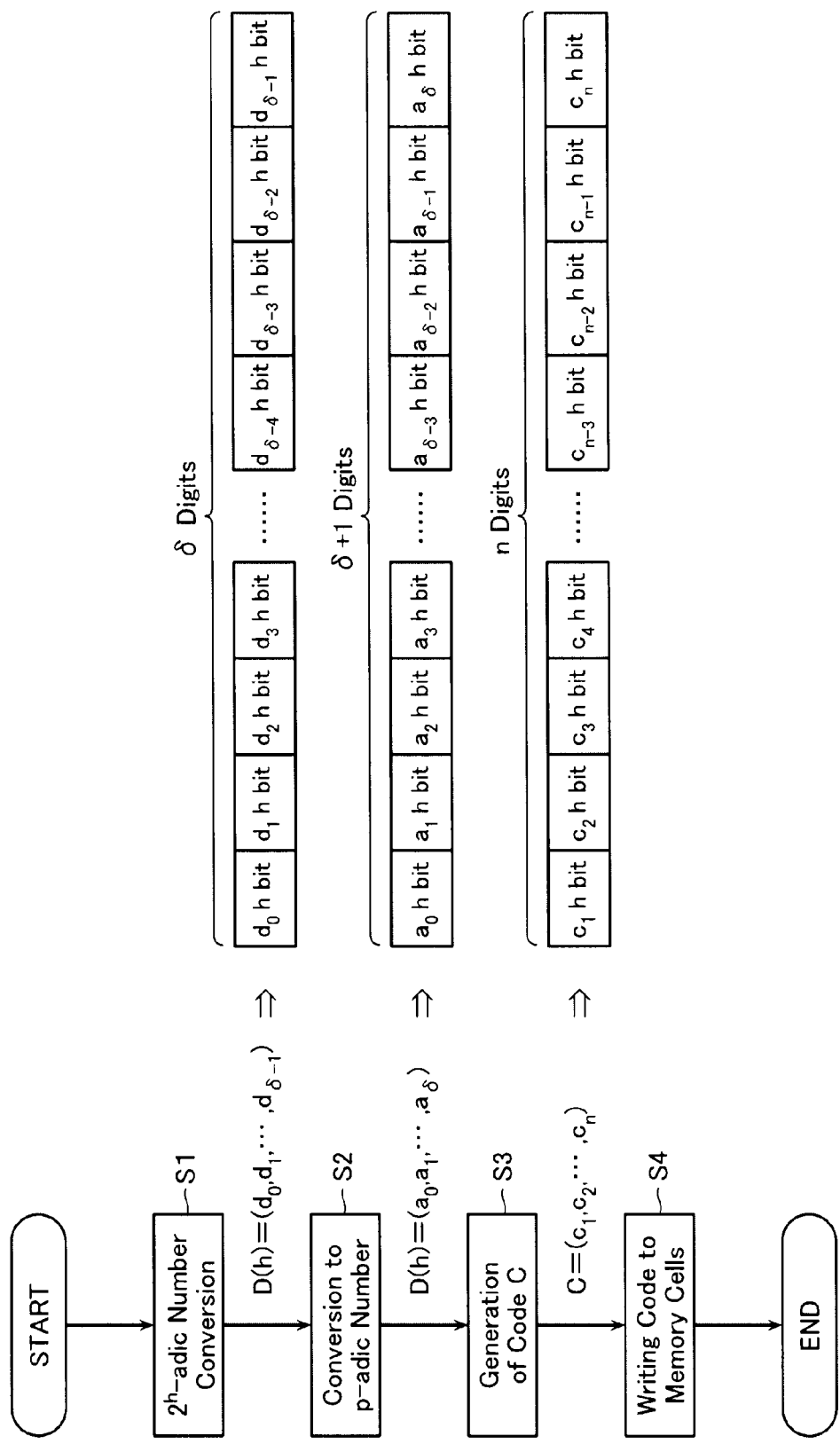
FIG. 52 is a flowchart of the data/code conversion procedure in the memory system according to the embodiment.

(Procedure 0) First, pieces of binary data fed from external to the memory system are grouped at every h bits, and converted to a $2^h$-adic expressed δ-digit data word D(h) shown in Expression 28 (S1 in FIG. 52).

$$D(h)=(d_0,d_1,\ldots,d_{\delta-1}) \quad \text{[Expression 28]}$$

Subsequently, the data word D(h) shown in Expression 28 is converted further to a p-adic expressed (δ+1)-digit data word D(h) shown in Expression 29 (S2 in FIG. 52).

$$D(h)=(a_0,a_1,\ldots,a_\delta) \quad \text{[Expression 29]}$$

The procedure of encoding the code input to the memory system as Zp data is as follows.

(Procedure 1) First, the elements $a_0$-$a_\delta$ in Zp obtained through Procedure 0 are given zeros to obtain k elements $a_0$-$a_{k-1}$ of data D shown in Expression 30.

$$D(h)=(a_0,a_1,\ldots,a_{k-1}) \quad \text{[Expression 30]}$$

Subsequently, this data D is multiplied by a generator matrix G to obtain n code word components $c_1$-$C_n$ of a code C (S3 in FIG. 52). The value of each code word component is as shown in Expression 31.

$$c_j = \sum_{i=0}^{k-1} (j)^{i+1} a_i \quad \text{[Expression 31]}$$

Finally, the code word components $c_3$ are stored in memory cells (S4 in FIG. 52).

The procedure of decoding the code read out of the memory system is roughly divided to 7 procedures as follows. Hereinafter, the procedure numbers are serial numbers containing the procedure of encoding. Note that Procedures 2 and 3 shown below are repeated over the elements (m=0 to p−2) in Zp.

Figure 53:
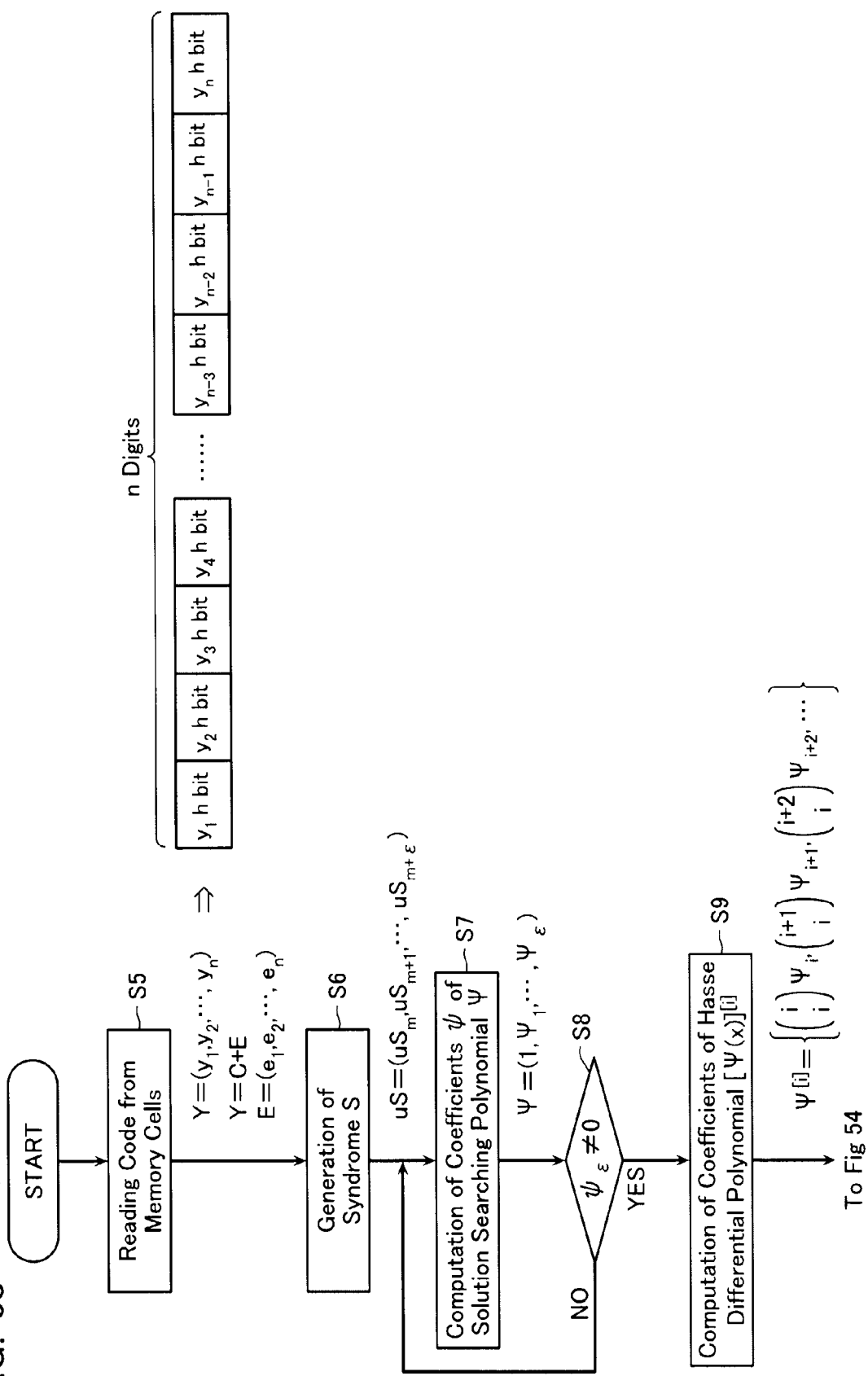
FIG. 53 is a flowchart of the data/code conversion procedure in the memory system according to the embodiment.

(Procedure 2) A code Y read out of memory cells is read out (S5 in FIG. 53). The code Y is configured as shown in Expression 32. Here, $e_j$ denotes a Lee metric of the error in the code word symbol located at the position j of the code Y.

$$Y=(y_1,y_2,\ldots,y_n)$$

$$Y=C+E, E=(e_1,e_2,\ldots,e_n) \quad \text{[Expression 32]}$$

Subsequently, the values $y_j$ (j=1 to n) of n code word symbols contained in the code Y are multiplied by $j^m$ to compute $j^m y_j$ as numerals in Zp. The symbol value $y_j$ can be sought from the level in the case of the multi-level memory cell. In the case of a general binary memory, it is a numeral obtained from binary data. The code Y is multiplied by a transpose of a syndrome matrix H to obtain a syndrome series $^mS(=YH^T)$ composed of syndromes $S_m$ to $S_{m+\epsilon}$ as shown in Expression 33 (S6 in FIG. 53).

$$S=(S_m, S_{m+1}, \ldots, S_{m+\epsilon}), \quad \text{[Expression 33]}$$

$$S_1 = \sum_{j=1}^{p-1}(j)^1 y_j = \sum_{j=1}^{p-1}(j)^1 e_j$$

(Procedure 3) First, with regard to the upper limit $\epsilon$ ($=\gamma-1$) of the number of correctable symbols, $\eta=\epsilon$ and $u=\eta S_m^{-1}$ are computed to obtain $uS_m$ to $uS_{m+\epsilon}$ from the syndrome $S_1$ obtained through Procedure 2. Subsequently, coefficients $\psi_j$ of a solution searching polynomial $\Psi(x)$ shown in Expression 34 are computed in turn from $uS_m$ to $uS_{m+\epsilon}$ (S7 in FIG. 53).

$$\Psi(x) = 1 + \sum_{l=1}^{\gamma-1} \psi_l x^l, \quad \text{[Expression 34]}$$

$$\psi_j = -j^{-1} \sum_{i=1}^{j} \psi_{j-i} u S_{m+i}$$

Here, if the degree of the coefficient $\Psi(x)$ is η, that is, $\psi_\epsilon \neq 0$, then the flow goes to Procedure 5 to obtain a solution. On the other hand, if $\psi_\epsilon=0$, the flow terminates processing as no solution. Otherwise, in order to further search the possibility of correction, $\eta=\epsilon-1$ is replaced to repeat Procedure 2. If the degree of $\Psi(x)$ is η, that is, $\psi_{\eta+1} \neq 0$ and $\psi_\eta \neq 0$, then the flow goes to Procedure 4 to obtain a solution. On the other hand, if $\psi_\eta=0$, the flow terminates processing as no solution. If the flow cannot execute processing in Procedure 3, it halts the error correction as no solution because the error distribution is not supportable.

(Procedure 4) If it is found that no solution can be obtained as a result of $\psi_\epsilon \neq 0$ in Procedure 3, a solution is obtained in Procedures 4, 5. First, in Procedure 4, in order to obtain the multiplicity of the solution, a Hasse differential polynomial $[\Psi(x)]^{[i]}$ shown in Expression 35 is sought. The coefficients $\psi_j$ obtained through Procedure 3 are multiplied by a series of binomial coefficients to obtain coefficients of the Hasse differential polynomial (S9 in FIG. 53).

$$[\Psi(x)]^{[i]} = \sum_{j=1}^{} \binom{j}{i} \psi_j x^{j-i}, \quad \text{[Expression 35]}$$

$$\Psi^{[i]} = \left\{ \binom{i}{i}\psi_i, \binom{i+1}{i}\psi_{i+1}, \binom{i+2}{i}\psi_{i+2}, \ldots \right\}$$

Figure 54:
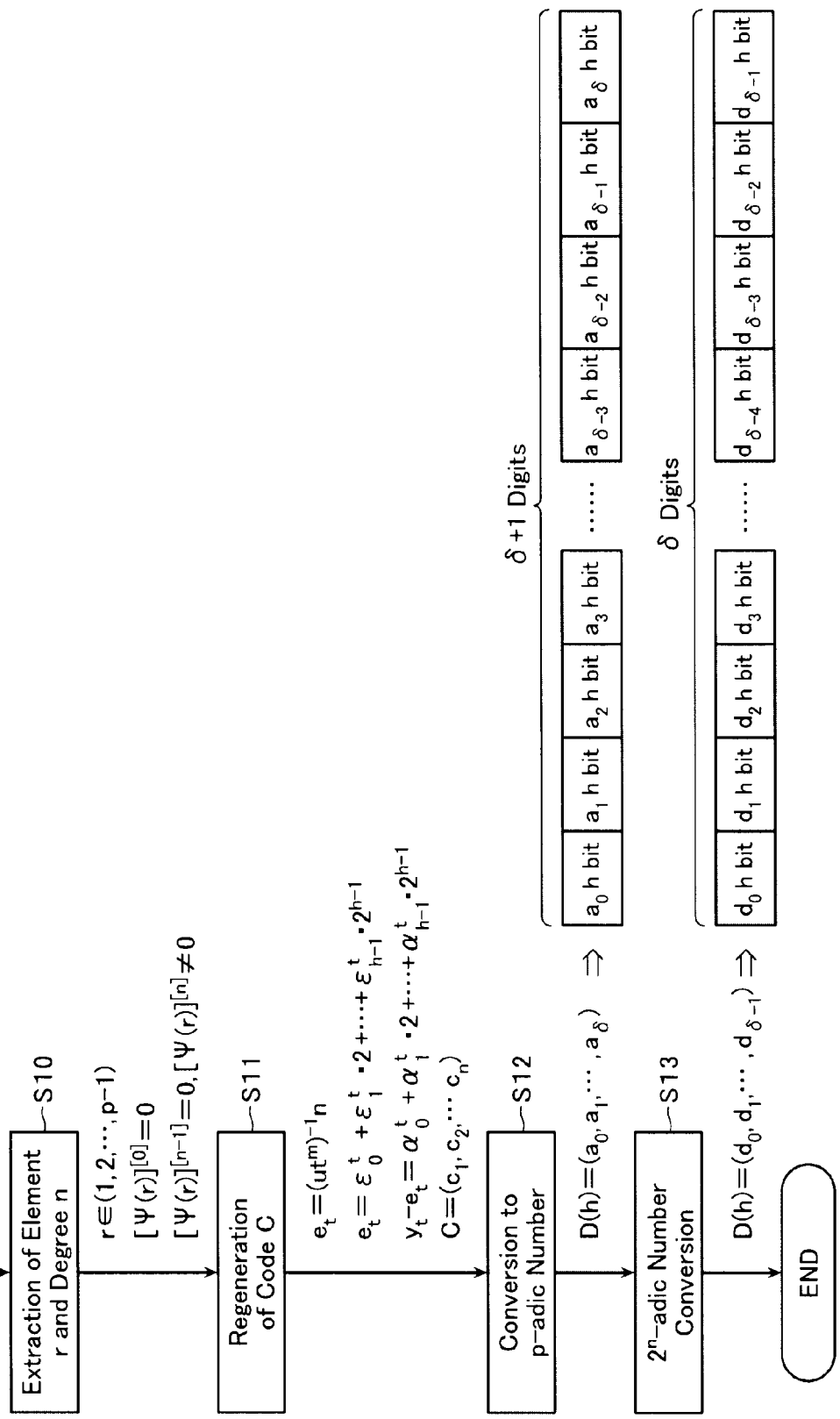
FIG. 54 is a flowchart of the data/code conversion procedure in the memory system according to the embodiment.

(Procedure 5) The elements 1 to p−1 in Zp are substituted into the resultant Hasse differential polynomial to seek all the elements r that can bring the 0-order differential polynomial ($=\Psi(x)$) into zero. Subsequently, as shown in Expression 36, such the degree n is sought that brings the (n−1)-th order differential polynomial into zero over each r and the n-th order differential polynomial into non-zero (S10 in FIG. 54).

$$[\Psi(r)]^{[0]} = \Psi(r) = 0, \quad \text{[Expression 36]}$$

$$[\Psi(r)]^{[n-1]} = \sum_{j=n-1}^{} \binom{j}{n-1} \psi_j r^{j-n+1} = 0,$$

-continued $$[\Psi(r)]^{[n]} = \sum_{j=n} \binom{j}{n} \Psi_j r^{j-n} \neq 0$$

The obtained r is an inverse element of the position of the code word symbol in the error-caused code, and the corresponding n is the quantity converted from the caused error quantity.

(Procedure 6) In Procedure 6, the error quantity is sought through a conversion from the multiplicity n of the solution. The position of the error-caused code word symbol is $t=r^{-1}$, and the reverse conversion of the conversion performed to obtain the polynomial for obtaining a solution is applied to n. As there is a relation of $ut^m e_t = n$, the original error quantity $e_t$ can be derived from n as $e_t = (ut^m)^{-1} n$. The error quantity $e_t$ is subtracted from the symbol value $y_t$ of the code Y read out of memory cells to obtain the symbol value $c_t$ of the corrected code C (S11 in FIG. 54).

Up to now, as the correct code C stored in the memory system is obtained, the binary data input to the memory system is sought through Procedures 7 and 8.

(Procedure 7) The code C error-corrected through Procedure 6 and the generator matrix G are applied to seek k elements $a_0$ to $a_{k-1}$ in GF(p) and X $(=a_0, a_1, \ldots, a_{k-1})$ through a system of linear equations XG=C. Thus, ($\delta$+1) pieces of elements $a_0$ to $a_\delta$ in Zp can be obtained. The obtained elements, $a_0$ to $a_\delta$, are used to create ($\delta$+1)-digit, p-adic expressed data word D(h) (S12 in FIG. 54).

(Procedure 8) Finally, the data word D(h) is converted to a $\delta$-digit, $2^h$-adic expression to express a numeral on each digit in binary. Thus, the restoration of binary data fed to the memory system is completed (S13 in FIG. 54).

The following description is given to the principle of the method used in the procedure of data processing in the "p-adic Zp world". This principle is derived from the improvement in the conventional method and referred to as a "syndrome converting method".

The components of the code C held in the memory system are the numerals in Zp and they cause variations on receipt of various disturbances at every component and make a change to the code Y consisting of different components as shown in Expression 37.

$$Y=(y_i), y_i=c_i+e_i \quad \text{[Expression 37]}$$

The operation to restore C from Y is decoding. Prior to decoding, a syndrome is derived.

When a certain m is selected from Zp, a syndrome $^m S$ is determined as $^m S = (S_{m+l})$ (l=0 to $\gamma$-1). Then $S_0$ is obtained from m=0 and, if $|S_0| \leq \gamma - 1$, decoding is started. The syndrome $^m S$ has elements, $S_{m+0}, S_{m+1}, \ldots, S_{m+\gamma l}$, which are determined through a matrix operation as in Expression 38 using the H matrix.

$$^m S = Y \begin{bmatrix} 1 & 0 & \cdots & 0 \\ 0 & 2 & \cdots & 0 \\ \vdots & \vdots & \ddots & \vdots \\ 0 & 0 & \cdots & (p-1) \end{bmatrix}^m H^t, \quad \text{[Expression 38]}$$

$$\sum_{j=1}^{p-1} (j)^{1+m} c_j = \sum_{i=0}^{k-1} a_i \sum_{j=1}^{p-1} (j)^{1+m+i+1} = 0$$

-continued $$\therefore S_{m+1} = \sum_{j=1}^{p-1} (j)^{m+1} e_j$$

Here, $H^t$ is a transpose of H. The G matrix and the H matrix are configured to satisfy $GH^t = 0$ (mod p). Accordingly, a replacement of Y=C+E to the components of E is allowed to represent S. If m=0 and E=$(e_0, e_1, \ldots, e_n)$, then $S_0 = \Sigma e_j$. Thus, $S_0$ corresponds to the total sum of errors in the symbols. If $|S_0| \leq \gamma - 1$, errors can be found through the following syndrome converting method. It is also possible to obtain the value of an error on the code component according to the computation even if the condition cannot be satisfied. It is though not possible to determine whether it is the error on a true code or the error on adjacent code. Thus, it cannot be used in error correction. This depends on the fact that the Lee metric between codes has a minimum value of $2\gamma$.

If it can be utilized reliably in error correction, the metrics of error components $e_i$ of the code word are all converted in batch next. When the product of fixed elements in a finite field and all elements is obtained, all elements in the finite field can be obtained. This fact is utilized to obtain u as in $uS_m = \eta$ for the previously determined element $\eta$ and m that satisfies $|S_m| \neq 0$. When the error-containing code Y stored in the memory cell array is multiplexed by u to seek a syndrome, the components derived from $^m S$ multiplexed by u, that is, $uS_m$, $uS_{m+1}, \ldots, uS_{m+\gamma+l}$ can be obtained as syndrome components, which are represented by uS. In a word, uS can be represented as in Expression 39.

$$uS = (uS_m, uS_{m+1}, \ldots, uS_{m+\gamma+1}) \quad \text{[Expression 39]}$$

Note that the total sum $uS_m$ of the converted errors after conversion becomes n. In accordance with the total sum, the error component $e_j$ can be regarded as in $u(j)^m e_j$ as can be found. These syndromes are only information on errors and can be used to restore the correct code based thereon.

Subsequently, the principle of decoding is described on the assumption that the error is previously known.

The code stored in the memory cell array contains the error E=$(e_1, e_2, \ldots, e_n)$ (n=p-1). Accordingly, a virtual error on the new syndrome includes $\{u(1)^m e_1, u(2)^m e_2, \ldots, u(n)^m e_n\}$. These n (=p-1) error components are converted and classified into 2 sets $J_+$ and $J_-$ as in Expression 40.

$$J_+ = \{j \in (1,2, \ldots, n); u(j)^m e_j < p/2\}$$

$$J_- = \{j \in (1,2, \ldots, n); u(j)^m e_j > p/2\} \quad \text{[Expression 40]}$$

Namely, it is classified into $J_+$, which is an arrangement of the positions j of the code word symbols $c_j$, if the error quantity of the error code word symbol is $u(j)^m e_j < p/2$, and into $J_-$, which is an arrangement of the positions j of the code word symbols $c_j$, if the error quantity of the error code word symbol is $u(j)^m e_j > p/2$. Polynomials $\Lambda(x), V(x)$ on GF(p) are configured on the basis of these sets as in Expression 41.

$$\Lambda(x) = \prod_{j \in J_+} (1 - jx)^{u(j)^m e_j}, \quad \text{[Expression 41]}$$

$$V(x) = \prod_{j \in J_-} (1 - jx)^{p - u(j)^m e_j},$$

Thus, the polynomial $\Lambda(x)$ is such a polynomial that has a reciprocal number of the error component position j in $J_+$ as a root, and that has a Lee metric $u(j)^m e_j$ of that error component as the multiplicity of the root. On the other hand, the polynomial V(x) is such a polynomial that has a reciprocal number of the error component position j in J_ as a root, and that has a Lee metric $p-u(j)^m e_j$ of that error component as the multiplicity of the root. Decoding is a process of finally configuring these polynomials only from the information on the syndromes to solve them, thereby obtaining information on errors. In a word, it is required to seek a relation between these polynomials Λ(x), V(x) and the syndromes. When it is configured with a series polynomial having each syndrome uS on a coefficient of the corresponding degree, it is represented with a rational polynomial having the position of the error composition and the value of the virtual error composition in factors thereof as in Expression 42.

$$S(x) = \sum_{l=1}^{\infty} uS_{m+l} x^l = \sum_{j=1}^{p-1} u(j)^m e_j \sum_{l=1}^{\infty} (jx)^l = \sum_{j=1}^{p-1} u(j)^m e_j \frac{jx}{1-jx}$$ [Expression 42]

From Expression 42, a relational equation shown in Expression 43 can be established among the polynomials Λ(x), V(x) and the syndrome S(x).

$$\left(\frac{\Lambda(x)}{V(x)}\right) S(x) = -x \left(\frac{\Lambda(x)}{V(x)}\right)'$$ [Expression 43]

Subsequently, the relational equation shown in Expression 43 is used to seek the polynomials Λ(x), V(x) from the syndrome S(x).

From the syndrome S(x), a polynomial Ψ(x) with a degree of γ−1 or lower shown in Expression 44 is sought.

$$\Psi(x) S(x) \equiv -x \Psi'(x) (\bmod x^\gamma)$$ [Expression 44]

$$\Psi(x) = 1 + \sum_{l=1} \Psi_l x^l,$$

$$\Psi_j = -\frac{1}{j} \sum_{i=1}^{j} \Psi_{j-i} uS_i$$

In an expansion of the polynomial Ψ(x), a coefficient $\psi_j$ can be sought from a comparison between coefficients of the homogeneous degree on both sides of the expression shown in Expression 44 through an iterative method using the syndrome $S_i$ and an already-determined coefficient $\psi_{j-1}$. Coefficients $\psi_0$-$\psi_{\gamma-1}$ of the polynomial Ψ(x) are sought from syndromes $uS_1$ to $uS_{m+\gamma-1}$. The results are shown in Expression 45.

$$\psi_0 = 1$$ [Expression 45]

$$\psi_1 = \psi_0 uS_1 = -uS_{m+1}$$

$$\psi_2 = -(\psi_1 uS_{m+1} + \psi_0 uS_{m+2})/2$$
$$= -u(\psi_1 uS_{m+1} + \psi_0 uS_{m+2})/2$$

⋮

-continued $$\psi_{\gamma-1} = -(\psi_{\gamma-2} uS_{m+1} + \ldots + \psi_0 uS_{m+\gamma-1})/(\gamma-1)$$
$$= -u(\psi_{\gamma-2} uS_{m+1} + \ldots + \psi_0 uS_{m+\gamma-2})/(\gamma-1)$$

The polynomial Ψ(x) is a polynomial equivalent to Λ(x)/V(x). In this case, the key conditions on prime polynomials λ(x) and ν(x) are given as in Expression 46. Therefore, an appropriate selection of η establishes V(x)=1 such that Ψ(x) can be applied as Λ(x) itself.

$$\nu(x) \Psi(x) \equiv \lambda(x) (\bmod x^\gamma)$$

$$\deg \lambda(x) - \deg \nu(x) = uS_m = \eta (\bmod p)$$

$$\deg \lambda(x) + \deg \nu(x) \leq \gamma$$ [Expression 46]

The condition, deg λ(x)−deg ν(x)=η and deg λ(x)+deg ν(x)≤γ−1, on the degree of the polynomial results in 0≤2 deg ν(x)≤γ−1−η, which establishes deg ν(x)=0 if 0≤γ−1−η≤1 as can be found. Namely, if γ−1≥η≥γ−2, then V(x)=1 and Λ(x)=Ψ(x) can establish so that Ψ(x) can satisfy this condition. In this case, η previously determined by Ψ(x) derived from the syndrome, and η=deg Ψ(x)=deg Λ(x) should establish. If they can establish, all key conditions can be satisfied and accordingly Ψ(x) can be used to obtain a solution. On the other hand, if they cannot establish, no error satisfies the key conditions, resulting in no solution.

This method corresponds to conversions applied to errors, which collect the positions of all error code components into the set J_+. Another viewpoint indicates the presence of the possibility of error correction if conversions are executed such that the total sum of the converted errors becomes equal to or lower than γ−1 and higher than γ−2.

The possibility referred above has two meanings. The first is associated with the requirement in which the positions of all error code components are collected in J_+, and the degree of Ψ(x) derived from the syndrome is just equal to n. The second is associated with the requirement in which the error quantity can be obtained according to the computation even though $|S_0| \leq \gamma-1$ is not satisfied. This condition is added, though, to exclude failed corrections.

As shown in the next example, this method is applicable to obtain a solution for any error on 1 code word component. This method is also applicable to obtain a solution for any errors on 2 code word components using the syndrome cyclically, as can be found.

In solution searching, a replacement of Λ(x)=Ψ(x) and V(x)=1 is used to search a solution that satisfies the equation from the elements in Zp and, based on the obtained root and multiplicity, an inverse conversion is applied to obtain a true error E.

The following consideration is given to what types of errors can be searched, for the number of roots, that is, the number of components of the error-caused code word, through the syndrome converting method of converting the metrics of errors to seek a solution searching polynomial.

The first study is given to the case where 1 root is obtained from the solution searching polynomial.

When the root is denoted with $j^{-1}$, the component position in the error code E=(0, $e_j$, ..., 0) (n=p−1) is j and the error quantity is $e_j$. When they are multiplied by an appropriate $u(j)^m$ for conversion such that these are lowered below p/2 each and grouped in $J_+ = \{j; u(j)^m e_j < p/2\}$, it is possible to configure a polynomial Ψ(x) shown in Expression 47.

$$uS_m = u(j)^m e_j \rightarrow \Psi(x) = (1-jx)^{u(j)^m e_j}$$ [Expression 47]

From Expression 47, independent of the quantity of errors, $u(j)^m e_j=\eta$ can establish always and fall within $J_+$. Therefore, it is possible to obtain the value of the error on 1 code word completely. In this case, however, the minimum distance between code words is $2\gamma$. Accordingly, the true code word cannot be specified if $|e_j|$ is equal to or higher than $\gamma$, and the error quantities of various errors are obtained in accordance with the selection of m. The error quantities correspond to the code words, respectively, and one of them is the error on the true code word, as in the so-called list correction.

The next study is given to the case where 2 roots are obtained from the solution searching polynomial.

When the roots are denoted with $i^{-1}$ and $j^{-1}$, the component positions in the error code $E=(0, \ldots, e_i, \ldots, e_j, \ldots, 0)$ $(n=p-1)$ are i and j and the error quantities are $e_i$ and $e_j$. When they are multiplied by an appropriate $u(j)^m$ for conversion such that these are lowered below p/2 each and grouped in $J_+=\{i, j; uU(i)^m e_j, u(j)^m e_j < p/2\}$, it is possible to configure a polynomial $\Psi(x)$ shown in Expression 48. Accordingly, the error quantities can be obtained from the polynomial $\Psi(x)$.

$$uS_m = u(i)^m e_i + u(j)^m e_j \to \Psi(x) = (1-ix)^{u(i)^m e_i}(1-jx)^{u(j)^m e_j} \quad [\text{Expression 48}]$$

If the error codes are multiplied by an appropriate $u(j)^m$ for conversion such that these are lowered below p/2 each and grouped in $J_+$, it is required for $e_i$ and $e_j$ to have a certain relation therebetween. This can be satisfied if both are equal. If equal, the conversion by $u(j)^m$ can bring any error quantity to $\eta$. Therefore, it is possible to obtain the values of the errors on 2 code word components completely.

It is the Lee metric code, however, that has the minimum distance of $2\gamma$ between code words. Accordingly, the true code word cannot be specified if $|e_i|+|e_j|$ is equal to or higher than $\gamma$, and the error quantities of various errors are obtained in accordance with the selection of m. The error quantities correspond to the code words, respectively, and one of them is the error on the true code word. By the way, if the distance between 2 errors satisfies a certain condition, an appropriate conversion can be applied to group both in $J_+$. Accordingly, it is not the requirement that both are equal.

The following description is given to a converting method of equalizing 2 code errors.

2 error codes are denoted with i, j and the error quantities are denoted with $e_i$, $e_i$, respectively. In this case, a syndrome is represented by $S_0=e_i+e_j$. Further, the syndrome is turned to $S_m=i^m e_i+j^m e_j$ as can be found from the syndrome computation. In a word, the selection of an appropriate m results in $i^m e_i \equiv j^m e_j$.

The use of the primitive root and index expression of Zp here to provide $e_i = \alpha^{(ei)}$, $e_j = \alpha^{(ej)}$, $i = \alpha^{(i)}$, $j = \alpha^{(j)}$ can establish $m(i)+(e_i) \equiv m(j)+(e_j)$. Therefore, m can be obtained through $m \equiv -\{(e_j)-(e_i)\}/\{(j)-(i)\}$.

Thus, a series of syndromes $(S_m, S_{m+1}, \ldots, S_{m+\gamma-1})$ can be used to obtain the coefficient u that satisfies $uS_m=\eta$.

As m is not known initially, however, a converting method as below is used to deal various errors on 2 code word symbols. First, m is scanned from 0 to p−2, and the coefficient u for m is computed through $u=\eta S_m^{-1}$, thereby obtaining $(uS_m, uS_{m+1}, \ldots, uS_{m+\gamma-1})$. Subsequently, these $(uS_m, uS_{m+1}, \ldots, uS_{m+\gamma-1})$ are used to configure a polynomial $\Psi(x)$. Finally, such m is extracted from the configured polynomial $\Psi(x)$ that satisfies deg $\Psi(X)=\eta$. When $\Psi(x)$ is configured at the time of m thus extracted so as to satisfy deg $\Psi(x)=\eta$, the $\Psi(x)$ at the time of that m is used to seek the root and multiplicity.

Thus, the method capable of seeking any errors can be obtained if the number of roots in the solution searching polynomial is equal to 2 or below, that is, equal to or below the number of errors in 2 code word components. The next consideration is given to how it is in the case of 3 or more roots.

The condition of obtaining a solution in the case of 3 or more roots is that the error quantities of all roots are converted so as to belong to $J_+=\{j; \{j\,(1, 2, \ldots, n); u(j)^m e_j < p/2\}$. At this time, $\Psi(x)$ is configured as a $\eta$-th order polynomial shown in Expression 49.

$$uS = \sum_{j=1}^{p-1} u(j)^m e_j \to \Psi(x) = \prod_{j \in J_+}(1-jx)^{u(j)^m e_j} \quad [\text{Expression 49}]$$

The conversion operable in such the manner for any error quantity exists in the case of 2 roots or below while it is difficult to configure it as a simple conversion in the case of 3 or more roots. Therefore, if errors occur on 2 code word components or below, as the method capable of treating any errors, the above-described conversion in the case of 2 roots and the method of solution searching are used as they are. For the purpose of increasing the error distribution of error components in the case of 3 or more roots grouped in $J_+$, the same method is applied repeatedly to another candidate of $\eta$, that is, $\gamma-2=\epsilon-1$ as new scanning.

Namely, the flow changes $\eta$, min turn from 0 to p−2 over each $\eta$ of $\epsilon$ and $\epsilon-1$ to provide $u \equiv \eta S_m^{-1}$, as $(uS_m, uS_{m+1}, \ldots, uS_{m+\epsilon}) \to \Psi(x)$. If deg $\Psi(x)=\eta$, then a solution can be obtained from $\Lambda(x)=\Psi(x)$. This is solved to finish solution searching. If deg $\Psi(x) \neq \eta$, the error distribution cannot be solved, and the flow terminates as no solution.

This key to solution includes keys to solution for 2 roots and 1 root and can compute any errors caused in random on code word components in the case of 2 roots or below. As for errors on code word components in the case of 3 roots or above, it is possible to correct $\epsilon$ $(=\gamma-1)$ code word components at the maximum in a special case such as a narrow distribution of error quantities. In particular, if the error quantities distribute such that all error quantities are equal or collected to almost the same value, it is same as in the case of 2 roots or below. Accordingly, it is possible to compute the code word components even if every type of errors occurs. In consideration of failed correction, however, the correction to the true code is executed only in the case of $\Sigma|e_j| \le \epsilon$. In other cases, the error quantities on various codes, that is, fail-corrected errors are obtained, which contain the error on the true code.

The scan with 2 selections of $\eta$ increases the conversions for collection to $J_+$ in a distribution of errors on 3 or more code word components. Accordingly, the correctable cases can be increased reliably though the types of distributions additionally correctable are not obvious.

In the case of 3 roots or above, it is not possible to execute the conversion to $J_+$, for $\epsilon$ errors or below, in all the cases where the conventional Euclid method can be applied to seek a solution searching polynomial. Therefore, they cannot be dealt with the syndrome converting method. If the patterns of the error quantities on the error components are analogous to each other, they have no difference and they can be dealt easily with the syndrome converting method even in the case of 3 or more roots. This point provides a large merit.

If the quantity of errors in each memory cell is analogous as in the p-adic cells, the scale of processing and the computation can be made simpler and effective as the on-chip system.

Naturally, the syndrome converting method and the conventional Euclid method can be used together to improve the range of correctable error distributions. The Euclid method, however, uses complicated operation processing and circuits and accordingly impairs the achievement of simpler circuit scales and faster processing. The Euclid method can be used directly in solution searching in the memory system using the Lee metric code naturally.

[Configuration of p-adic Memory System]

The following description is given to the memory system according to the present embodiment using the Lee metric code in the "p-adic Zp world".

Figure 55:
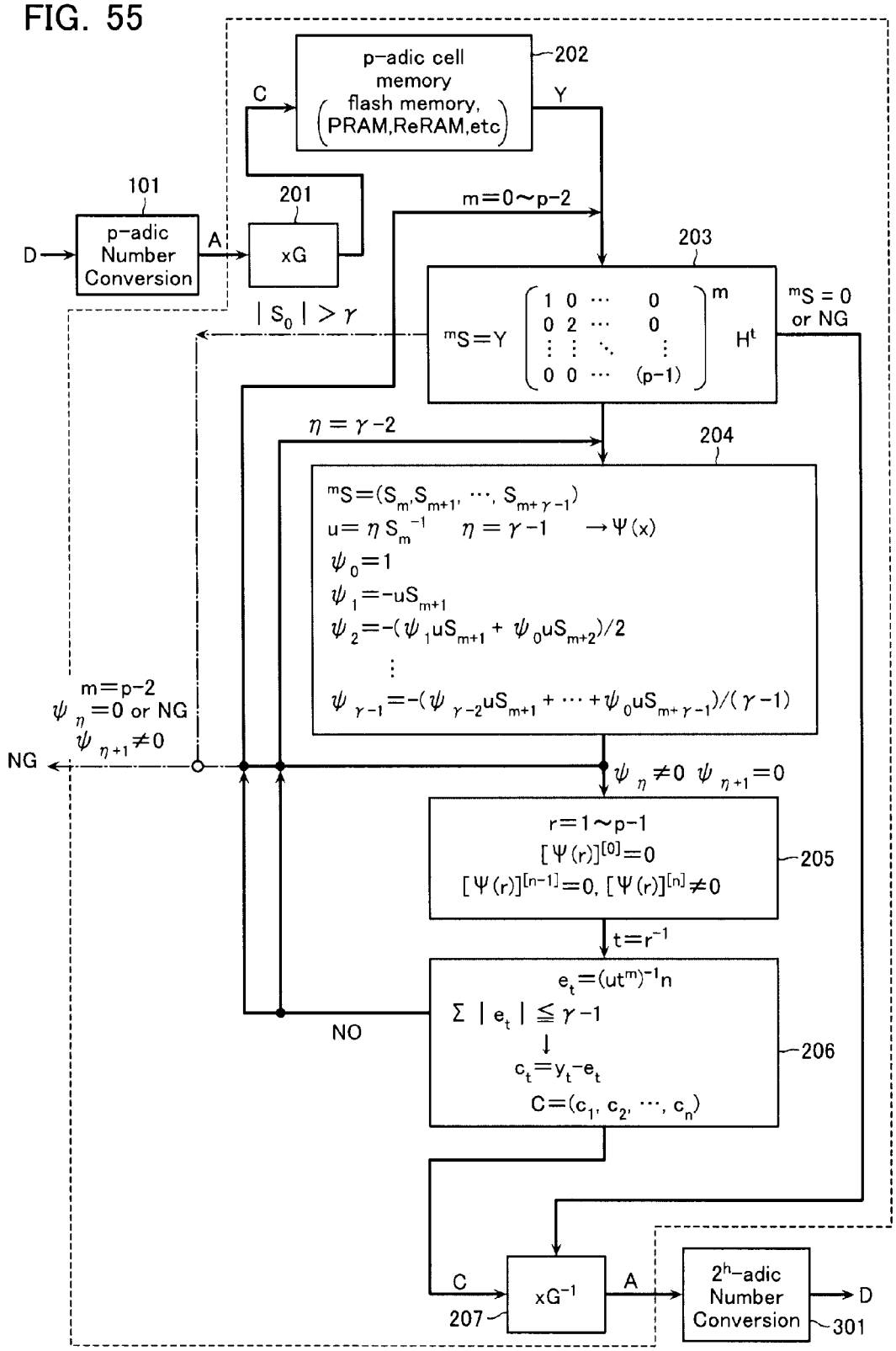
FIG. 55 is a block diagram of the memory system according to the embodiment.

FIG. 55 is a block diagram of the memory system according to the present embodiment.

In the "p-adic Zp world", the largest merit of the memory system is present in the point that ECC using the Lee metric code can be used. Therefore, the memory system is configured on the premise of the use of ECC.

The present memory system is roughly divided into 3 parts: a part operative to execute processing at the entrance to the "p-adic Zp world"; apart operative to execute processing in the "p-adic Zp world"; and a part operative to execute processing at the exit from the "p-adic Zp world".

The part operative to execute processing at the entrance to the "p-adic Zp world" includes a p-adic converter unit 101. The p-adic converter unit 101 is contained in a code generator unit together with a later-described encoder unit 201. Binary data D input to the "binary world" is first converted at the p-adic converter unit 101 to a p-adic number and provided as data A to the "p-adic Zp world".

The part operative to execute processing in the "p-adic Zp world" includes an encoder unit 201, a p-adic cell memory unit 202, an error detection/correction unit (203-206), and a decoder unit 207.

The encoder unit 201 receives the data A fed from the p-adic converter unit 101 and makes a generator matrix G react with the data A to yield a Lee metric code, which is then stored and held as a write code C in the p-adic cell memory unit 202.

The p-adic cell memory unit 202 is a large storage capacity memory such as a flash memory, a PRAM and a ReRAM.

At the time of reading data from the p-adic cell memory, the coded data C containing errors is read out as a read code Y.

A syndrome generator unit 203 executes the computation of the syndrome $^mS$ by multiplying a syndrome matrix H by the m-th power of the number of coordinates at the position, in accordance with the positions of code word symbols, using the diagonal matrix shown in Expression 50.

$$^mS = Y \begin{bmatrix} 1 & 0 & \cdots & 0 \\ 0 & 2 & \cdots & 0 \\ \vdots & \vdots & \ddots & \vdots \\ 0 & 0 & \cdots & (p-1) \end{bmatrix}^m H^t \quad \text{[Expression 50]}$$

If m=0, no error arises in the case of $^mS=0$. Accordingly, for the purpose of executing the final processing step in the "p-adic Zp world", the code Y is fed to the decoder unit 207. In the case of $^mS \neq 0$, on the other hand, if the first component $S_0$ of $^mS$ in the case of m=0 satisfies $|S_0| > \gamma$, reliable error correction is impossible. Accordingly, NG signal is provided and the error-containing code Y is fed to the decoder unit 207. In other cases, the syndrome $^mS$ is fed to a solution searching polynomial generator unit 204.

The solution searching polynomial generator unit 204 derives a solution searching polynomial $\Psi(x)$ from the syndrome $^mS$ with a setting of $\eta=\gamma-1$ and, if the coefficient at the $\eta$-th degree is $\phi_\eta \neq 0$, then it feeds the $\phi(x)$ to a Hasse differential polynomial generator unit 205. In the case of $\phi_\eta=0$, on the other hand, $\eta=\gamma-2$ is set to seek a polynomial $\Psi(x)$ again. If the coefficient at the ($\eta$+1)-th degree of the polynomial $\Psi(x)$ is $\phi_{\eta+1}=0$, and if the coefficient at the $\eta$-th degree of $\Psi(x)$ is $\phi_\eta \neq 0$, $\Psi(x)$ is the $\eta$ degree. Accordingly, $\Psi(x)$ is fed to the Hasse differential polynomial generator unit 205. On the other hand, if $\phi_\eta=0$, processing is repeated to seek the syndrome $^mS$ with increasing m by 1. If the coefficient at the n-th degree of $\Psi(x)$ is $\phi_n=0$ even when it is repeated until m reaches p−2, error correction is impossible. Accordingly, NG signal is provided and the error-containing code Y is fed to the decoder unit 207.

The Hasse differential polynomial generator unit 205 derives a Hasse differential polynomial from the input $\Psi(x)$, then computes a root r and the multiplicity n of the root, and feeds them as $t=r^{-1}$ to a code restorer unit 206.

The code restorer unit 206 uses the computed root r and the multiplicity n of the root to seek the positional coordinates of the error-caused code word and the error quantity $e_t$, thereby computing the total quantity $\Sigma|e_t|$ of Lee metrics of the error quantities. If it is equal to or below $\gamma-1$, the unit restores the code data C of the Lee metric code. If it is equal to or above $\gamma-1$, on the other hand, it is dealt as uncorrectable because there is the possibility of failed correction. In this case, for the purpose of processing the next $\eta$ or the next m, the flow shifts processing to the syndrome generator unit 203 or the solution searching polynomial generator unit 204. If $\eta=\gamma-2$ in the case of m=p−2, NG signal is provided and the flow shifts processing to the decoder unit 207.

The decoder unit 207 executes the inverse conversion of the generator matrix G over the code data C to obtain a p-adic number, thereby obtaining the code A. This code A is provided to the "binary world".

The part operative to execute processing at the exit from the "p-adic Zp world" includes a $2^h$-adic converter unit 301.

The $2^h$-adic converter unit 301 converts the code A to a $2^h$-adic number, that is, binary-represented output data. This is the restored binary data D.

Hereinafter, the circuitry of each block in the "p-adic Zp world" is described with specific examples shown.

FIG. 56A shows an example of circuitry of the encoder unit 201. FIG. 56B is a diagram showing double clocks ck and cl for use in control of the encoder unit 201.

As shown in FIG. 56B, the clocks cl are pulses that rise after the rise of ck with delays, and the clocks cl, (p−ϵ−2) pieces in total, $cl_0$-$cl_{p-\epsilon-3}$, rise sequentially at every clock ck. After $cl_{p-\epsilon-3}$ rises, the next clock ck rises with a delay. The same waveforms repeat from $ck_0$ to $ck_p$.

Among these clocks ck and cl, ck is applied to control a "Counter (1 to p−1)" circuit block and a "Ri (1 to p−1)" register unit, and cl to control an "X k-times" circuit block, a "Ro (0 to k−1)" register unit and a "Rgstr" register.

The "Counter (1 top−1)" circuit block is a circuit having an initial state of 0. It starts counting the number of clocks again at every rise of the clock ck and provides the number. Namely, of $ck_j$ (j=1 to p−1), it provides j to an "X k-times" circuit block at the rise of $ck_j$.

The "Ri (1 to p−1)" register unit includes registers operative to store components $c_j$ of the code word C and capable of storing (p−1) pieces of numerals in total. The "Ri (1 to p−1)" register unit stores numerals in the individual registers sequentially in sync with the timing of the rise of ck. Namely, data, that is, the element $c_j$ is taken into the register at the timing of the rise of $ck_{j+1}$. At the rise of $ck_p$, (p−1) pieces of elements $c_j$ are taken in the registers. In a word, the code C can be thus stored.

The "X k-times" circuit block is a circuit that multiplies the input by the output at every rise of the clock cl. The "X k-times" circuit block multiplies the output by the input j at every rise of cl, (p-ϵ-2)-times in total. Namely, the rises of cl$_i$ (i=0 to p-ϵ-3) bring the output from the "X k-times" circuit block to (j)$^{i+1}$. This output is fed to the "X Zp" circuit block.

The "Ro (0 to k-1)" register unit includes registers, which can store k pieces of numerals and, in the initial state, store k (=p-ϵ-2) pieces of components $a_0$-$a_{p-\epsilon-3}$ of the code A. The "Ro (0 to k-1)" register unit receives the clocks cl, and provides the components $a_0$-$a_{p-\epsilon-3}$ of the code A in order at every rise of the clock cl. Namely, on receipt of cl$_i$ (i=0 to p-ϵ-3), it provides $a_i$.

The "X Zp" circuit block is a circuit operative to execute a multiplication of the input in Zp. The "X Zp" circuit block receives the output (j)$^{i+1}$ from the "X k-times" circuit block and the output $a_i$ from the "Ro (0 to k-1)" register unit at every clock cl$_i$, and provides (j)$^{i+1}a_i$. The output numerals (j)$^{i+1}a_i$ are summed in a combination of the "h bit AD mod p" circuit block and the "Rgstr" register.

The "h bit AD mod p" circuit block is a circuit that seeks the sum of 2 input numerals modulo p. On the other hand, the "Rgstr" register is a register having an initial state of 0. It blocks any input from the "h bit AD mod p" circuit block at every input of the clock cl and feeds the self-holding contents to the "h bit AD mod p" circuit block. The connection of the "h bit AD mod p" circuit block with the "Rgstr" register as shown in FIG. 56A allows the previous output numeral to be given an addition of a numeral output from a new "X Zp" circuit block at every input of the clock cl. Namely, when the clock cl$_0$-cl$_{p-\epsilon-3}$ rises, the component $c_j$ of C after the conversion of the code A to the Lee metric code is provided in the cycle of the clock ck$_j$. This is held in the "Ri (1 to p-1)" register unit at the top in the cycle of the next ck$_{j+1}$. Thus, the code C converted from the code A can be obtained.

The following description is given to a product operating circuit contained in the "X Zp" circuit block shown in FIG. 56A.

At the start, the principle of a circuit operative to execute a multiplication of numerals in Zp is described.

When 2 numerals a and b in Zp are each represented in h-bit binary, the bits are represented as in Expression 51, and the product of the bits is represented by $M_{ab}$ of (h×h) elements.

$$a = A_0 + A_1 2 + A_2 2^2 + A_3 2^3 + \ldots + A_{h-2} 2^{h-2} + A_{h-1} 2^{h-1}$$

$$b = B_0 + B_1 2 + B_2 2^2 + B_3 2^3 + \ldots + B_{h-2} 2^{h-2} + B_{h-1} 2^{h-1} \quad \text{[Expression 51]}$$

Here, h denotes the minimum number of bits capable of representing p in binary.

There are listed 2 articles serving as the basis on the computation used.

(First Article) 0≤a, b≤p-1 establishes 0≤a/2+b≤3/2(p-1) <2(p-1). In a word, even if the process neglects the least significant bit in one of the h-bit binary-represented numerals in Zp, then shifts the digits by 1 digit to regard it as a (h-1)-bit binary number, and adds it to an h-bit represented numeral, the sum contains a single p at most. Therefore, when it is regarded as the sum modulo p, it can be represented in h-bit binary.

(Second Article) 0≤a≤p-1 establishes 2a+1≤2p-2+1=2p-1. In a word, even if the process adds the least significant bit to the h-bit binary-represented numeral to yield a (h+1)-bit number, the sum contains a single p at most. Therefore, when it is regarded as the sum modulo p, it can be represented in h-bit binary.

Therefore, these 2 articles are utilized for computations.

Figure 57:
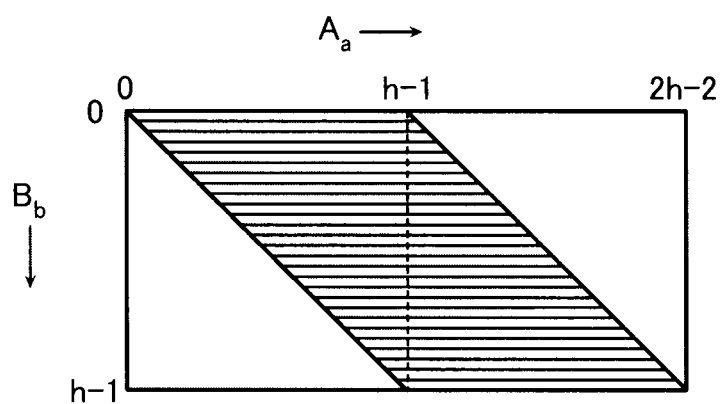
FIG. 57 is a diagram schematically showing the product operation processing at an "X Zp" circuit block in the memory system according to the embodiment.

Expression 52 shows a computation step group in the first half using the above first article in which the parts using the above first article are underlined. FIG. 57 is a diagram schematically showing the first-half computation step group.

[Expression 52]

$$(A_0 + A_1 2 + A_2 2^2 + A_3 2^3 + \ldots + A_{h-2} 2^{h-2} + A_{h-1} 2^{h-1}) \times \quad \text{(a)}$$
$$(B_0 + B_1 2 + B_2 2^2 + B_3 2^3 + \ldots + B_{h-2} 2^{h-2} + B_{h-1} 2^{h-1})$$

$$= M_{00} + 2\{(M_{10} + M_{20} 2 + M_{30} 2^2 + \ldots + M_{h-20} 2^{h-3} + M_{h-10} 2^{h-2}) + \quad \text{(b)}$$
$$(A_0 + A_1 2 + A_2 2^2 + A_3 2^3 + \ldots + A_{h-2} 2^{h-2} + A_{h-1} 2^{h-1}) \times$$
$$(B_1 + B_2 2 + \ldots + B_{h-1} 2^{h-2})\}$$

$$= M_{00} + 2\{(M_{10} + M_{20} 2 + M_{30} 2^2 + \ldots + M_{h-20} 2^{h-3} + M_{h-10} 2^{h-2}) \quad \text{(c)}$$
$$\underline{+ (M_{01} + M_{11} + M_{21} 2^2 + M_{31} 2^3 + \ldots + M_{h-21} 2^{h-2} + M_{h-11} 2^{h-1})}$$
$$+ (A_0 2 + A_1 2^2 + A_2 2^3 + \ldots + A_{h-2} 2^{h-1} + A_{h-1} 2^h) \times$$
$$(B_2 + B_3 2 + \ldots + B_{h-1} 2^{h-3})\}$$

$$\equiv M_{00} + 2\{(Q_0^0 + Q_1^0 2 + Q_2^0 2^2 + \ldots + Q_{h-2}^0 2^{h-2} + Q_{h-1}^0 2^{h-1}) + \quad \text{(d)}$$
$$(A_0 2 + A_1 2^2 + A_2 2^3 + \ldots + A_{h-2} 2^{h-1} + A_{h-1} 2^h) \times$$
$$(B_2 + B_3 2 + \ldots + B_{h-1} 2^{h-3})\}$$

$$= M_{00} + Q_0^0 2 + 2^2\{(Q_1^0 + Q_2^0 2 + \ldots + Q_{h-2}^0 2^{h-3} + Q_{h-1}^0 2^{h-2}) + \quad \text{(e)}$$
$$(A_0 + A_1 2 + A_2 2^2 + \ldots + A_{h-2} 2^{h-2} + A_{h-1} 2^{h-1}) \times$$
$$(B_2 + B_3 2 + \ldots + B_{h-1} 2^{h-3})\}$$

$$= M_{00} + Q_0^0 2 + 2^2\{(Q_1^0 + Q_2^0 2 + \ldots + Q_{h-2}^0 2^{h-3} + Q_{h-1}^0 2^{h-2}) + \quad \text{(f)}$$
$$\underline{(M_{02} + M_{12} 2 + M_{22} 2^2 + \ldots + M_{h-22} 2^{h-2} + M_{h-12} 2^{h-1})} +$$
$$(A_0 2 + A_1 2^2 + A_2 2^3 + \ldots + A_{h-2} 2^{h-1} + A_{h-1} 2^h) \times$$
$$(B_3 + \ldots + B_{h-1} 2^{h-4})\}$$

$$\equiv M_{00} + Q_0^0 2 + \quad \text{(g)}$$
$$2^2\{(Q_0^1 + Q_1^1 2 + \ldots + Q_{h-3}^1 2^{h-3} + Q_{h-2}^1 2^{h-2} + Q_{h-1}^1 2^{h-1}) +$$
$$(A_0 2 + A_1 2^2 + A_2 2^3 + \ldots + A_{h-2} 2^{h-1} + A_{h-1} 2^h) \times$$
$$(B_3 + \ldots + B_{h-1} 2^{h-4})\}$$

$$= M_{00} + Q_0^0 2 + Q_0^1 2^2 + \quad \text{(h)}$$
$$2^3\{(Q_1^1 + Q_2^1 2 + \ldots + Q_{h-2}^1 2^{h-3} + Q_{h-1}^1 2^{h-2}) + (A_0 + A_1 2 + A_2 2^2 +$$
$$\ldots + A_{h-2} 2^{h-2} + A_{h-1} 2^{h-1}) \times (B_3 + \ldots + B_{h-1} 2^{h-4})\}$$

$$= M_{00} + Q_0^0 2 + Q_0^1 2^2 + 2^3\{(Q_1^1 + Q_2^1 2 + \ldots + Q_{h-2}^1 2^{h-3} + Q_{h-1}^1 2^{h-2}) \pm \quad \text{(i)}$$
$$\underline{(M_{03} + M_{13} 2 + M_{23} 2^2 + \ldots + M_{h-23} 2^{h-2} + M_{h-13} 2^{h-1})} +$$
$$(A_0 2 + A_1 2^2 + A_2 2^3 + \ldots + A_{h-2} 2^{h-1} + A_{h-1} 2^h) \times$$
$$(B_4 + \ldots + B_{h-1} 2^{h-5})\}$$

$$\equiv M_{00} + Q_0^0 2 + Q_0^1 2^2 + \quad \text{(j)}$$
$$2^3\{(Q_0^2 + Q_1^2 2 + \ldots + Q_{h-3}^2 2^{h-3} + Q_{h-2}^2 2^{h-2} + Q_{h-1}^2 2^{h-1}) +$$
$$(A_0 2 + A_1 2^2 + A_2 2^3 + \ldots + A_{h-2} 2^{h-1} + A_{h-1} 2^h) \times$$
$$(B_4 + \ldots + B_{h-1} 2^{h-5})\}$$

$$= M_{00} + Q_0^0 2 + Q_0^1 2^2 + Q_0^2 2^3 + \quad \text{(k)}$$
$$2^4\{(Q_1^2 + Q_2^2 2 + \ldots + Q_{h-2}^2 2^{h-3} + Q_{h-1}^2 2^{h-2}) +$$
$$(A_0 + A_1 2 + A_2 2^2 + \ldots + A_{h-2} 2^{h-2} + A_{h-1} 2^{h-1}) \times$$
$$(B_4 + \ldots + B_{h-1} 2^{h-5})\}$$

$$\vdots$$

$$\equiv M_{00} + Q_0^0 2 + Q_0^1 2^2 + \ldots + \quad \text{(l)}$$
$$2^{h-2}\{(Q_0^{h-3} + Q_1^{h-3} 2 + \ldots + Q_{h-3}^{h-3} 2^{h-3} + Q_{h-2}^{h-3} 2^{h-2} + Q_{h-1}^{h-3} 2^{h-1}) +$$
$$(A_0 2 + A_1 2^2 + A_2 2^3 + \ldots + A_{h-2} 2^{h-1} + A_{h-1} 2^h) \times (B_{h-1})\}$$

$$= M_{00} + Q_0^0 2 + Q_0^1 2^2 + \ldots + Q_0^{h-3} 2^{h-2} + \quad \text{(m)}$$
$$2^{h-1}\{(Q_1^{h-3} + Q_2^{h-3} 2 + \ldots + Q_{h-2}^{h-3} 2^{h-3} + Q_{h-1}^{h-3} 2^{h-2}) +$$
$$(A_0 + A_1 2 + A_2 2^2 + \ldots + A_{h-2} 2^{h-2} + A_{h-1} 2^{h-1}) \times (B_{h-1})\}$$

-continued $$= M_{00} + Q_0^0 2 + Q_0^1 2^2 + \ldots + Q_0^{h-3} 2^{h-2} + \\ 2^{h-1} \{(Q_1^{h-3} + Q_2^{h-3} 2 + \ldots + Q_{h-2}^{h-3} 2^{h-3} + Q_{h-1}^{h-3} 2^{h-2}) \pm \\ (M_{0h-1} + M_{1h-1} 2 + M_{2h-1} 2^2 + \ldots + M_{h-2h-1} 2^{h-2} + M_{h-1h-1} 2^{h-1})\}$$ (n)

$$\equiv M_{00} + Q_0^0 2 + Q_0^1 2^2 + \ldots + Q_0^{h-3} 2^{h-2} + \\ 2^{h-1} (\underline{Q_0^{h-2} + Q_1^{h-2} 2 + \ldots + Q_{h-3}^{h-2} 2^{h-3} + Q_{h-2}^{h-2} 2^{h-2} + Q_{h-1}^{h-2} 2^{h-1}})$$ (o)

At the 1st step in the first-half computation step group, the process first extracts the least significant bit $M_{00}$ from the resultant h-bit numbers modulo p and then applies 2 to bind the remaining numbers as shown in the equation (b) in Expression 52.

Subsequently, from the term bound by 2, the process executes a multiplication of the least significant bit $B_0$ in the multiplying number b and the multiplied number a to create a (h+1)-bit number $(M_{10}+M_{20}+ \ldots +M_{h-1\cdot 0} 2^{h-2})$ as shown in Expression 52 (b). At the same time, the process executes a multiplication of the least significant bit $B_1$ in the multiplying number b and the multiplied number a at this moment to create an h-bit number $(M_{01}+M_{11} 2+ \ldots +M_{h-1\cdot 0} 2^{h-2})$ as shown in the equation (c) in Expression 52.

Finally, the number $(M_{10}+M_{20}+ \ldots +M_{h-1\cdot 0} 2^{h-2})$ is added to the number $(M_{01}+M_{11} 2+ \ldots +M_{h-1\cdot 1} 2^{h-1})$ to create a new h-bit number $(Q^0_0+Q^0_1 2+ \ldots +Q^0_{h-1} 2^{h-1})$ as shown in the equation (d) in Expression 52.

Thereafter, similar computation steps are repeated until the process obtains an h-bit number $(Q^{h-2}_0+Q^{h-2}_1 2+ \ldots + Q^{h-2}_{h-1} 2^{h-1})$ through multiplications of the least significant bit $B_{h-1}$ in the multiplying number b and the multiplied number A as shown in the equation (o) in Expression 52.

Expression 53 shows a computation step group in the second half using the above second article in which the parts using the above second article are double-underlined. The equation (p) in Expression 53 follows the equation (o) in Expression 52.

[Expression 53]

$$= M_{00} + Q_0^0 2 + Q_0^1 2^2 + \ldots + Q_0^{h-4} 2^{h-3} + 2^{h-2} \\ \{\underline{Q_0^{h-3} + 2(Q_0^{h-2} + Q_{h-4}^{h-2} 2^{h-4} + Q_{h-3}^{h-2} 2^{h-3} + Q_{h-2}^{h-2} 2^{h-2} + Q_{h-1}^{h-2} 2^{h-1})}\}$$ (p)

$$\equiv M_{00} + Q_0^0 2 + Q_0^1 2^2 + \ldots + Q_0^{h-4} 2^{h-3} + \\ 2^{h-2} (\underline{Q_0^{h-1} + Q_1^{h-1} 2 + \ldots + Q_{h-2}^{h-1} 2^{h-2} + Q_{h-1}^{h-1} 2^{h-1}})$$ (q)

$$= M_{00} + Q_0^0 2 + Q_0^1 2^2 + \ldots + Q_0^{h-5} 2^{h-4} + \\ 2^{h-3} \{\underline{Q_0^{h-4} + 2(Q_0^{h-1} + \ldots + Q_{h-2}^{h-1} 2^{h-2} + Q_{h-1}^{h-1} 2^{h-1})}\}$$ (r)

$$\equiv M_{00} + Q_0^0 2 + Q_0^1 2^2 + \ldots + Q_0^{h-5} 2^{h-4} + \\ 2^{h-3} (\underline{Q_0^h + Q_1^h 2 + \ldots + Q_{h-2}^h 2^{h-2} + Q_{h-1}^h 2^{h-1}})$$ (s)

$$\vdots$$

$$= M_{00} + 2(\underline{Q_0^{2h-4} + Q_1^{2h-4} 2 + \ldots + Q_{h-2}^{2h-4} 2^{h-2} + Q_{h-1}^{2h-4} 2^{h-1}})$$ (t)

$$\equiv 2^0 (\underline{Q_0^{2h-3} + Q_1^{2h-3} 2 + \ldots + Q_{h-2}^{2h-3} 2^{h-2} + Q_{h-1}^{2h-3} 2^{h-1}})$$ (u)

The second-half step group is applied to obtain numerals equal to or below p by subtracting p from the (2h−1)-bit number obtained in the first-half step group.

At the start, the process applies $2^{h-2}$ to bind the (h+1)-bit numbers, $Q^{h-3}_0 2^{h-2}+2^{h-1}(Q^{h-2}_0+Q^{h-2}_1 2+ \ldots +Q^{h-2}_{h-1} 2^{h-1})$, from the most significant bit of the (2h−1)-bit number obtained in the first-half step group shown by the equation (o) in Expression 53. This result provides the equation (p) in Expression 53.

Subsequently, the process subtracts p from the (h+1)-bit binary-represented number, $Q^{h-3}_0+2(Q^{h-2}_0+ \ldots +Q^{h-2}_{h-1} 2^{h-1})$, shown in the equation (p) in Expression 53 to obtain an h-bit number $(Q^{h-1}_0+Q^{h-1}_1 2+ \ldots +Q^{h-1}_{h-1} 2^{h-1})$ as shown in the equation (q) in Expression 53.

Thereafter, similar computation steps are repeated with decreasing the number of bits. Then, the process terminates after it obtains an h-bit number shown in the equation (u) in Expression 53.

When all the computation steps shown in Expressions 52 and 53 complete, the result of multiplications of numerals in Zp provides the h-bit product.

Figure 58:
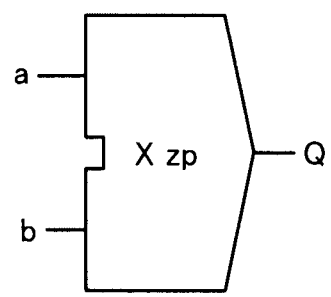
FIG. 58 is a diagram showing a circuit symbol of the "X Zp" circuit block in the memory system according to the embodiment.
Figure 60:
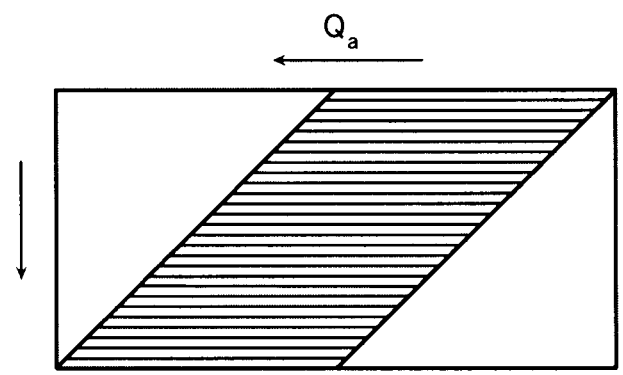
FIG. 60 is a diagram schematically showing the operation processing at the "X Zp" circuit block in the memory system according to the embodiment.

FIG. 58 is a diagram showing a general circuit symbol of the "X Zp" circuit block. FIG. 59 is a block diagram of the "X Zp" circuit block. FIG. 60 is a diagram schematically showing operational processing in accordance with the circuitry shown in FIG. 59.

The "X Zp" circuit block is roughly divided into a circuit for processing a computation step group in the first half shown in Expression 52, and a circuit for processing a computation step group in the second half shown in Expression 53.

The circuit for processing the first-half computation step group includes an AND gate G1, and (h−1) "h bit AD mod p" circuit blocks.

The AND gate G1 yields the logical product of the i-th bit (i=0 to h−1) of the multiplied numeral a and the j-th bit (j=0 to h−1) of the multiplying numeral b, and provides it as $M_{ij}$.

The "h bit AD mod p" circuit block is a circuit operative to seek the sum of 2 numerals in Zp modulo p. The "h bit AD mod p" circuit block has the inputs $A_0$-$A_{h-1}$ and $B_0$-$B_{h-1}$ and the outputs $Q_0$-$Q_{h-1}$.

The 1st "h bit AD mod p" circuit block <1> receives $M_{10}$-$M_{h-1\cdot 0}$, '0', $M_{01}$-$M_{h-1\cdot 1}$ at $A_0$-$A_{h-2}$, $A_{h-1}$ and $B_0$-$B_{h-1}$, and provides $Q^0_0$-$Q^0_{h-1}$ from $Q_0$-$Q_{h-1}$, respectively.

The 2nd "h bit AD mod p" circuit block <2> receives $Q^0_1$-$Q^0_{h-1}$, that is, the output from the "h bit AD mod p" circuit block <1>, '0', and $M_{02}$-$M_{h-1\cdot 2}$ at $A_0$-$A_{h-2}$, $A_{h-1}$ and $B_0$-$B_{h-1}$, and provides $Q^1_0$-$Q^1_{h-1}$ from $Q_0$-$Q_{h-1}$, respectively.

As described above, the circuit for processing the first-half computation step group includes the "h bit AD mod p" circuit block <1> through the "h bit AD mod p" circuit block <h−1>, of which inputs and outputs are connected in order.

The circuit for processing the second-half computation step group includes (h−1) pieces of "h+1 bit mod p" circuit blocks. The "h+1 bit mod p" circuit block is the circuit shown in FIGS. 6 and 7.

The 1st "h+1 bit mod p" circuit block <1> receives $Q^{h-3}_0$ and $Q^{h-2}_0$-$Q^{h-2}_{h-1}$ at $A_0$ and $A_1$-$A_h$, and provides $Q^{h-1}_0$-$Q^{h-1}_{h-1}$ from $Q_0$-$Q_{h-1}$, respectively.

The 2nd "h+1 bit mod p" circuit block <2> receives $Q^{h-4}_0$ and $Q^{h-1}_0$-$Q^{h-1}_{h-1}$ at $A_0$ and $A_1$-$A_h$, and provides $Q^h_0$-$Q^h_{h-1}$ from $Q_0$-$Q_{h-1}$, respectively.

As described above, the circuit for processing the second-half computation step group includes the "h+1 bit mod p" circuit blocks <1>-<h−1>, of which inputs and outputs are connected in order.

All the circuits operate not in sync with clocks and decide the output Q when the input $M_{ab}$ is given.

Mention is made here of the circuit scale of the "X Zp" circuit block.

For example, p=17 results in h=5. In this case, the "X Zp" circuit block can be configured with h−1=4 pieces of "h bit AD mod p" circuit blocks and h−1=4 pieces of "h+1 bit mod p" circuit blocks. This means that the "X Zp" circuit block has a smaller circuit scale.

There is a requirement for (2h−2) pieces of such "X Zp" circuit blocks.

Figure 61:
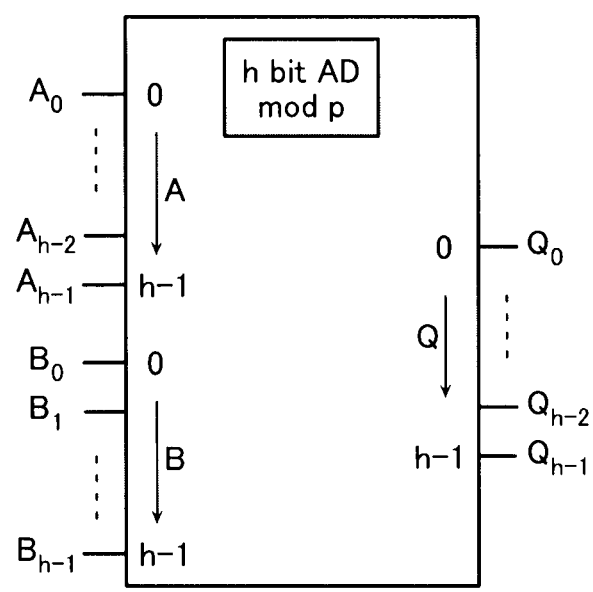
FIG. 61 is a diagram showing a circuit symbol of a "h bit AD mod p" circuit block in the memory system according to the embodiment.

Next, the "h bit AD mod p" circuit block shown in FIG. 61 is described in detail.

FIG. 61 shows a circuit symbol of the "h bit AD mod p" circuit block.

The "h bit AD mod p" circuit block seeks the sum of numerals a and b input from A and B, and provides the residue modulo a prime p of the resultant sum, from Q.

A consideration is given to the case of h=7, p=79. In this case, the numerals a, b, the prime p and the binary representation Q of the residue establish a relation shown in Expression 54.

$$a = A_0 + A_1 2 + A_2 2^2 + A_3 2^3 + A_4 2^4 + A_5 2^5 + A_6 2^6$$

$$b = B_0 + B_1 2 + B_2 2^2 + B_3 2^3 + B_4 2^4 + B_5 2^5 + B_6 2^6$$

$$p = 79 = 9^2 - 2 = 2^6 + 2^3 + 2^2 + 2^1 + 1, \text{ a complement of } p = 2^7 - p = 2^5 + 2^4 + 1 = 49$$

$$a + b \equiv Q(\bmod p) \; (a + b = Q + PF0 \times p)$$

$$Q = Q_0 + Q_1 2 + Q_2 2^2 + Q_3 2^3 + Q_4 2^4 + Q_5 2^5 + Q_6 2^6 \quad \text{[Expression 54]}$$

Figure 62:
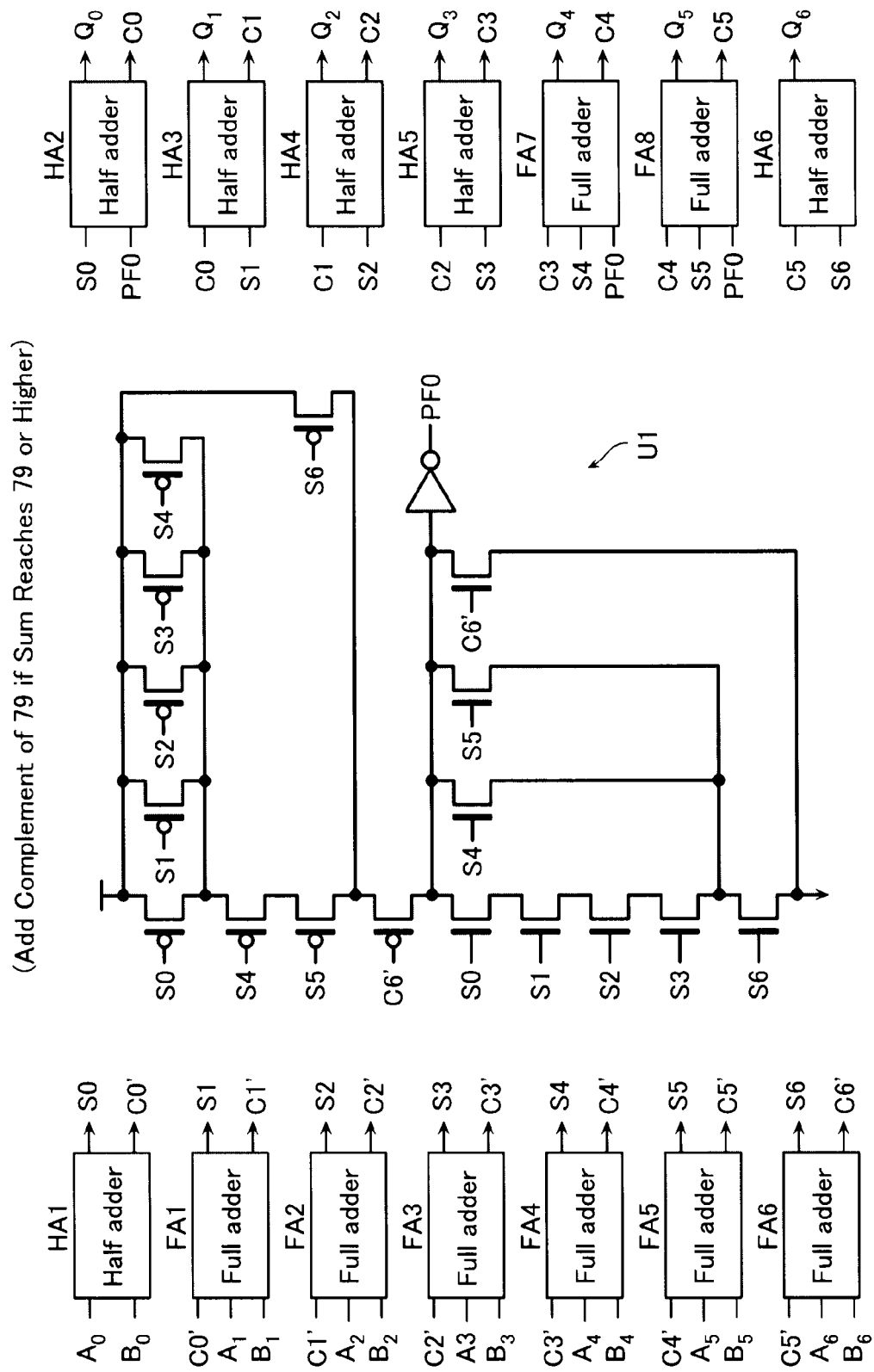
FIG. 62 is a circuit diagram of the "h bit AD mod p" circuit block in the memory system according to the embodiment.

FIG. 62 is a circuit diagram of the "h bit AD mod p" circuit block in the case of h=7, p=79.

The "h bit AD mod p" circuit block comprises a PF0 generator unit U1, 6 half adders HA1-HA6, and 8 full adders FA1-FA8.

The PF0 generator unit U1 is same as the PF0 generator unit U1 in the "h+1 bit mod p" circuit block shown in FIG. 7 and accordingly omitted from the following description.

The half adder HA1 has inputs $A_0$ and $B_0$, an output S0, and a carry output C0'. The full adder FA1 has inputs $A_1$ and $B_1$, a carry input C0', an output S1, and a carry output C1'. The full adder FA2 has inputs $A_2$ and $B_2$, a carry input C1', an output S2, and a carry output C2'. The full adder FA3 has inputs $A_3$ and $B_3$, a carry input C2', an output S3, and a carry output C3'. The full adder FA4 has inputs $A_4$ and $B_4$, a carry input C3', an output S4, and a carry output C4'. The full adder FA5 has inputs $A_5$ and $B_5$, a carry input C4', an output S5, and a carry output C5'. The full adder FA6 has inputs $A_6$ and $B_6$, a carry input C5', an output S6, and a carry output C6'. The half adder HA2 has inputs $S_0$ and PF0, an output $Q_0$, and a carry output C0. The half adder HA3 has inputs C0 and S1, an output $Q_1$, and a carry output C1. The half adder HA4 has inputs C1 and S2, an output $Q_2$, and a carry output C2. The half adder HA5 has inputs C2 and S3, an output $Q_3$, and a carry output C3. The full adder FA7 has inputs S4 and PF0, a carry input C3, an output $Q_4$, and a carry output C4. The full adder FA8 has inputs S5 and PF0, a carry input C4, an output $Q_5$, and a carry output C5. The half adder HA6 has inputs C5 and S6, and an output $Q_6$.

In accordance with the above configuration, the PF0 generator unit U1 determines if the sum of binaries A and B input to the "h bit AD mod p" circuit block is equal to or higher than p=79. If the sum of binaries A and B is equal to or higher than p=79, the half adders HA2-HA6 and the full adders FA7, FA8 are used to add 49, a complement of 79 in 8-bit binary, to the sum of A and B in order to subtract 79 from the sum of A and B.

The "X k-times" circuit block shown in FIG. 56A is described.

Figure 63:
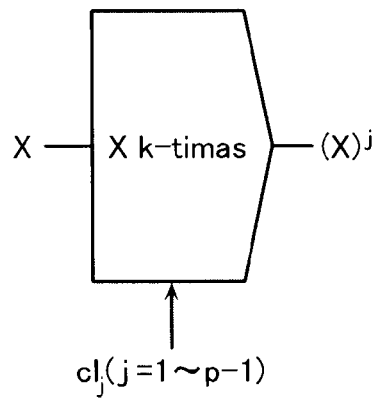
FIG. 63 is a diagram showing a circuit symbol of an "X k-times" circuit block in the memory system according to the embodiment.
Figure 64:
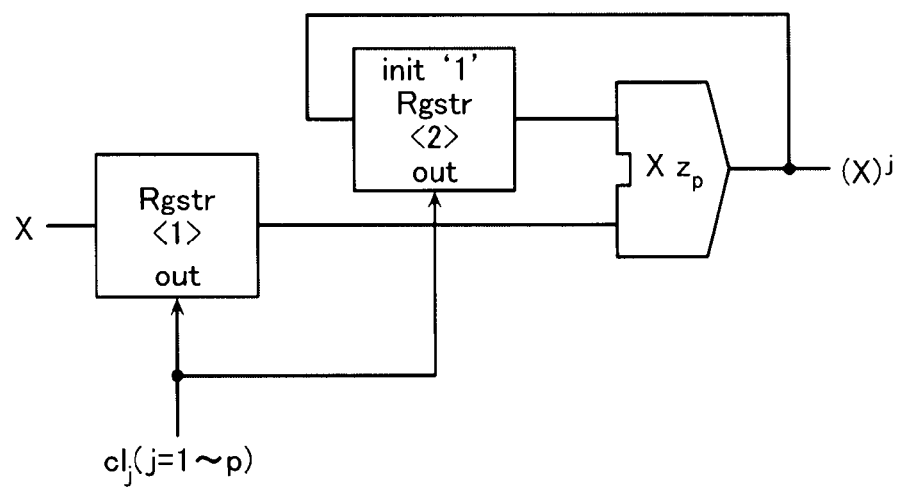
FIG. 64 is a block diagram of the "X k-times" circuit block in the memory system according to the embodiment.

FIG. 63 is a diagram showing a circuit symbol of the "X k-times" circuit block.

The "X k-times" circuit block is a circuit operative to compute a power $(X)^j$ of the input X, which is controlled by the clock $cl_j$ (j=1 to p−1).

The "X k-times" circuit block includes an "X Zp" circuit block, and a "Rgstr" register <1> and a "Rgstr" register <2> operable in sync with the clock cl.

The "Rgstr" register <1> has an input connected to X, and an output connected to one output of the "X Zp" circuit block. The "Rgstr" register <2> has an input connected to the output of the "X k-times" circuit block, and an output connected to one input of the "X k-times" circuit block. The "Rgstr" register <2> holds '1' in the initial state.

In accordance with this circuitry, the "X k-times" circuit block takes its own output with a 1-cycle delay to obtain the product of the input X and the output $(X)^j$.

The output $(X)^j$ is multiplied cumulatively by the input X at every input of the clock cl. The data X is set in the "Rgstr" register <1> before the clock $cl_j$ (j=1−k) rises, and the "Rgstr" register <2> having an initial state of '1' is brought into sync therewith, thereby obtaining $(X)^j$ at the j-th $cl_j$.

The following description is given to a circuit block operative to compute the m-th power of the element j in Zp frequently used in later-described operation processing. Hereinafter, this circuit block is referred to as a "$(j)^i$ (j=1 to p−1)" circuit block.

Figure 65:
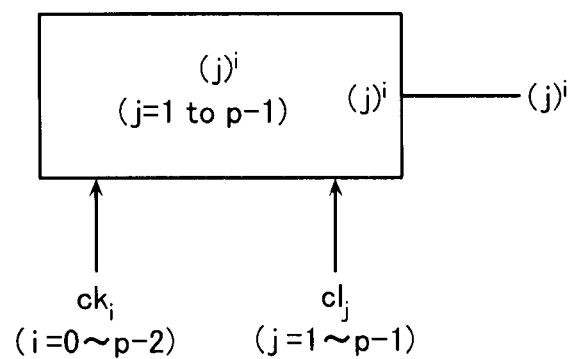
FIG. 65 is a diagram showing a circuit symbol of a "$(j)^i$ (j=1 to p−1)" circuit block in the memory system according to the embodiment.

FIG. 65 is a diagram showing a circuit symbol of the "$(j)^i$ (j=1 to p−1)" circuit block.

The "$(j)^i$ (j=1 to p−1)" circuit block is controlled by the clocks $ck_i$ (i=0 to p−2) and $cl_j$ (j=1 to p−1), and provides $(j)^i$ in sync with the rise of the clock $cl_j$.

Figure 66A:
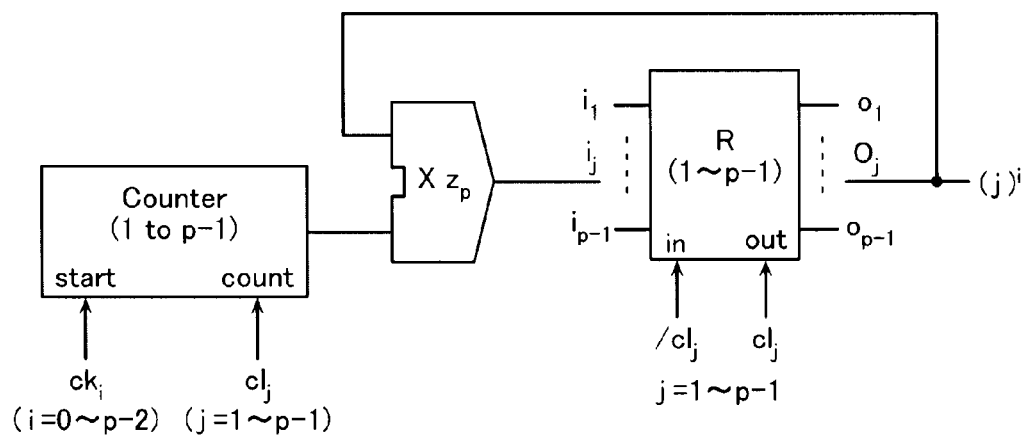
FIG. 66A is a block diagram of the "$(j)^i$ (j=1 to p−1)" circuit block in the memory system according to the embodiment.
Figure 66B:
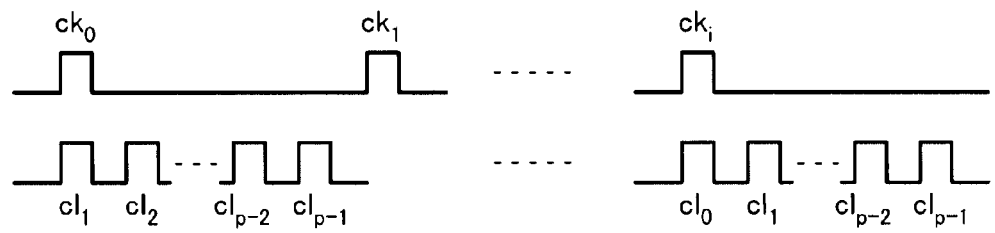
FIG. 66B is a timing chart of clocks for use in control of the "$(j)^i$ (j=1 to p−1)" circuit block in the memory system according to the embodiment.

FIG. 66A is a block diagram of the "$(j)^i$ (j=1 to p−1)" circuit block. FIG. 66B is a timing chart of the clocks $ck_i$ and $cl_j$ for use in control of the "$(j)^i$ (j=1 to p−1)" circuit block.

The "$(j)^i$ (j=1 to p−1)" circuit block is a circuit that computes the 0-th to (p−2)-th powers of all the elements 1 to p−1 in Zp other than zero in order, and holds them in registers.

The "$(j)^i$ (j=1 to p−1)" circuit block includes an "X Zp" circuit block, a "Counter (1 to p−1)" circuit block, and a "Ro (1 to p−1)" register unit as shown in FIG. 66A.

The index-decidable clock is $ck_i$, and an index i can be decided by the order of the clock $ck_i$. On the other hand, the elements in Zp are designated in order from 1 by the clock cl, and the order j of the clock $cl_j$ indicates the number of elements.

The "Counter (1 to p−1)" circuit block is connected to one input of the "X Zp" circuit block. It uses $ck_i$ as the start signal and counts up at the timing of the rise of $cl_j$ within a range of 1 to p−1.

The "Ro (1 to p−1)" register unit includes (p−1) pieces of registers, and it stores inputs $i_1$-$i_{p-1}$ in Nos. 1 to p−1 registers in order at the rise of the clock/$cl_j$ at in, and provides the contents $i_1$ to $i_{p-1}$ of Nos. 1 to p−1 registers in order at the rise of the clock $cl_j$ at out.

As shown in FIG. 66A, the clocks ck and cl input to the "Counter (1 to p−1)" circuit block and the "Ro (1 to p−1)" register unit are synchronized with each other, and the output from the "Ro (1 to p−1)" register unit is multiplied by the output from the "Counter (1 to p−1)" circuit block at the "X Zp" circuit block. In this case, after the clock $ck_i$ rises, the "X Zp" circuit block provides $(j)^i$ at every rise of $cl_j$.

The following description is given to an operating circuit operative to seek component elements of the syndrome $^mS$ in batch. Hereinafter, this operating circuit is referred to as the "syndrome component element generating circuit".

Scanning m within a range of 0 to p−2 requires ε pieces of $S_0$ to $S_{p-2+\epsilon}$ as the components of the syndrome $^mS$. An operation processing equation required for creation of the components of the syndrome $^m S$ is shown in Expression 55.

$$^m S = Y \begin{bmatrix} 1 & 0 & \cdots & 0 \\ 0 & 2 & \cdots & 0 \\ \vdots & \vdots & \ddots & \vdots \\ 0 & 0 & \cdots & (p-1) \end{bmatrix}^m H^t \quad \text{[Expression 55]}$$

$$S_0 = \sum_{j=1}^{p-1} y_i = \sum_{j=1}^{p-1} e_j$$

$$S_{m+1} = \sum_{j=1}^{p-1} (j)^{m+1} y_j = \sum_{j=1}^{p-1} (j)^{m+1} e_j$$

Figure 67A:
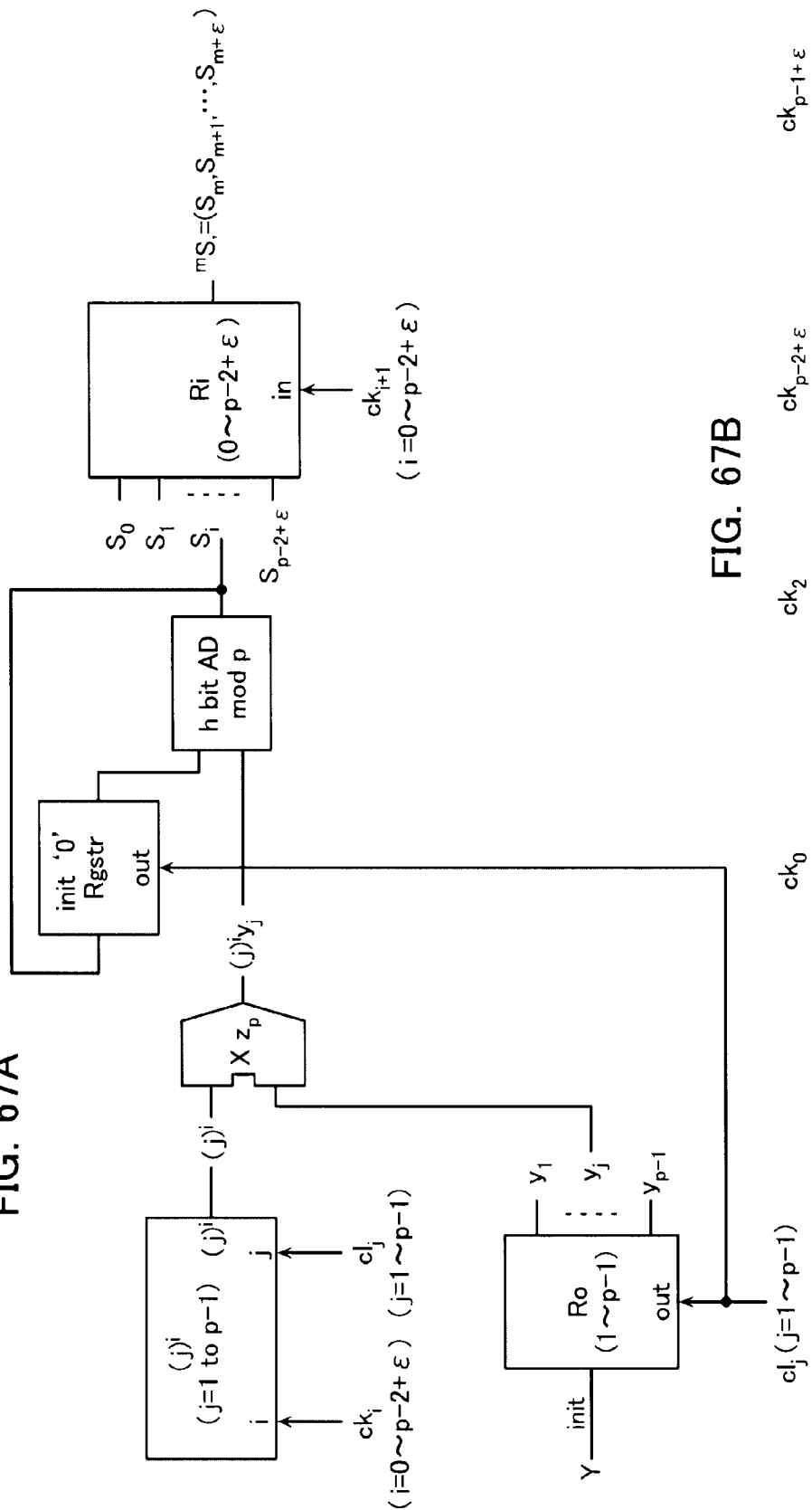
FIG. 67A is a block diagram of an operating circuit operative to derive component elements of a syndrome in the memory system according to the embodiment.
Figure 67B:
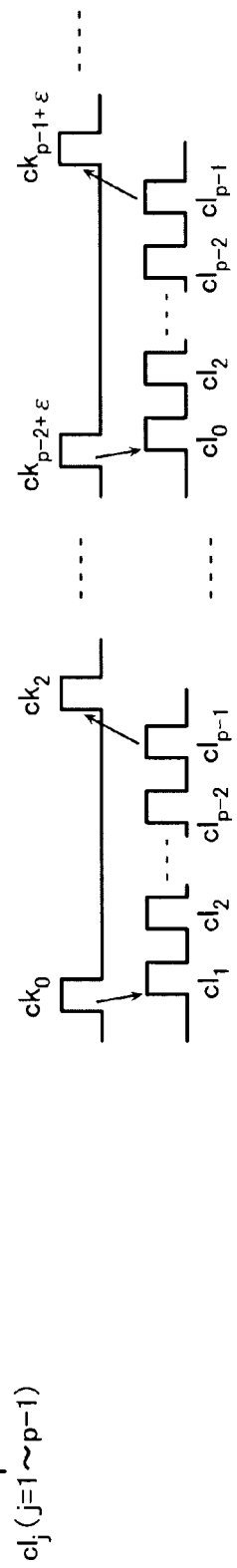
FIG. 67B is a timing chart of clocks for use in control of the operating circuit operative to derive component elements of the syndrome in the memory system according to the embodiment.

FIG. 67A is a block diagram of the syndrome component element generating circuit, and FIG. 67B is a timing chart of the clocks $ck_i$ (i=0 to p−2+ε), $cl_j$ (j=1 to p−1) for use in control of the syndrome component element generating circuit.

The syndrome component element generating circuit includes, as shown in FIG. 67A, a "Ro (1 to p−1)" register unit, a "$(j)^i$ (j=1 to p−1)" circuit block, an "X Zp" circuit block, an "h bit AD mod p" circuit block, a "Rgstr" register, and a "Ri (0 to p−2+ε)" register unit.

Data Y read out of the p-adic cell array is stored in the "Ro (1 to p−1)" register as the initial setting. The "$(j)^i$ (j=1 to p−1)" circuit block generates $(j)^i$. These "Ro (1 to p−1)" register and "$(j)^i$ (j=1 to p−1)" circuit block are synchronized with each other by the clock $cl_i$ and controlled such that $(j)^i$ is provided at the same time as the output of the component $y_j$ of Y. The "X Zp" circuit block yields the product thereof, $(j)^i y_j$, which is summed, in sync with the clock $cl_j$ (j=1 to p−1), through the loop including the "h bit AD mod p" circuit block and the "Rgstr" register, to create a syndrome component $S_i$. The resultant $S_i$ is stored in the i-th register in the Ri (0 to p−2+ε) register at the clock $ck_{i+1}$. This process is treated at the clock $ck_i$ for i=0 to p−2+ε to obtain all syndrome components, which are then stored in the "Ri (0 to p−2+ε)" register unit.

The following description is given to an operating circuit for seeking a solution searching polynomial $\Psi(x)$. This operating circuit is referred to as the "solution searching polynomial generating circuit".

A processing equation is shown in Expression 56, which is required in operational processing for deriving a coefficient $\phi_j$ at each degree j of x in the solution searching polynomial $\Psi(x)$.

$$\Psi(x) = 1 + \sum_{j=1}^{ } \psi_j x^j, \quad \text{[Expression 56]}$$

$$\psi_j = -\frac{u}{j} \sum_{i=1}^{j} \psi_{j-1} S_{m+i}$$

Figure 68:
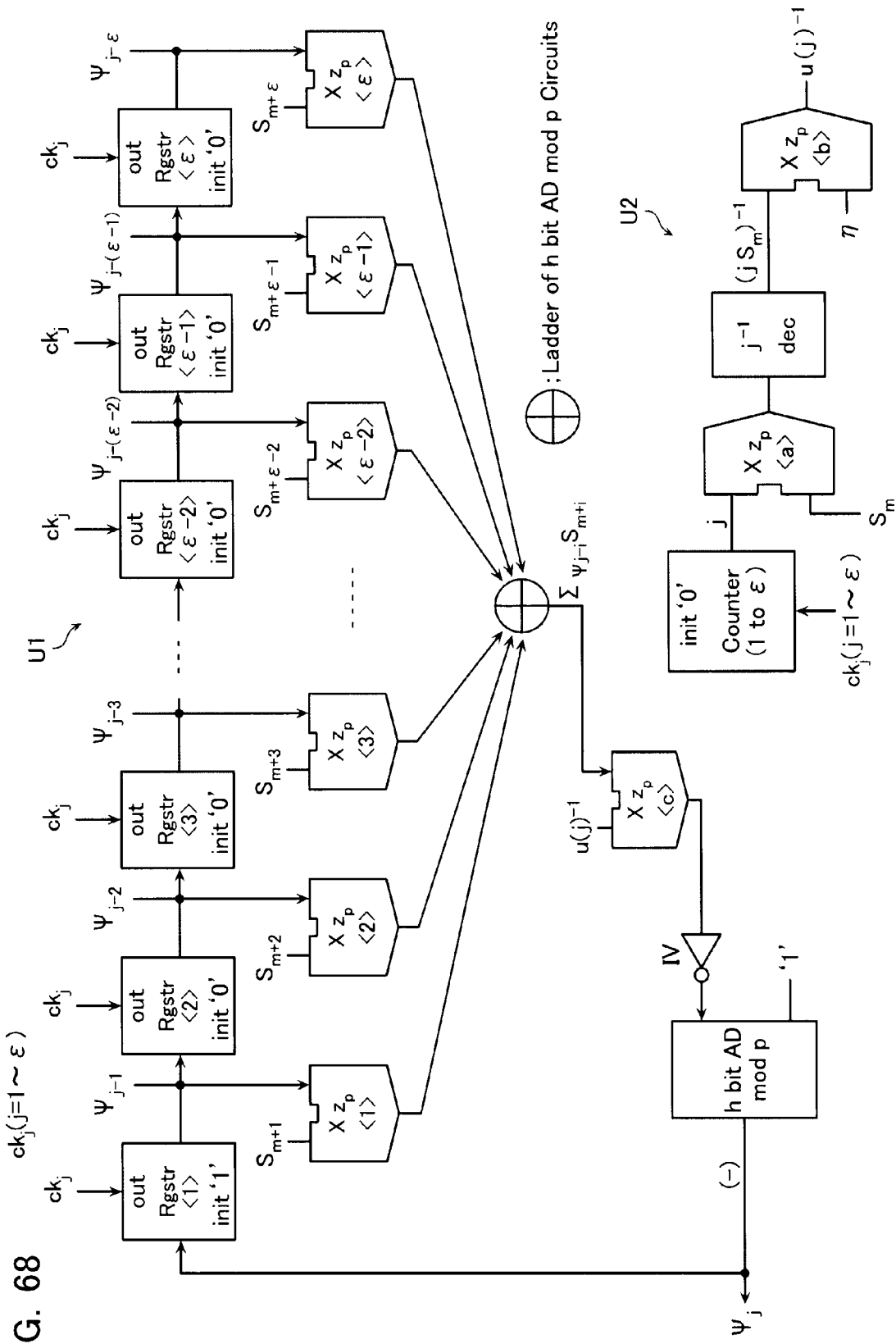
FIG. 68 is a block diagram of an operating circuit operative to derive a solution searching polynomial in the memory system according to the embodiment.

FIG. 68 is a block diagram of the solution searching polynomial generating circuit.

The solution searching polynomial generating circuit is a circuit for use in the step of error searching with the use of a syndrome $uS=(uS_m, uS_{m+1}, \ldots, uS_{m+\epsilon})$.

The solution searching polynomial generating circuit allows a simple circulation circuit to generate the solution searching polynomial $\Psi(x)$ without using a complicated Euclidean method.

The solution searching polynomial generating circuit comprises a first part circuit U1 for deriving $\Sigma \phi_{j-1} S_{m+i}$ on the right side of the 2nd equation shown in Expression 56, and a second part circuit U2 for deriving $-u(j)^{-1}$ on the right side of the 2nd equation shown in Expression 56 as well.

The first part circuit U1 includes (ε−1) pieces of serially connected "Rgstr" registers <1>-<ε>, and (ε−1) pieces of "X Zp" circuit blocks <1>-<ε> connected to the nodes between the "Rgstr" registers, respectively.

The "Rgstr" register <1> has an initial value of '1' and other "Rgstr" registers <2>-<ε> have an initial value of '0'.

The first part circuit U1 is controlled by the clock ck fed to the "Rgstr" registers, and provides the coefficients $\phi_{j-1}$, $\phi_{j-2}, \ldots, \phi_{j-(\epsilon-1)}, \phi_{j-\epsilon}$ at the respective degrees from the nodes between the "Rgstr" registers at the rise of the j-th clock $ck_j$. A node with no coefficient present is at '0' and accordingly cannot contribute to the product operation with the syndrome components, $S_{m+1}$ to $S_{m+\epsilon}$, executed by the "X Zp" circuit blocks <1>-<ε>. The outputs from the X Zp" circuit blocks <1>-<ε> are summed 2 by 2 at the "h bit AD mod p" circuit blocks, and a ladder of these "h bit AD mod p" circuit blocks is applied to finally obtain $\Sigma \phi_{j-1} S_{m+i}$.

The second part circuit U2 comprises a "Counter (1 to ε)" circuit block, "X Zp" circuit blocks <a>, <b>, and a "$j^{-1}$ dec" circuit block.

The second part circuit U2 generates $(jS_m)^{-1}$ from j generated at the "Counter (1 to ε)" circuit block and the syndrome component $S_m$, in accordance with the clock $ck_j$, at the "X Zp" circuit block <a> and the "$j^{-1}$ dec" circuit block. Then, the "X Zp" circuit block <b> derives $u(j)^{-1}$ from the generated $(jS_m)^{-1}$ and the established η.

An "X Zp" circuit block <c> is used to multiply $\Sigma \phi_{j-1} S_{m+i}$, generated at the first part circuit U1, by $u(j)^{-1}$, generated at the second part circuit U2, to yield the coefficient $\phi_j$.

The coefficient $\phi_j$ is an h-bit binary, which is represented in complement to represent a negative number. Therefore, the output from the "X Zp" circuit block <c> is inverted through the inverter IV1, and '1' is added thereto at the "h bit AD mod p" circuit block, thereby obtaining an h-bit binary complement representation.

The "$j^{-1}$ dec" circuit block shown in FIG. 68 is a circuit operative to seek the inverse element $j^{-1}$ of an element j in Zp. The details of the "$j^{-1}$ dec" circuit block are described later.

The solution searching polynomial generating circuit described above is possible to provide the coefficients $\phi_j$–$\phi_{j-\epsilon}$ where j=ε on the respective nodes on receipt of ε-times inputs of the clock ck.

When used in an actual p-adic cell memory, 5 or 6 is selected as ε. Therefore, the number of circuit blocks required in the solution searching polynomial generating circuit is small and the circuit scale is sufficiently small in practice as can be considered.

If the degree of $\Psi(x)$ is coincident with η, it is required to derive the root of this $\Psi(x)$ and the associated multiplicity. Therefore, the following description is given to an operating circuit operative to compute a coefficient of the Hasse differential polynomial required in deriving the multiplicity of the root. Hereinafter, this operating circuit is referred to as the "Hasse differential polynomial coefficient generating circuit".

A relation between the coefficient of the Hasse differential polynomial, the coefficient, and the coefficient of $\Psi(x)$ is as shown in Expression 57.

$$\{\Psi(x)\}^{[i]} = \sum_{j=0}^{\varepsilon-i} \binom{j+i}{i} \psi_{j+i} x^j = \sum_{j=0}^{\varepsilon-i} \psi_j^{[i]} x^j \quad \text{[Expression 57]}$$

In a word, as can be found from Expression 57, the Hasse differential polynomial coefficient generating circuit multiplies the coefficient of $\Psi(x)$ by the binomial coefficient, generates the coefficient at each degree at every differential stage using the clocks ck and cl, and stores all the coefficients in the registers.

Figures 69A, 69B:
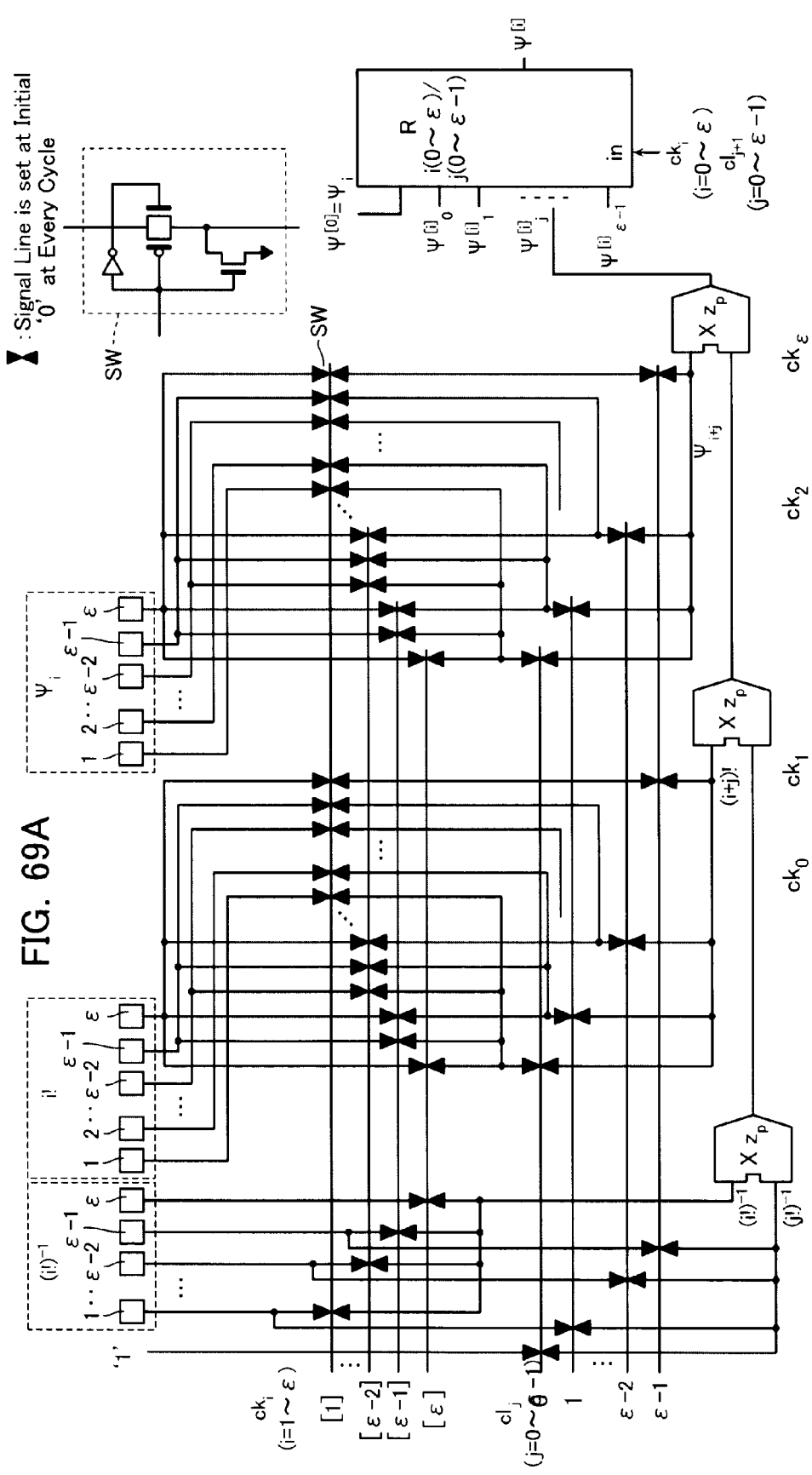
FIG. 69A is a block diagram of an operating circuit operative to derive coefficients of a Hasse differential polynomial in the memory system according to the embodiment.
FIG. 69B is a timing chart of clocks for use in control of the operating circuit operative to derive coefficients of the Hasse differential polynomial in the memory system according to the embodiment.

FIG. 69A is a block diagram of the Hasse differential polynomial coefficient generating circuit, and FIG. 69B is a timing chart of the clocks ck and cl for use in control of the Hasse differential polynomial coefficient generating circuit.

The Hasse differential polynomial coefficient generating circuit includes a "i!" table having a record of the factorial i! of each element i in Zp, a "(i!)$^{-1}$" table having a record of the inverse element, and a "$\phi_i$" table having a record of the coefficient $\phi_i$ of the solution searching polynomial $\Psi(x)$. As for the i!" table and "(i!)$^{-1}$" table, they can be suppressed to sufficiently small scales in practice, for example, in the case of p=17.

As for the "$\phi_i$" table, it is created in the Hasse differential polynomial coefficient generating circuit shown in FIG. 68. Therefore, this is used.

The Hasse differential polynomial coefficient generating circuit includes, as shown in FIG. 69A, the "i!" table, the "(i!)$^{-1}$" table, the "$\phi_i$" table, an "X Zp" circuit block, and control switches SW for switching the connections among those. Non-selected nodes, the nodes on the output side of the control switches SW, are discharged to '0' in the initial state, such that the result of the product operation executed by the "X Zp" circuit block indicates '0'.

The number of clocks of the clock ck corresponds to the number of differential stages, and i in ck$_i$ takes a value of 1-$\epsilon$. On the other hand, the clock cl corresponds to the degree, and a growth in number of differential stages increases undesired degrees. Therefore, it is not required to generate the clock cl every time by the same number as the clock ck though the circuit of FIG. 69A generates it $\epsilon$ times every time. Therefore, although there are $\epsilon^2$ storage timings, the "R i(0-$\epsilon$)/j(0 to $\epsilon$-1)" register unit is not required to include registers corresponding to all clocks but just required to include almost half registers.

For the purpose of storing the coefficients of $\Psi(x)$, that is, the coefficients corresponding to $\Psi^{[0]}$, previously in the registers, ck$_0$ is provided as a matter of convenience.

The following description is given to an operating circuit operative to compute the root and the associated multiplicity of the solution searching polynomial $\Psi(x)$. Hereinafter, this operating circuit is referred to as the "solution searching polynomial root/multiplicity operating circuit".

The solution searching polynomial root/multiplicity operating circuit regards the 0-th stage differential for the Hasse differential polynomial as $\Psi(x)$. Unless the Hasse differential polynomial is zero for each element in Zp, the circuit shifts the computation to the next element. The circuit increases the number of differential stages while the Hasse differential polynomial keeps zero. When registers are used to hold the number of the first Hasse differential stages where the Hasse differential polynomial is not zero, for each element in Zp, the element with the number of stages being not zero indicates the root, and the number of the remaining stages indicates the multiplicity of the root. In a word, when those with non-'0' contents are selected from the registers, the held value indicates the multiplicity of the root.

Specifically, when the root of the solution searching polynomial $\Psi(x)$ is denoted with $\alpha$, and a Hasse differential polynomial of $\Psi(x)$ in the i-th stage with $[\Psi(x)]^{[i]}$, a relational equation is given as in Expression 58 where the multiplicity of $\alpha$ is denoted with n.

$$[\Psi(\alpha)]^{[0]} = \Psi(\alpha) = 1 + \sum_{j=1}^{\varepsilon} \psi_j \alpha^j = 0 \quad \text{[Expression 58]}$$

$$[\Psi(\alpha)]^{[n-1]} = \sum_{j=0}^{\varepsilon-n+1} \psi^{[n-1]}{}_j \alpha^j = 0,$$

$$[\Psi(\alpha)]^{[n]} = \sum_{j=0}^{\varepsilon-n} \psi^{[n]}{}_j \alpha^j \neq 0$$

The solution searching polynomial root/multiplicity operating circuit seeks n as in Expression 58 for each element $\alpha$ in Zp regardless of whether it is the root of $\Psi(x)$ or not. In the case of n=0, it means that $\alpha$ is not a root.

Figure 70A:
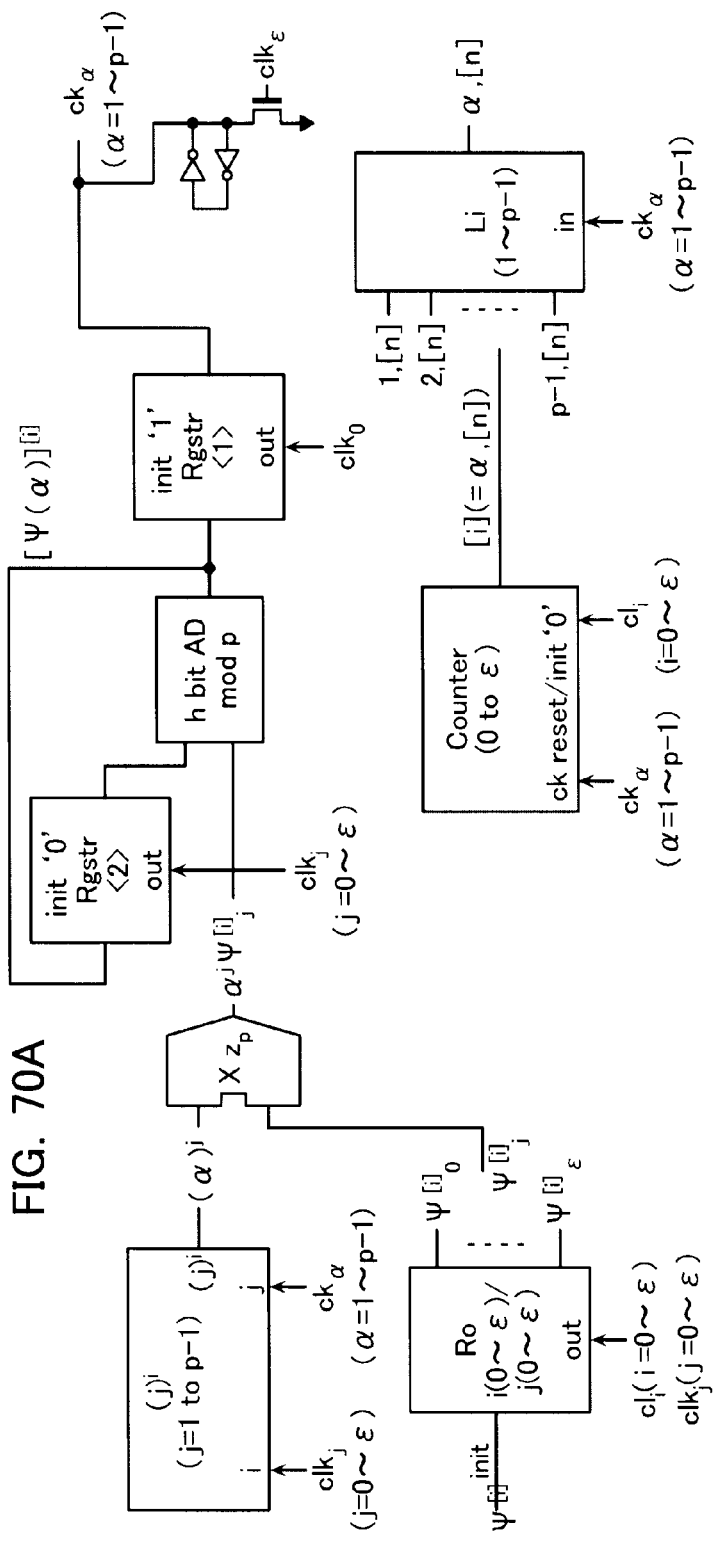
FIG. 70A is a block diagram of an operating circuit operative to derive a root of the solution searching polynomial and the associated multiplicity in the memory system according to the embodiment.
Figure 70B:
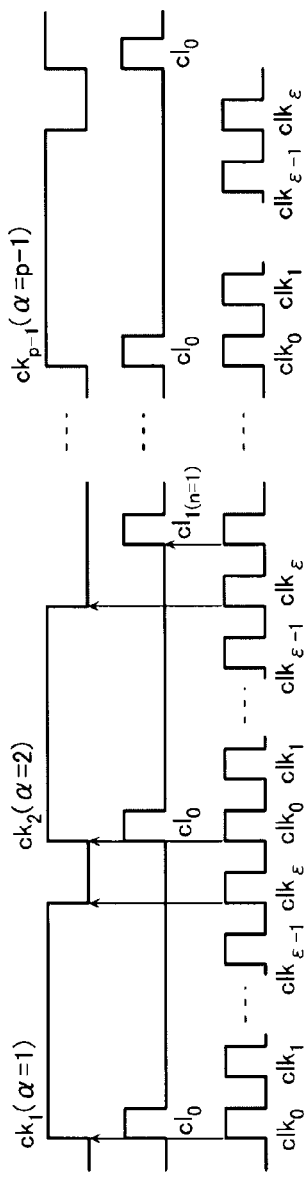
FIG. 70B is a timing chart of clocks for use in control of the operating circuit operative to derive the root of the solution searching polynomial and the associated multiplicity in the memory system according to the embodiment.

FIG. 70A is a block diagram of the solution searching polynomial root/multiplicity operating circuit, and FIG. 70B is a timing chart of the clocks ck, cl and clk for use in control of the solution searching polynomial root/multiplicity operating circuit.

The solution searching polynomial root/multiplicity operating circuit scans the elements 1 to p-1 in Zp at the clock ck to seek the number of stages of the Hasse differential at the clock cl, and the value of the Hasse differential polynomial in that number of stages at the clock clk. The clock ck is generated when the computed value of the Hasse differential polynomial becomes non-zero such that the process enters the cycle for the next element in Zp.

The solution searching polynomial root/multiplicity operating circuit includes, as shown in FIG. 70A, a "(j)$^i$ (j=1 to p-1)" circuit block, a "Ro i (0-$\epsilon$)/j(0-$\epsilon$)" register unit, an "X Zp" circuit block, a "Rgstr" register <1>, an "h bit AD mod p" circuit block, a "Rgstr" register <2>, a "clock cl gen." circuit block, a "Counter (0 to $\epsilon$)" circuit block, and a "Li (1 to p-1)" register unit.

The "(j)$^i$ (j=1 to p-1)" circuit block selects an element a on receipt of the clock ck $\alpha$-times, and provides the j-th power of $\alpha$ on receipt of the clock clk (j+1)-times.

The "Ro i(0-$\epsilon$)/j(0-$\epsilon$)" register unit is a register operative to provide a coefficient $\phi^{[i]}{}_j$ of the Hasse differential polynomial on receipt of the clocks cl$_i$ and clk$_j$. It corresponds to the "R i(0-$\epsilon$)/j(0 to $\epsilon$-1)" register unit shown in FIG. 69A.

The "X Zp" circuit block multiplies the output $\alpha^j$ from the "(j)$^i$ (j=1 to p-1)" circuit block by the output $\phi^{[i]}{}_j$ from the "Ro i (0-$\epsilon$)/j(0-$\epsilon$)" register unit, and provides $\alpha^j \phi^{[i]}{}_j$.

Thus, when the clock clk is applied ($\epsilon$+1)-times to the "(j)$^i$ (j=1 to p-1)" circuit block, the "Ro i(0-$\epsilon$)/j(0-$\epsilon$)" register unit and the "X Zp" circuit block, the value of the Hasse differential polynomial can be obtained. For the purpose of simplifying the control of the clocks ck, cl and clk, the sum of the terms of the value 0 not present in this computation is computed as well. Therefore, the total sum of the clocks clk originally required is almost halved.

The value $[\Psi(x)]^{[i]}$ of the differential polynomial is taken in the "Rgstr" register <1> as '0' in the case of zero and '1' in other cases.

The value held in the "Rgstr" register <1> is output at the timing of the clock clk$_0$ as the clock ck$_\alpha$ ($\alpha$=1 to p-1). The clock ck$_\alpha$ is held until it is reset by the clock clk$_\epsilon$.

The "Rgstr" register <1> has an initial value of 0 and accordingly the clock ck$_1$ rises at the first clk$_0$. The clock ck$_2$ and so forth rise at clk$_0$ in any cycle of clk in accordance with the computation result.

The "clock cl gen." circuit block generates the clock cl$_i$ in sync with the clock clk$_0$ and resets it to the clock cl$_0$ at every rise of the clock ck$_\alpha$.

The "Counter (0 to ϵ)" circuit block is reset to 0 by the clock $ck_\alpha$, and counts up at every input of the clock cl and outputs the order of the clock cl minus 1. This output is stored in the "Li (1 to p−1)" register unit.

The "Li (1 to p−1)" register unit has the inputs, which are switched by the clock $ck_\alpha$, and thus can store the associated multiplicity in the α-th register.

By the way, in the case of small p, the elements in Zp for use in computations may be prepared previously in part if they can be contained in tables, thereby omitting the computations and reducing the circuit scale. For example, an actual p is equal to around 19 at most, and accordingly the inverse elements and factorials of the elements are contained in tables. These tables are used in a binary decoder.

In particular, the inverse elements of the elements in Zp are immediately required for variable input elements in many cases. Accordingly, it is desired to configure them as a decoder circuit.

The inverse elements $j^{-1}$ of the elements j can be obtained by deriving a relation of $j \times j^{-1} = 1 \pmod{p}$, then configuring h-bit binary representations of j and $j^{-1}$ as shown in Expression 59, and forming an associated conversion decoder.

Input: $I_i = (j)_i$ $j = (j)_0 + (j)_1 2 + (j)_2 2^2 + \ldots + (j)_{h-2} 2^{h-2} + (j)_{h-1} 2^{h-1}$ Output: $I_i = (j^{-1})_i$ $jj^{-1} = 1 \pmod{p}$ $j^{-1} = (j^{-1})_0 + (j^{-1})_1 2 + (j^{-1})_2 2^2 + \ldots + (j^{-1})_{h-2} 2^{h-2} + (j^{-1})_{h-1} 2^{h-1}$ [Expression 59]

A specific configuration of the conversion decoder is described later.

The factorials j! of the elements j are required in computations of the coefficients of the Hasse differential polynomial and accordingly they may be previously derived for use in turn.

The computation of the factorial j! requires the value of the element in Zp. In this case, p is a prime and also a coprime with the numeral of each element contained in the factorial. Therefore, a recurrence formula shown in Expression 60 can be used to derive the factorial without dealing a large number.

Input: $I_i = (j)_i$ $j = (j)_0 + (j)_1 2 + (j)_2 2^2 + \ldots + (j)_{h-2} 2^{h-2} + (j)_{h-1} 2^{h-1}$ Output: $I_i = (j!)_i$ $j! \pmod{p} \equiv [(j-1)! \pmod{p}] \times j \pmod{p}$ $j! = (j!)_0 + (j!)_1 2 + (j!)_2 2^2 + \ldots + (j!)_{h-2} 2^{h-2} + (j!)_{h-1} 2^{h-1}$ [Expression 60]

FIG. 71 provides a table of inverse elements and factorials in the case of p=23, a little larger prime for practical use, as a specific example. 5-bit binary representations of these numbers can be used to form a conversion decoder.

The following description is given to specific circuitry of the conversion decoder, that is, a "$j^{-1}$ dec" circuit block.

Figures 72A, 72B:
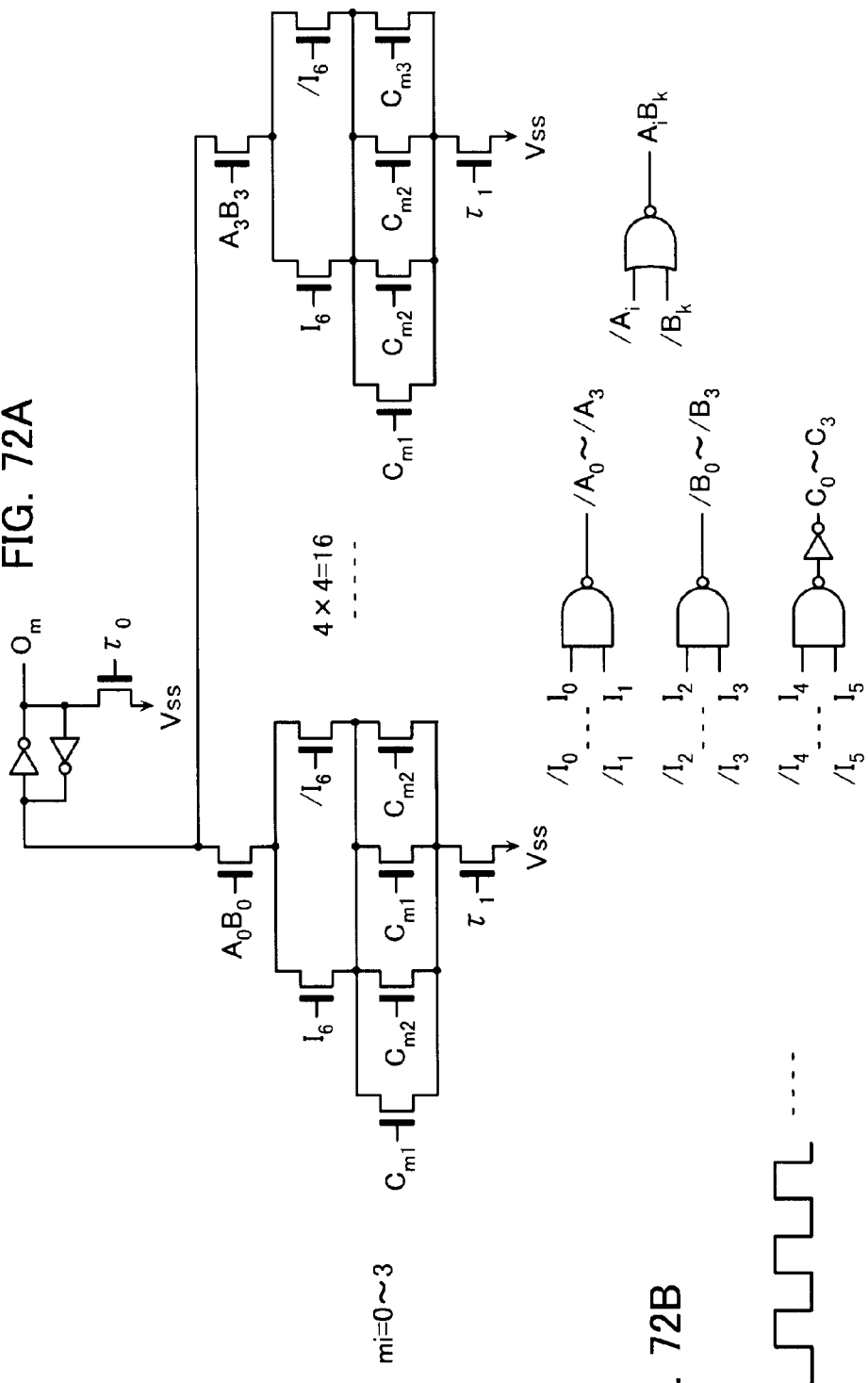
FIG. 72A is a circuit diagram of a decoder circuit available as the "$j^{-1}$ dec" circuit block in the memory system according to the embodiment.
FIG. 72B is a timing chart of clocks for use in control of the decoder circuit available as the "$j^{-1}$ dec" circuit block in the memory system according to the embodiment.

FIG. 72A is a block diagram of a decoder circuit operative to derive the inverse elements $j^{-1}$ of j in the case of h=7, and FIG. 72B is a timing chart of clocks $\tau_0$ and $\tau_1$ for use in control of the present decoder circuit.

The present decoder circuit has general circuitry operative to decode 7-bit binary data I into another 7-bit binary data O.

It can be used as the "$j^{-1}$ dec" circuit block in consideration of substitutions of j into I and of $j^{-1}$ into O. The present decoder circuit is used in conversion between the elements in Zp and is operable in accordance with 2 clocks $\tau_0$ and $\tau_1$.

The decoder circuit decodes bits $I_0$-$I_5$ 2-bit by 2-bit partly to create signals $/A_0$-$/A_3$, $/B_0$-$/B_3$, $/C_0$-$/C_3$, and uses a NOR gate to create $A_i B_k$ from $/A_i$ and $/B_k$.

The decoder circuit includes a NOR connection having 16 discharge paths to Vss at every output bit $O_m$, thereby inverting the NOR-node-latched level to $O_m$. The latch circuit can be reset using the clock $\tau_0$ just 1 clock.

The 16 discharge paths are gated by the signals $A_i B_k$ (i=0-3, k=0-3) and branched by the input bits $I_6$ and $/I_6$. Arranged beneath the branches is an OR connection of NMOS transistors controlled by $C_{mi}$ (mi=0-3) in accordance with the association of conversion. These branches are connected to Vss by the clock $\tau_1$.

The transistors controlled by $C_{m1}$ are arranged in such the manner that the bits of an input I corresponding to the bit $O_m$ are classified by $A_i B_k$ in the conversion, and then classified by '1', '0' of $I_6$ to select one among $C_0$-$C_3$.

The error E derived in operational processing is corrected after it is confirmed that the Lee metric thereof is equal to or below ϵ and thus no failed correction occurs.

Therefore, the following description is given to an operating circuit element operative to compute the Lee metrics of the elements in Zp. Hereinafter, this operating circuit element is referred to as an "h bit LMp" circuit block.

With respect to an h-bit binary-represented element a in Zp, the Lee metric thereof Q=|a| can be represented by Q=/PF0× a+PF0×(p−a) where PF0 is '1' if a≥(p+1)/2 and '0' if a<(p+1)/2. Therefore, the Lee metric of a can be obtained by subtracting a from p, that is, adding the complement of a to p if a≥(p+1)/2.

A specific example is described here in the case of h=7, p=79.

In the case of h=7, p=79, A and Q have a relation therebetween as in Expression 61.

$a = A_0 + A_1 2 + A_2 2^2 + A_3 2^3 + A_4 2^4 + A_5 2^5 + A_6 2^6$ $Q = |a| \ (Q = /PF0 \times a + PF0 \times (p-a))$ $Q = Q_0 + Q_1 2 + Q_2 2^2 + Q_3 2^3 + Q_4 2^4 + Q_5 2^5 + Q_6 2^6$ [Expression 61]

Figure 73:
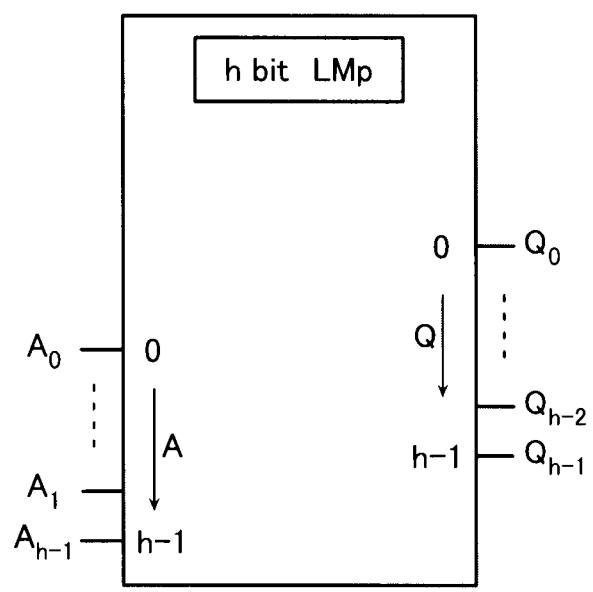
FIG. 73 is a diagram showing a circuit symbol of a "h bit LMp" circuit block in the memory system according to the embodiment.
Figure 74:
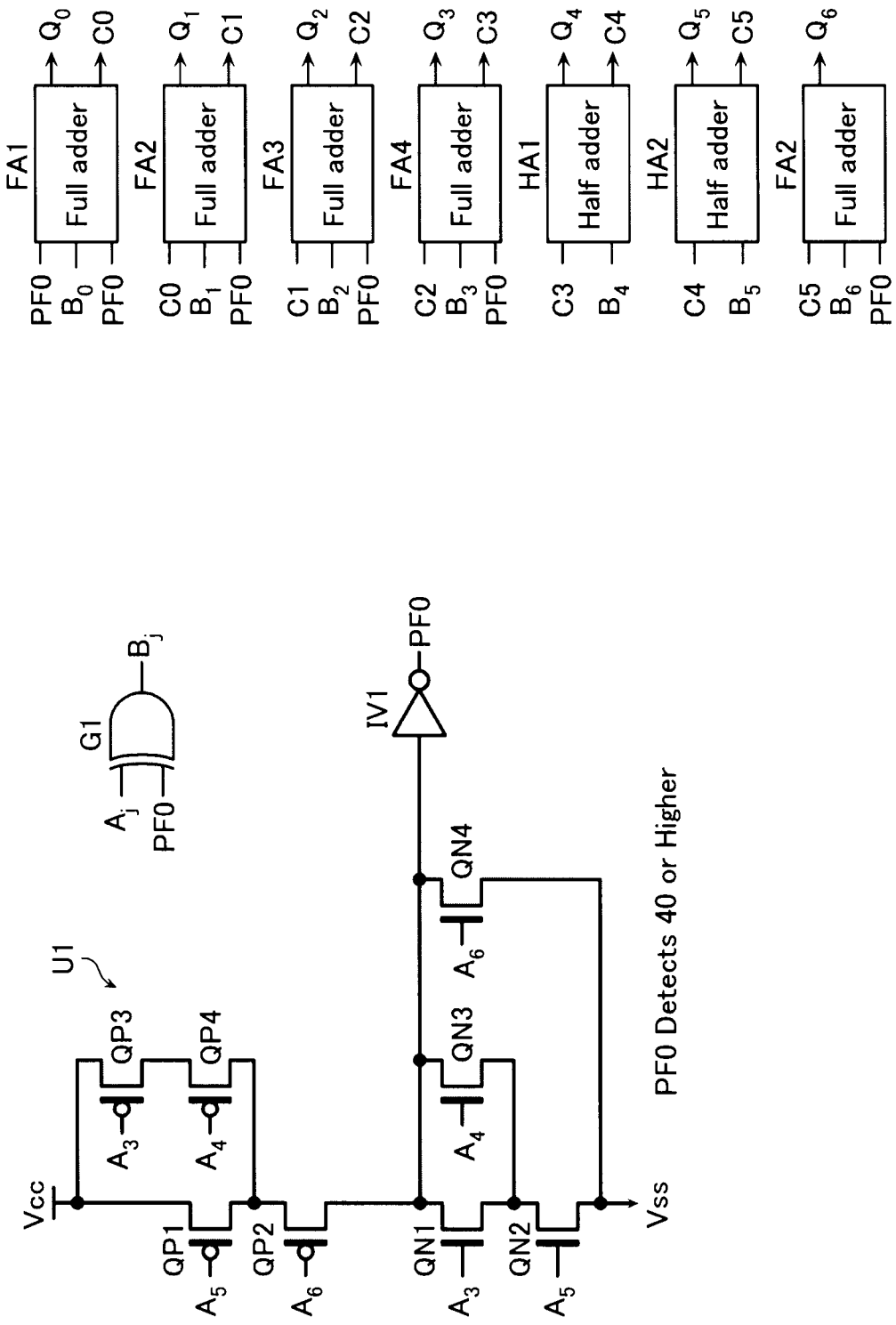
FIG. 74 is a block diagram of the "h bit LMp" circuit block in the memory system according to the embodiment.

FIG. 73 is a circuit diagram of the "h bit LMp" circuit block. FIG. 74 is a block diagram of the "h bit LMp" circuit block in the case of h=7, p=79.

The "h bit LMp" circuit block receives an h-bit binary $A_0$-$A_{h-1}$ and provides an h-bit binary $Q_0$-$Q_{h-1}$.

The "h bit LM p" circuit block comprises a PF0 generator unit U1, an XOR gate G1, 2 half adders HA1, HA2, and 5 full adders FA1-FA5.

The PF0 generator unit U1 includes serially connected PMOS transistors QP1, QP2 and NMOS transistors QN1, QN2 between the Vcc terminal and the Vss terminal. These transistors QP1, QP2, QN1 and QN2 are controlled by $A_5$, $A_6$, $A_3$ and $A_5$, respectively.

The PF0 generator unit U1 also includes 2 PMOS transistors QP3, QP4, 2 NMOS transistors QN3, QN4, and an inverter IV1.

The transistors QP3, QP4 are serially connected and both ends thereof are connected to the source and drain of the transistor QP1. The transistor QN1 is connected between the source and drain of the transistor QN1. The transistor QN4 is connected between the source of the transistor QN1 and the drain of the transistor QN2 (Vss terminal). The transistors QP3, QP4, QN3 and QN4 are controlled by $A_2$, $A_4$, $A_4$ and $A_6$, respectively. The inverter IV1 has an input connected to the node of the transistors QP2 and QN1. The output from the inverter IV1 provides the carry PF0.

The XOR gate G1 receives $A_j$ (j=0-7) and PF0, and provides $B_j$.

The full adder FA1 has inputs $B_0$ and PF0, a carry input PF0, an output $Q_0$, and a carry output C0. The full adder FA2 has inputs $B_1$ and PF0, a carry input C0, an output $Q_1$, and a carry output C1. The full adder FA3 has inputs $B_2$ and PF0, a carry input C1, an output $Q_2$, and a carry output C2. The full adder FA4 has inputs $B_3$ and PF0, a carry input C2, an output $Q_3$, and a carry output C3. The half adder HA1 has inputs C3 and $B_4$, an output $Q_4$, and a carry output C4. The half adder HA2 has inputs C4 and $B_5$, an output $Q_5$, and a carry output C5.

In this specific example, when the input reaches 40 or above, the complement of a is added to p. The complement of a can be created by inverting each bit representation $A_j$ of a into $B_j$ through the XOR gate and adding 1 thereto in the case of PF0=1.

As p=79 is 79=$(1001111)_2$, the process represents it by PF0, and uses PF0 as 1, then adds 79, of which PF0 is represented as 1, to the inverse of $A_i$, or $B_i$ itself.

The "h bit LM p" circuit block operates not in sync with clocks and provides computed Lee metrics on receipt of inputs.

The following description is given to an operating circuit for computing a Lee metric $w(E)=\Sigma|e_j|$ (j=1 to p−1) of an error code word E. Hereinafter, this operating circuit is referred to as the "Lee metric operating circuit".

Figure 75:
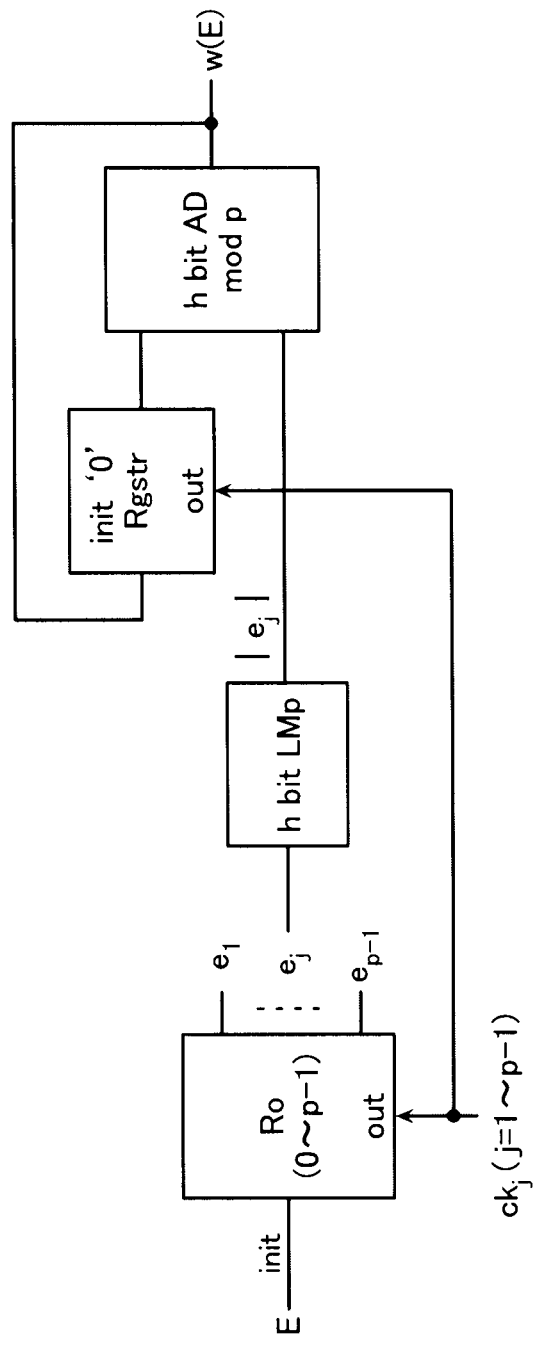
FIG. 75 is a block diagram of an operating circuit operative to derive a Lee metric of the error code in the memory system according to the embodiment.

FIG. 75 is a block diagram of the Lee metric operating circuit.

The Lee metric operating circuit includes a "Ro (0 to p−1)" register unit, an "h bit LMp" circuit block, an "h bit AD mod p" circuit block, and a "Rgstr" register.

The error code word E derived from the polynomial $\Psi(x)$ is stored as the initial value in the "Ro (0 to p−1)" register unit. From the "Ro (0 to p−1)" register unit, the components $e_j$ of E are taken out in order by the clock $ck_j$.

The "h bit LMp" circuit block computes the associated Lee metrics $|e_j|$ from the taken-out components $e_j$. The "h bit LMp" circuit block provides the Lee metrics of the components, computed at every clock $ck_j$, to the "h bit AD mod p" circuit block.

The "Rgstr" register and the "h bit AD mod p" circuit block form a loop, which is used to sum up these $|e_j|$. The output from the "h bit AD mod p" circuit block when the (p−1)-th clock ck rises provides $w(E)=\Sigma|e_j|$.

As for E, on the basis of α and [n] obtained as a set of the root and multiplicity of $\Psi(x)$ through the above-described operation, a conversion, t=α−1, $e_t=(ut^m)^{-1}n$, is applied to derive the components $e_t$. If $w(E) \leq \epsilon$, the flow terminates a series of error searching and executes correction by E.

If the Lee metric code corrected by the error code E can be obtained after completion of error searching, it is required to restore the code to the data code A in Zp. This operation corresponds to the inverse operation of C=AG with the generator matrix G. The inversion of the matrix is a large scale operation. Therefore, the elements of A are sequentially derived from the elements of C. The process of computation is shown in Expression 62. In Expression 62, note that j=1 to p−1, n=p−1, p−ε−3=n−γ−1=k−1.

$$c_j = \sum_{i=0}^{p-\varepsilon-3} (j)^{i+1} a_i$$ [Expression 62]

$$\sum_{j=1}^{p-1} (j)^{-1} c_j = \sum_{j=1}^{p-1} (j)^{-1} \sum_{i=0}^{p-\varepsilon-3} (j)^{i+1} a_i =$$

$$\sum_{i=0}^{p-\varepsilon-3} \sum_{j=1}^{p-1} (j)^i a_i = \sum_{j=1}^{p-1} (j)^0 a_0 = (p-1) a_0$$

$$\therefore a_0 = (p-1)^{-1} \sum_{j=1}^{p-1} (j)^{-1} c_j$$

$$c_j^{(0)} = c_j - j a_0 = \sum_{i=0}^{p-\varepsilon-3} (j)^{i+1} a_i$$

$$\sum_{j=1}^{p-1} (j^2)^{-1} c_j^{(0)} = \sum_{j=1}^{p-1} (j^2)^{-1} \sum_{i=0}^{p-\varepsilon-3} (j)^{i+1} a_i =$$

$$\sum_{i=0}^{p-\varepsilon-3} \sum_{j=1}^{p-1} (j)^i a_i = \sum_{j=1}^{p-1} (j)^0 a_1 = (p-1) a_1$$

$$\therefore a_1 = (p-1)^{-1} \sum_{j=1}^{p-1} (j^2)^{-1} c_j^{(0)}$$

$$c_j^{(1)} = c_j^{(0)} - j^2 a_1 = \sum_{i=0}^{p-\varepsilon-3} (j)^{i+1} a_i$$

$$\vdots$$

As shown in Expression 62, the relation, $c_j = \Sigma(j)^{i+1} a_i$, is modified in turn to derive $a_1$ from $a_o$, subsequently $a_2$ from $a_1, \ldots,$ then $a_m$ sequentially. This is the principle of computation.

Both sides are multiplied by the inverse elements of the powers of j to yield the terms of j on all elements in Zp, which are then summed. The fact that the sum of all elements in Zp becomes zero is utilized for the modification.

Expression 63 is a relational equation between the A components and the C components.

$$c_j^{(-1)} = c_j$$ [Expression 63]

$$c_j^{(m)} = c_j^{(m-1)} - j^{m+1} a_m = \sum_{i=m+1}^{p-\varepsilon-3} (j)^{i+1} a_i$$

$$\therefore a_{m+1} = (p-1)^{-1} \sum_{j=1}^{p-1} (j^{m+2})^{-1} c_j^{(m)}$$

The following description is given to an operating circuit for realizing the relational equation in Expression 63.

At the time of deriving $a_{m+1}$ after $a_m$ is obtained, the sum on j at $a_{m+1}$ is computed in turn while obtaining $c^{(m)}_j$. At this time, the powers required for j include the (m+1)-th power for $c^{(m)}_j$, and (m+2)-th power for $a_{m+1}$. Therefore, the present operating circuit uses the slightly-modified circuit block for computing the powers of the elements in Zp.

Figures 76A, 76B:
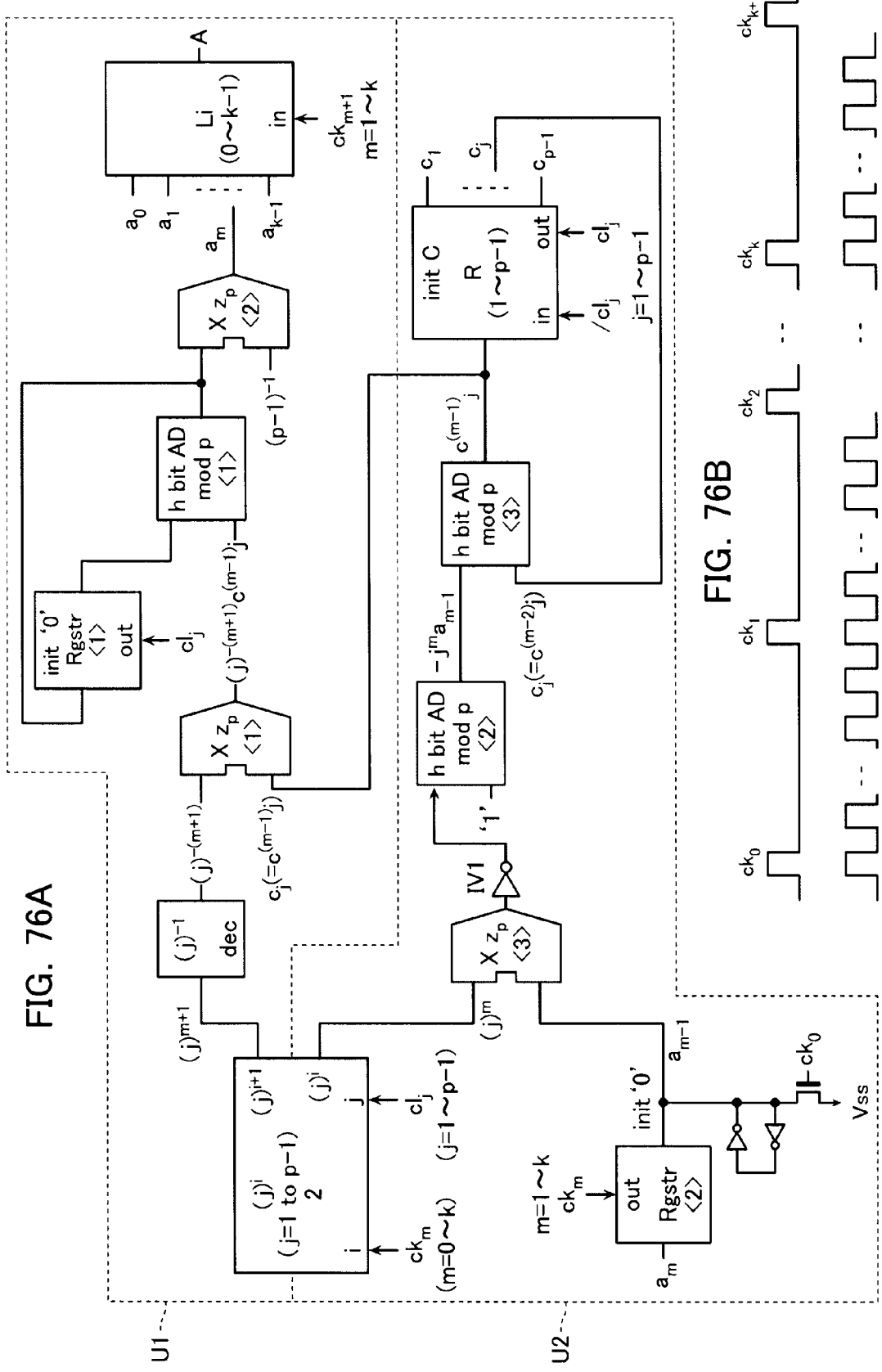
FIG. 76A is a block diagram of an operating circuit operative to derive $A=CG^{-1}$ from $C=AG$ in the memory system according to the embodiment.
FIG. 76B is a timing chart of clocks for use in control of the operating circuit operative to derive $A=CG^{-1}$ from $C=AG$ in the memory system according to the embodiment.

FIG. 76A is a block diagram of an operating circuit for deriving $A=CG^{-1}$ from C=AG (hereinafter this operating circuit is referred to as an "inverse converting circuit", and FIG. 76B is a timing chart of the clocks ck and cl for use in control of the inverse converting circuit.

The inverse converting circuit includes a 1st part circuit U1 operative to derive the elements of A one by one through operations, and a 2nd part circuit U2 operative to every time convert the components of the Lee metric code C required in the operations.

The part circuits U1 and U2 include a "$(j)^i$ (j=1 to p−1) 2" circuit block operative to generate the (m+1)-th and m-th powers of the element j in Zp. The "$(j)^i$ (j=1 to p−1) 2" circuit block provides the part circuit U1 with a power of the element j having an index i equal to the number of cycles of the clock $ck_i$ if the number of cycles of the clock cl is equal to j. On the other hand, it provides the part circuit U2 with a power of the element j having an index i smaller by 1 than the number of cycles of the clock $ck_i$ if the number of cycles of the clock cl is equal to j.

The "$(j)^i$ (j=1 to p−1) 2" circuit block is anew symbolized by turning the "$(j)^i$ (j=1 to p−1)" circuit block to a circuit capable of providing signals from internal nodes. The details are described later.

The "$(j)^i$ (j=1 to p−1) 2" circuit block provides the element in Zp itself to the part unit U1 and '1' to the part unit U2 in the 1st cycle of the clock cl. The '1' fed to the part unit U2 is not a value found in the original operation. Accordingly, a thought is required to eliminate the influence exerted on the operation result. Therefore, for the purpose of eliminating the influence from the '1', the product operation at the part unit U2 turns the other input to '0' in the first cycle of the clock ck so that the result from the product operation becomes zero.

At the start, the 1st part unit U1 is described.

The 1st part unit U1 includes, in addition to the "$(j)^i$ (j=1 to p−1) 2" circuit block, a "$(j)^i$ dec" circuit block, 2 "X Zp" circuit blocks <1>, <2>, an "h bit AD mod p" circuit block <1>, a "Rgstr" register <1>, and a "Li (0 to k−1)" register unit.

The output $(j)^{m+1}$ from the "$(j)^i$ (j=1 to p−1) 2" circuit block is fed to the "$(j)^i$ dec" circuit block.

The "$(j)^i$ dec" circuit block converts $(j)^{m+1}$ to the inverse element $(j)^{-(m+1)}$, and provides it to the "X Zp" circuit block <1>.

The "X Zp" circuit block <1> computes the product of $(j)^{-(m+1)}$ fed from the "$(j)^i$ dec" circuit block and $c_j (=c^{(m-1)}_j)$ fed from the 2nd part unit U1 in sync with (p−1) pieces of the clocks cl between the clocks ck, and provides the product to the "h bit AD mod p" circuit block <1>.

The product output from the "h bit AD mod p" circuit block <1> is summed up through the loop including the "Rgstr" register <1> having an initial value of '0' and the "h bit AD mod p" circuit block <1>. The result is fed from the "h bit AD mod p" circuit block <1> to the "X Zp" circuit block <2>.

The "X Zp" circuit block <2> computes the product of the sum output from the "h bit AD mod p" circuit block <1> and $(p-1)^{-1}$ to obtain $a_m$ in accordance with the computation formulae shown in Expression 62. This $a_m$ is held in the m-th register in the "Li (0 to k−1)" register unit by the clock $ck_{m+1}$ at the beginning in the next cycle.

Next, the 2nd part unit U2 is described.

The 2nd part unit U2 includes, in addition to the "$(j)^i$ (j=1 to p−1) 2" circuit block, a "Rgstr" register <2>, an "X Zp" circuit block <3>, 2 "h bit AD mod p" circuit blocks <2>, <3>, and a "R (1 to p−1)" register unit.

The "Rgstr" register <2> provides the established $a_m$ in the cycle after $ck_i$. Namely, the output $a_{m-1}$ is provided at the clock $ck_m$. In the first cycle $ck_0$ of the clock ck, the initial value of the output node on the "Rgstr" register <2> is set at '0'. This is aimed to bring the result of the product operation at the time of the clock $cl_1$ to zero as described above.

The "X Zp" circuit block <3> computes the product of $(j)^m$ fed from the "$(j)^i$ (j=1 to p−1) 2" circuit block generated in the cycle $ck_m$ of the clock ck and the output $a_{m-1}$ from the "Rgstr" register <2>, and provides the product to the "h bit AD mod p" circuit block <2> via an inverter IV1.

The "h bit AD mod p" circuit block <2> computes the complement of the output $a_{m-1}$ fed from the "Rgstr" register <2> via the inverter IV1 to create $-j^m a_{m-1}$, and provides it to the "h bit AD mod p" circuit block <3>.

The "h bit AD mod p" circuit block <3> computes the sum of $-j^m a_{m-1}$ output from the "h bit AD mod p" circuit block <2> and $c_j (=c^{(m-2)}_j)$ fed from the "Rgstr" register <2> in sync with the clock cl, and provides it as $c^{(m-1)}_j$. The $c^{(m-1)}_j$ output from the "h bit AD mod p" circuit block <3> is recorded in the j-th register in the "R (1 to p−1)" register unit in sync with the fall of the clock cl. The setting in the "Rgstr" register <2> causes the "R (1 to p−1)" register unit to have an initial value of $c^{(m-2)}_j = c^{(m-1)}_j = C$.

Next, the "$(j)^i$ (j=1 to p−1) 2" circuit block shown in FIG. 76A is described.

The "$(j)^i$ (j=1 to p−1) 2" circuit block is a modified circuit of the "$(j)^i$ (j=1 to p−1)" circuit block, that is, the circuit operative to derive the 0-th to (p−2)-th powers of all the elements 1 to p−1 in Zp except zero and hold them in the registers.

Figure 77:
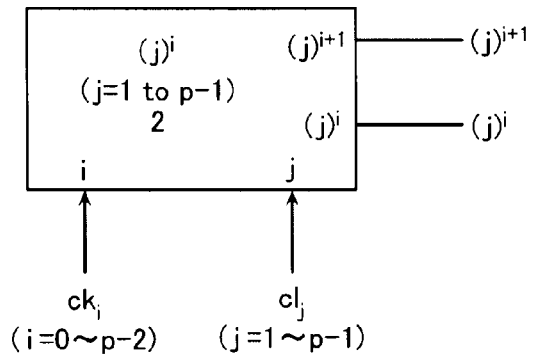
FIG. 77 is a diagram showing a circuit symbol of a "$(j)^{-1}$ (j=1 to p−1) 2" circuit block in the memory system according to the embodiment.
Figure 78A:
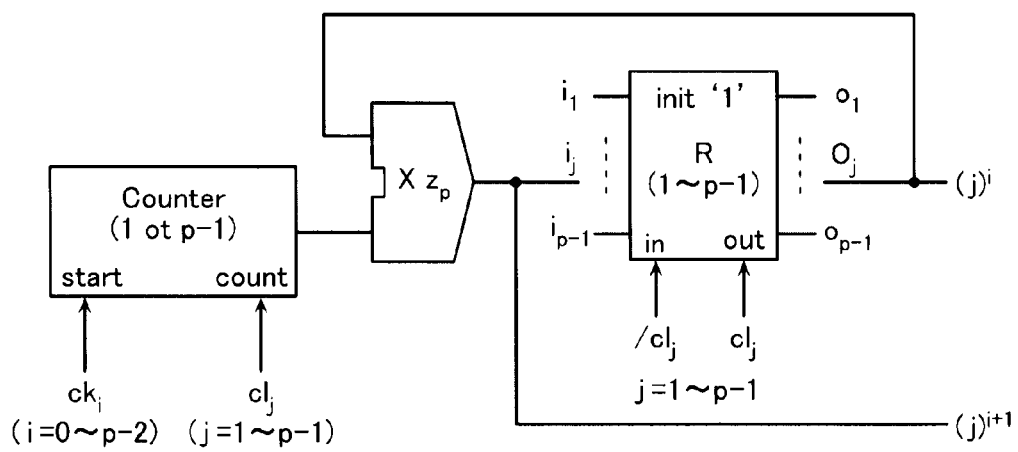
FIG. 78A is a block diagram of the "$(j)^{-1}$(j=1 to p−1) 2" circuit block in the memory system according to the embodiment.
Figure 78B:
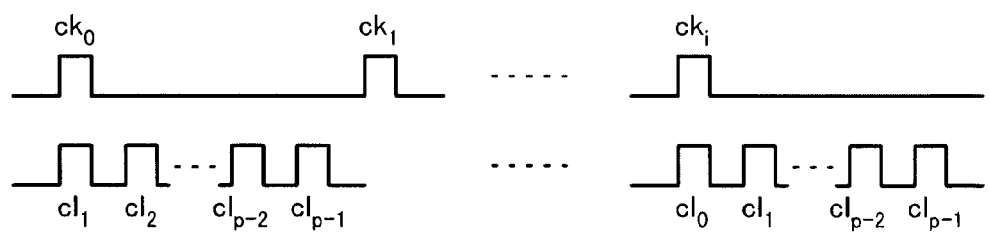
FIG. 78B is a timing chart of clocks for use in control of the "$(j)^{-1}$(j=1 to p−1) 2" circuit block in the memory system according to the embodiment.

FIG. 77 is a diagram showing a circuit symbol of the "$(j)^i$ (j=1 to p−1) 2" circuit block. FIG. 78A is a block diagram of the "$(j)^i$ (j=1 to p−1) 2" circuit block, and FIG. 78B is a timing chart of the clocks ck and cl for use in control of the "$(j)^i$ (j=1 to p−1) 2" circuit block.

The "$(j)^i$ (j=1 to p−1) 2" circuit block provides $(j)^{i+1}$ and $(j)^i$ in sync with the input clocks $ck_i$ (i=0 to p−2) and $cl_j$ (j=1 to p−1) as shown in FIG. 77.

The "$(j)^i$ (j=1 to p−1) 2" circuit block includes a "Counter (1 to p−1)" circuit block, an "X Zp" circuit block, and a "R (1 to p−1)" register unit.

The "R (1 to p−1)" register unit includes (p−1) pieces of registers, and it stores inputs in Nos. 1 to p−1 registers in turn at the rise of the clock /cl at in, and provides the contents of Nos. 1 to p−1 registers in order at the rise of the clock /cl at out.

The "X Zp" circuit block computes the sum of the output from the "Counter (1 to p−1)" circuit block operative to count up in sync with the input clock cl and the output from the "R (1 to p−1)" register unit.

With the above configuration, the "R (1 to p−1)" register unit provides $(j)^i$ at every rise of $cl_j$ in each cycle of $cl_j$ after the rise of $ck_i$. At the same time, the "X Zp" circuit block provides $(j)^{i+1}$ having an index different by 1 from $(j)^i$.

[Syndrome Converting Method]

The next study is given to what the error correction through the syndrome converting method executes when viewed in the space of the codes representing the Lee metric code, and to the condition under which this method can be used effectively.

When a point in a true error code word actually indistinct is represented by $E=(e_1, e_2, \ldots, e_j, \ldots, e_n)$, in the syndrome converting method the process converts it to a point $^m E=(u(1)^m e_1, u(2)^m e_2, \ldots, u(j)^m e_j, \ldots, u(n)^m e_n)$ in a virtual error code word. Note that the component coordinates themselves are unchanged. In this case, the syndrome is represented as in Expression 64.

$$uS_m = u \sum_{j=1}^{p-1} (j)^m e_j = \eta \qquad \text{[Expression 64]}$$

These conversions result in $^m E \neq ^{m'}E$ in the case of m≠m' and η≠η'. Namely, if η is different from each other, they cannot be the same point. This is because $u(i)^m e_i = u'(i)^m e_i$, that is, Expression 65 should establish over all i in the case of $^m E \neq ^{m'}E$ though Expression 65 cannot establish other than E=0.

$$\eta^{i^{m'}} \sum_{j=1}^{p-1} (j)^m e_j = \eta^{i^m} \sum_{j=1}^{p-1} (j)^{m'} e_j \quad \text{[Expression 65]}$$

Therefore, the process scans over m=0 to p−2 because of $(j)^{p-1}=1$, and uses both γ−1 and γ−2 as η effective on the syndrome converting method to simplify the configuration of the solution searching polynomial. Thus, the process can obtain 2 (p−1) points containing the true error code word point. If these points contain all of the error code word points that are considered to suffer the restriction of the Lee metric similar to the true error, it is possible to search errors without misses and correct them, if correctable, by deriving a solution searching polynomial to obtain a solution.

Unless they contain all the error code word points, error correction may cause a miss because there can be a point corresponding to the error other than the point converted from the true error and accordingly it is hard to say positively that the error cannot be specified even if solution searching is impossible.

Then, the condition on the error quantity and the correctable condition are described next.

In the syndrome converting method the process uses (p−1) conversions that use syndromes cyclically and the values of η to use 2 (p−1) conversions at the maximum. Then, it is studied next to find if these conversions can cover all causable errors.

As described above, when the point in the true error code word is given by $E=(e_1, e_2, \ldots, e_j, \ldots, e_n)$, in the syndrome converting method the point in the virtual error code word is given by $^m E = (u(1)^m e_1, u(2)^m e_2, \ldots, u(j)^m e_j, \ldots, u(n)^m e_n)$.

There are ξ error component positions, which are represented by $j_i$ (i=1−ξ). In this case, and the syndrome conversion can make the sum equal to η as in Expression 66.

$$uS_m = u \sum_{j=1}^{\xi} (j_i)^m e_{ji} = \eta \quad \text{[Expression 66]}$$

$$u(j_i)^m e_{ji} = \varepsilon_i$$

In Expression 66, $\varepsilon_i$ is considered a variable. As for the variables $\varepsilon_i$, 1 to p−1, and the sum of pieces is fixed to η, the selections of the value of each variable become $(p-1)^{\xi-1}$. The final selection contains 0 as they remain same and accordingly this case is excluded.

If n(ξ) indicates the number when the sum of ξ pieces of free variables $\varepsilon_i$ is congruent with q, it is required to exclude the case where the sum reaches q before the final selection. Therefore, $n(\xi) = (p-1)^{\xi-1} - n(\xi-1)$ establishes and thus yields n(ξ) as in Expression 67.

$$\xi\text{:even } n(\xi) = \{(p-1)^{\xi} - 1\}/p$$

$$\xi\text{:odd } n(\xi) = \{(p-1)^{\xi} + 1\}/p \quad \text{[Expression 67]}$$

In this case, there is one that has components all falling within a range of 0 to p/2, that is, components belonging only to $J_+$. Accordingly, if the number of conversions is equal to or higher than the number in the case, different conversions can cover different cases. Therefore, it is possible to create a virtual error in $J_+$ for the solution through the syndrome converting method.

When viewed from the syndrome converting method, this condition is in the case of ξ=2, which is in the case of 2 roots as in the above-described study. In the case of 3 or more roots (ξ≥3), however, it is not possible to exclude the case of solution-unobtainable errors.

In a word, this indicates that the syndrome converting method is simple in processing but causes error correction misses. If there is the possibility of causing various patterns of errors, it is preferable to increase the range of conversions through the syndrome converting method, the number of conversions, using another converting method than that of converting the syndrome components cyclically. It is also preferable to configure a solution searching polynomial using the Euclidean iterative method, which is though not suitable for on-chip use because of complicated processing as can be found.

Next, in relation to the condition, w(E)≤ε, on the error correctable by the Lee metric code and the condition on searching without misses through the syndrome converting method, the relations between the error quantity obtained in the operational processing result and the failed correction are grouped.

(1) In the case of the number of distributions of ε≤the number of searching

In the case where the Lee metric of the true error word is equal to or below ε=γ−1:

If the solution E obtained through the syndrome converting method contains one that is found to satisfy the Lee metric W(E)≤ε, it is the true error reliably and accordingly the flow terminates solution searching then.

This is because the key to solution closes in the self-mapping between ε or below error words so that the true error corresponds to the key-to-solution-applicable error.

In the case where the Lee metric of the true error word is equal to or above γ:

If the solution E obtained through the syndrome converting method contains one that is found to satisfy the Lee metric W(E)≤ε, it is a failed error to an adjacent code. In this case, it is not possible to distinguish such the error from the true error on the Lee metric code.

This is the case of failed correction that cannot be excluded by any ECC.

In the case where the solution E obtained through the syndrome converting method does not contain one that satisfies the Lee metric W(E)≤ε:

This is the case that an error code point drops in a gap between code words such that the true error can be searched through the syndrome converting method possibly.

The error locates at the shortest distance to the true code and uniquely belongs to that code as can be considered. Of the errors E obtained through the syndrome converting method, one having the minimum Lee metric, w(E)>ε, is denoted with $E_{min}$. If $E_{min}$ is satisfied by only 1 component configuration, $E_{min}$ is adopted as the true error. This is because all virtual errors obtained from the true error through conversions completely include the cases of all occurrence patters of the true error so that the error can be determined. It cannot be determined in the presence of plural $E_{min}$ and accordingly no solution can be obtained.

(2) In the case of the number of ε distributions>the number of searching

The process causes a careless defeat through the syndrome converting method in addition to the failed correction to the true error.

In the procedure of searching, if the number of distributions of $\epsilon \leq$ the number of searching, "w(E) is computed at every solution E found. If w(E)$\leq \epsilon$, the flow terminates processing as the true error is found, and if w(E)>$\epsilon$, the flow continues the scan to find a smaller w(E). If the minimum w(E) at the last of all processing satisfies w(E)>$\epsilon$, it is the case that the key to solution is not applicable".

[Method of Verifying in p-adic Memory System]

Finally, a simple method of verifying the operation of the circuits for operational processing in the "p-adic world" is described.

The circuits for conversions at the entrance to the "binary world" and to the "p-adic Zp world" and the circuit for conversions of the Lee metric code to the p-adic memory system are so complicated that it is difficult to verify and specify the operations.

Therefore, it is effective if the circuit operations can be determined by observing the states of the input data and the data held in the cell array. It is possible to execute the verify using the fact that the state of the p-adic cell corresponding to a special data pattern becomes special. This verifying method is a method in which the process uses '0' and '1' as batch-processed data and monitors and determines the states of the memory cells in the cell array at that time.

The input data can be represented as in Expression 68.

$$D(h) = d_0(2^h)^0 + d_1(2^h)^1 + \ldots + d_{\delta-3}(2^h)^{\delta-3} + d_{\delta-2}(2^h)^{\delta-2} + d_{\delta-1}(2^h)^{\delta-1}$$

$$D(h) = a_0(p)^0 + a_1(p)^1 + \ldots + a_{\delta-2}(p)^{\delta-2} + a_{\delta-1}(p)^{\delta-1} + a_\delta(p)^\delta$$

[Expression 68]

The input data targeted to ECC batch processing is assumed 1 in binary. In this case, the binary and p-adic representations of the input data are as in Expression 69.

$$D = (d_0, d_1, \ldots, d_{\delta-3}, d_{\delta-2}, d_{\delta-1}) = (1, 0, \ldots, 0, 0, 0)$$

$$D = (a_0, a_1, \ldots, a_{\delta-2}, a_{\delta-1}, a_\delta) = (1, 0, \ldots, 0, 0, 0) \quad \text{[Expression 69]}$$

When the input data is 1 in binary, and if Zp and the cell levels have the same correspondence in every memory cell, the multi-levels of a memory cell group operative to store the data are all set different.

There is no memory cell with the same level setting in the case where 0 is substituted for the numeral in binary data and in the case where 1 is substituted for the same. This is the necessary and sufficient condition on determination from the relations in Expression 70 because the Lee metric code turns 0 to a code word of $(0, 0, \ldots, 0, 0, 0)$, and 1 to a code word of $(1, 2, \ldots, p-3, p-2, p-1)$.

$$C = AG \quad \text{[Expression 70]}$$

$$c_j = \sum_{i=0}^{p-\epsilon-3} (j)^{i+1} a_i$$

Which bit position is turned to '1' to determine '1' in the binary data depends on the setting of the circuit. Accordingly, if this conversion is made as an inherent correspondence, the data cannot be decoded easily.

As can be found from the condition on decision of the circuit operations, the correspondence between the cell levels and the numerals in Zp can be changed at every memory cell. The input binary and the stored data, that is, p-adic number, has no linear relation therebetween, and accordingly the converting circuit can set the correspondence between the binary and the p-adic number freely. Therefore, this circuit can be locked to make it difficult to conversely read the input data from the stored data directly. Thus, it is easily applied to the security of data as can be found.

In summary, the code conversion in the p-adic memory system according to the present embodiment provides the following correspondence between the code input to the memory system and the level recorded in the memory cell as a result.

(1) If a certain number of p-adic cells are treated as a processing unit, and when the input binary data is 0, a cell level corresponding to 0 in Zp is written in all p-adic cells contained in the processing unit.

(2) If (p−1) p-adic cells are treated as a processing unit, and when the input binary data contains '1' only in 1 bit, all cell levels corresponding to 1 to p−1 in Zp are written in p-adic cells belonging to the processing unit.

(3) In the case of the above (2), and if the correspondence relations between the elements in Zp on all memory cells belonging to the processing unit and the cell levels are identical, the cell levels written in the memory cells belonging to the processing unit are all different from each other.

(4) From the above (1) and (2), if (p−1) p-adic cells are treated as the processing unit, in each memory cell belonging to the processing unit, the cell level written when the input binary data is 0 is different from the cell level written when the input binary data contains '1' only in 1 bit.

Thus, multi-leveling of memory cells requires stable accurate operations in the prior art though the memory system according to the present embodiment applies high-efficiency error correction to make it possible to provide larger operational margins than the conventional system and accordingly provide further multi-leveling of memory cells.

[Others]

While certain embodiments have been described, these embodiments have been presented by way of example only, and are not intended to limit the scope of the inventions. Indeed, the novel methods and systems described herein may be embodied in a variety of other forms: furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The embodiments of the present invention are applicable to such memory systems that use cells having 3 or more levels. For example, they can be applied to memory systems using flash memories, DRAMs, PRAMs, and ReRAMs.

What is claimed is:

1. A memory system, comprising:
   a cell array including cell units that record data by p or more different physical quantity levels (p is a prime number of 3 or more);
   a code generator unit operative to convert binary-represented input data to a write code represented by elements in Zp that is a residue field modulo p; and
   a code write unit operative to write said write code in said cell unit in accordance with the association of the elements in Zp to different physical quantity levels,
   wherein said input data is recorded in (p−1) cell units, said (p−1) cell units including no cell unit that applies the same physical quantity level for write in the case where said input data is 0 and for write in the case where only 1 bit is 1.

2. The memory system according to claim 1, further comprising:

a code read unit operative to read out said physical quantity level recorded in said cell unit as a read code represented by the element in Zp corresponding to said physical quantity level; and a decoder unit operative to convert said read code to binary-represented output data.

3. The memory system according to claim 2, further comprising an error detecting/correcting unit operative to detect and correct an error on said read code, wherein said error detecting/correcting unit generates a syndrome from said read code, and changes the combination of components of said syndrome in turn for error searching.

4. The memory system according to claim 3, wherein said error detecting/correcting unit includes an adder circuit modulo p.

5. The memory system according to claim 3, wherein said error detecting/correcting unit includes a table of at least one of inverse elements and factorials of the elements in Zp previously computed.

6. The memory system according to claim 3, wherein said decoder unit converts the error-containing read data directly to said output data if said error detecting/correcting unit fails to detect any error on said read data.

7. The memory system according to claim 1, wherein an associated relation between the elements in Zp and the physical quantity levels in a certain cell unit is different from the associated relation between the elements in Zp and the physical quantity levels in another cell unit.

8. The memory system according to claim 1, wherein said cell unit includes plural memory cells.

9. A memory system, comprising:

a cell array including cell units that record data by p or more different physical quantity levels (p is a prime number of 3 or more);

a code generator unit operative to convert binary-represented input data to a write code represented by elements in Zp that is a residue field modulo p; and a code write unit operative to write said write code in said cell unit in accordance with the association of the elements in Zp to different physical quantity levels, wherein said write data is a Lee metric code, wherein said input data is recorded in (p−1) cell units, said (p−1) cell units including no cell unit that applies the same physical quantity level for write in the case where said input data is 0 and for write in the case where only 1 bit is 1.

10. The memory system according to claim 9, wherein said code generator unit includes an adder circuit modulo p.

11. The memory system according to claim 9, further comprising:

a code read unit operative to read out said physical quantity level recorded in said cell unit as a read code represented by the element in Zp corresponding to said physical quantity level; and a decoder unit operative to convert said read code to binary-represented output data.

12. The memory system according to claim 11, further comprising an error detecting/correcting unit operative to detect and correct an error on said read code, wherein said error detecting/correcting unit generates a syndrome from said read code, and changes the combination of components of said syndrome in turn for error searching.

13. The memory system according to claim 12, wherein said error detecting/correcting unit includes an adder circuit modulo p.

14. The memory system according to claim 12, wherein said error detecting/correcting unit includes a table of at least one of inverse elements and factorials of the elements in Zp previously computed.

15. The memory system according to claim 12, wherein said decoder unit converts the error-containing read data directly to said output data if said error detecting/correcting unit fails to detect any error on said read data.

16. The memory system according to claim 9, wherein an associated relation between the elements in Zp and the physical quantity levels in a certain cell unit is different from the associated relation between the elements in Zp and the physical quantity levels in another cell unit.

17. A memory system, comprising:

a cell array including cell units that record data by p or more different physical quantity levels (p is a prime of 3 or more);

a code generator unit operative to convert binary-represented input data to a write code represented by elements in Zp that is a residue field modulo p; and a code write unit operative to write said write code in said cell unit in accordance with the association of the elements in Zp to different physical quantity levels, wherein said code generator unit includes an adder circuit modulo p, wherein said input data is recorded in (p−1) cell units, said (p−1) cell units including no cell unit that applies the same physical quantity level for write in the case where said input data is 0 and for write in the case where only 1 bit is 1.

18. The memory system according to claim 17, further comprising:

a code read unit operative to read out said physical quantity level recorded in said cell unit as a read code represented by the element in Zp corresponding to said physical quantity level; and a decoder unit operative to convert said read code to binary-represented output data.

19. The memory system according to claim 18, further comprising an error detecting/correcting unit operative to detect and correct an error on said read code, wherein said error detecting/correcting unit generates a syndrome from said read code, and changes the combination of components of said syndrome in turn for error searching.

20. The memory system according to claim 19, wherein said error detecting/correcting unit includes an adder circuit modulo p.

* * * * *